(12) United States Patent
Mi et al.

(10) Patent No.: US 8,669,544 B2
(45) Date of Patent: Mar. 11, 2014

(54) HIGH EFFICIENCY BROADBAND SEMICONDUCTOR NANOWIRE DEVICES AND METHODS OF FABRICATING WITHOUT FOREIGN CATALYSIS

(75) Inventors: Zetian Mi, Lasalle (CA); Kai Cui, Montreal (CA); Hieu Pham Trung Nguyen, Montreal (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 17 days.

(21) Appl. No.: 13/370,449

(22) Filed: Feb. 10, 2012

(65) Prior Publication Data

US 2012/0205613 A1   Aug. 16, 2012

Related U.S. Application Data

(60) Provisional application No. 61/441,310, filed on Feb. 10, 2011, provisional application No. 61/558,483, filed on Nov. 11, 2011.

(51) Int. Cl.
*H01L 29/06* (2006.01)

(52) U.S. Cl.
USPC ............. 257/9; 257/E29.005; 257/E21.09; 438/478; 977/774; 977/762

(58) Field of Classification Search
USPC ............. 257/9, E29.005, E21.09; 438/478; 977/762, 774
See application file for complete search history.

(56) References Cited

PUBLICATIONS

Troncale et al., Applied Physics Letters, 91, 241909 (2007).*
Gutierrez et al. Journal of Crystal Growth 278 (2005) 151-155.*

* cited by examiner

*Primary Examiner* — Jami M Valentine
(74) *Attorney, Agent, or Firm* — The Law Office of Michael E. Kondoudis

(57) ABSTRACT

Amongst the candidates for very high efficiency solid state light sources and full solar spectrum solar cells are devices based upon InGaN nanowires. Additionally these nanowires typically require heterostructures, quantum dots, etc which all place requirements for these structures to be grown with relatively few defects and in a controllable reproducible manner. Additionally flexibility according to the device design requires that the nanowire at the substrate may be either InN or GaN. According to the invention a method of growing relatively defect free nanowires and associated structures for group IIIA-nitrides is presented without the requirement for foreign metal catalysts and overcoming the non-uniform growth of prior art non-catalyst growth techniques. According to other embodiments of the invention self-organizing dot-within-a-dot nanowire and dot-within-a-dot-within-a-well nanowire structures are presented.

17 Claims, 28 Drawing Sheets

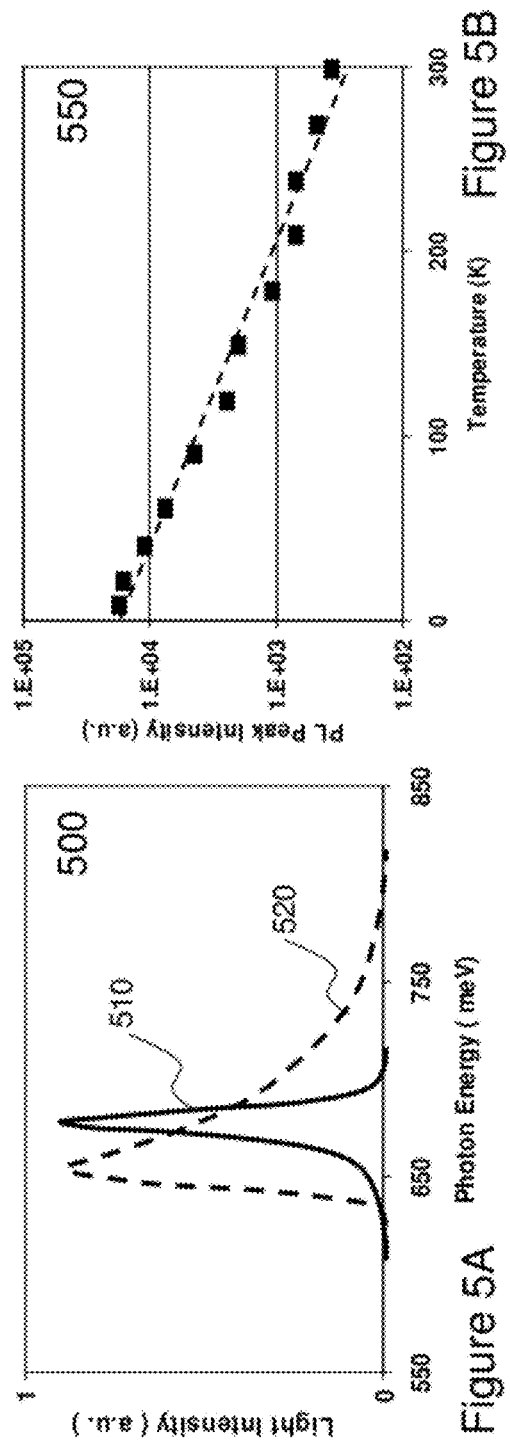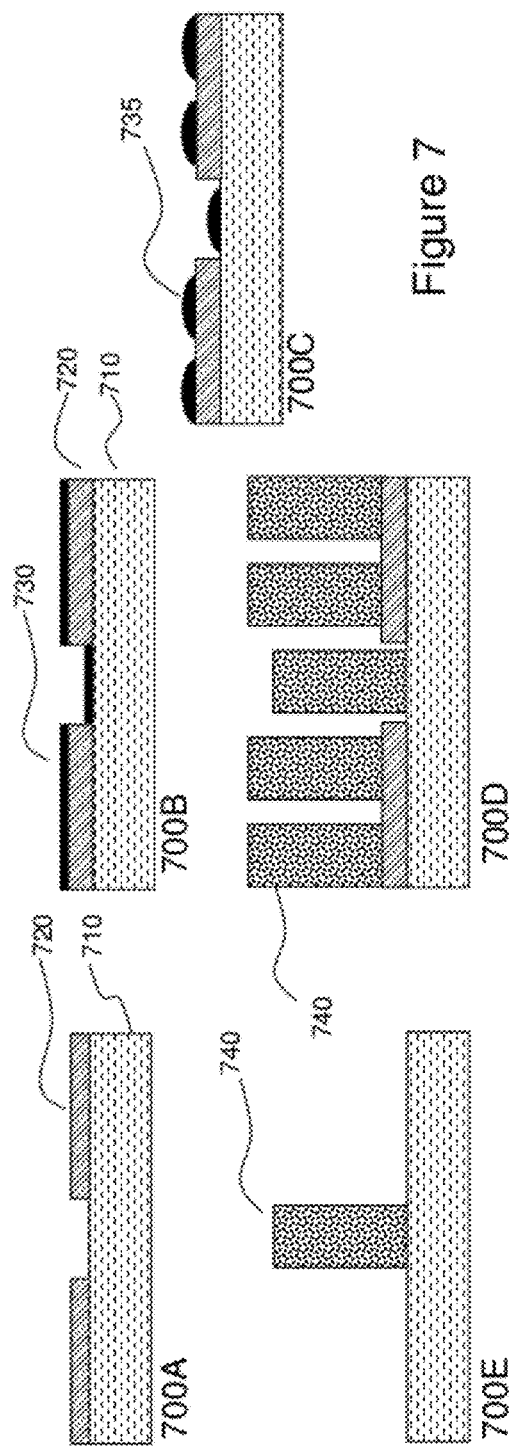

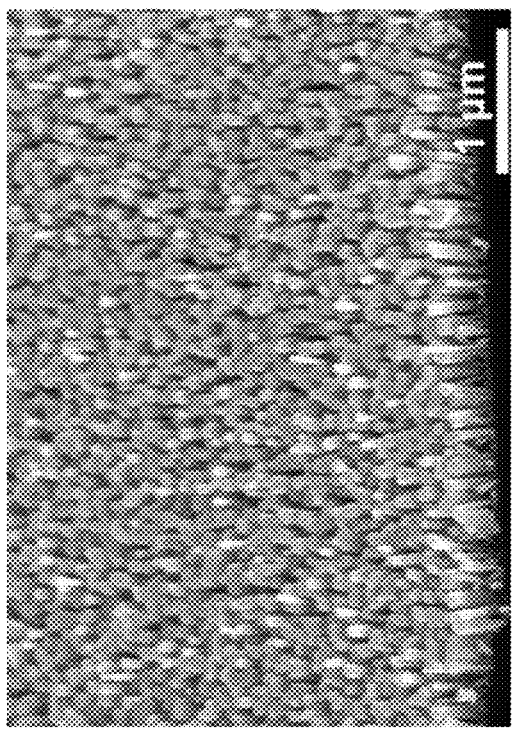
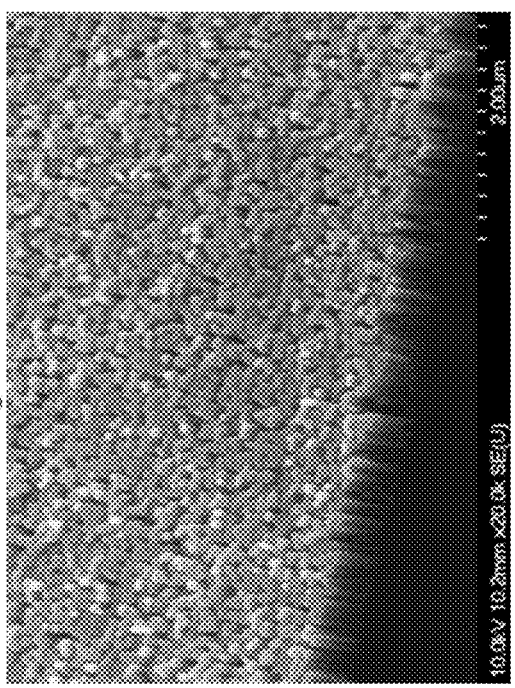
Figure 16A
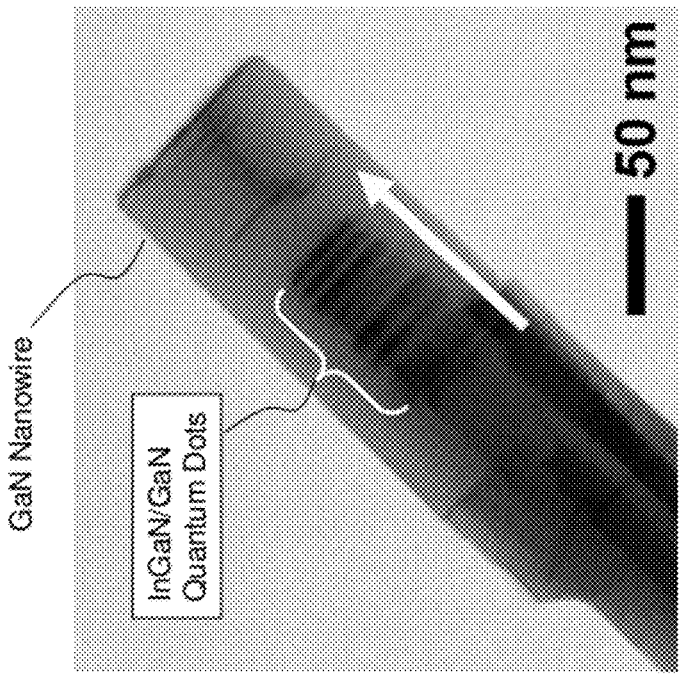
Figure 16B

HIGH EFFICIENCY BROADBAND SEMICONDUCTOR NANOWIRE DEVICES AND METHODS OF FABRICATING WITHOUT FOREIGN CATALYSIS

CROSS-REFERENCE TO RELATED APPLICATIONS

This patent application claims the benefit of U.S. Provisional Patent Application 61/441,310 filed on Feb. 10, 2011 entitled "High Efficiency Broadband Semiconductor Nanowire Devices and Methods of Fabricating without Foreign Metal Catalysts" and U.S. Provisional Patent Application 61/558,483 filed on Nov. 11, 2011 entitled "High Efficiency Broadband Semiconductor Nanowire Devices and Methods of Fabricating without Foreign Metal Catalysts".

FIELD OF THE INVENTION

This invention relates to semiconductor nanowire devices and more specifically to those formed without foreign metal catalysis.

BACKGROUND OF THE INVENTION

The ability to generate and manipulate light with electricity by Sir Humphrey Davy 200 years ago sparked a century of development by the likes of Thomas Edison, Joseph Swan, Sandor Just (tungsten filaments), and Irving Langmuir (inert gas instead of vacuum) leading to the establishment 100 years ago of tungsten filament lamps, which as the dominant light source have fundamentally shifted how people live, work, play. However, the efficiency of such light sources is woefully low. For example a 60 W incandescent light is only 2.1% efficient, a quartz halogen only 3.5%, in terms of generating light within the visible spectrum of the human eye. Accordingly today there is a massive worldwide campaign to have incandescent lights replaced wherever possible by compact fluorescent lights (CFL) which have an efficiency of approximately 22% thereby reducing energy consumption significantly.

However, whilst CFLs provide an immediate and visible statement by Governments and other organizations worldwide that they are addressing global climate change, environmental issues etc they are not a panacea. Amongst the disadvantages of fluorescent lights are frequent switching limiting lifetime, health and safety from the mercury content, UV emissions which affect some materials, flicker affecting individuals with autism, epilepsy, lupus, chronic fatigue syndrome, and vertigo, radio interference, operating temperature where efficiency drops with increasing/decreasing temperature from room temperature, non-operation at below freezing, low-luminance requiring long tubes and limiting power output, dimming, and recycling through the phosphor and mercury.

However, a monochromatic solid state light source within the visible wavelength range can achieve in principle an efficiency approaching 100%. Additional to energy consumption such solid state light sources should also reduce consumption of precious metals, reduce recycling as well as address health and safety issues. Beneficially solid state light sources by virtue of their small size, low weight, and low voltage operation can also be employed in a wide range of situations where incandescent or CFL lights cannot. At present niche applications such as holiday decorations in conjunction with indicator lighting in panels, back lighting in LCD displays etc mean that solid state lighting sales today account for only approximately 2% of the current lighting market and will grow to only approximately 3% in 2011.

Despite this solid state lighting is a massive market which according to NextGen Research ("LEDs and Laser Diodes: Solid State Lighting Applications, Technologies, and Market Opportunities", February 2009, http://www.nextgenresearch.com/research/1001995-LEDs_and_Laser_Diodes) forecasts the overall solid-state lighting (SSL) market will achieve worldwide revenues topping $33 billion by 2013. The illumination segment of the LED market will see compound annual growth rate (CAGR) of nearly 22% in the 2009-2013 timeframe as cities worldwide shift their streetlights to these more energy-efficient and ecologically friendly solutions. However, the majority of this growth will be generated from niche lighting applications including architectural, task lighting, medical and off-grid lighting applications rather than the residential lighting market according to The Strategy Analytics ("LED Device and Material Market Trends", June 2009, http://www.strategyanalytics.com/default.aspx?mod=ReportAbstractViewer&a0=4788).

As such the majority of the lighting market remains inaccessible despite the considerable research effort and investment have been expended. This arises due to the challenges in realizing suitable LED technologies and devices using conventional quantum well structures, these including the relatively low internal quantum efficiency of these structures, the low light extraction efficiency realized, and relatively high device fabrication costs. Additionally to achieve a "white" LED today the devices will generally employ a phosphor-conversion scheme, which sets the ultimate quantum efficiency of white LEDs to below 65%. In this regard, the high luminescence efficiencies, low fabrication costs, and processibility of semiconductor nanostructures, including quantum dots and nanowires, have made them promising candidates for future lighting devices and the subject of considerable research and development.

With the recent discovery that the band gap of indium nitride (InN) at approximately 0.7-0.8 eV, see for example J. Yu et al in "Unusual Properties of the Fundamental Band Gap of InN," (Appl. Phys. Lett., Vol. 80, p. 4741, 2002) and T. Matsuoka in "Optical Bandgap Energy of Wurtzite InN" (Appl. Phys. Lett., Vol. 81, p. 1246, 2002), the epitaxial growth and characterization of InN nanowires and whiskers has become the focus of significant research, including for example T. Stoica et al in "MBE Growth Optimization of InN Nanowires" (J. Crystal Growth, Vol. 290, p. 241, 2006), R. Calarco et al in "GaN and InN Nanowires Grown by MBE: A Comparison" (Appl. Phys. A, Vol. 87, p. 499, 2007), C-Y Chang et al in "Electrical Transport Properties of Single GaN and InN Nanowires" (J. Elect. Materials, Vol. 35, No. 4, p. 738, 2006), F. Werner et al "Electrical Conductivity of InN Nanowires and the Influence of the Native Indium Oxide Formed at Their Surface" (Nano. Lett., Vol. 9, p. 1567, 2009) and J. Grandal et al "Accommodation Mechanism of InN Nanocolumns Grown on Si (111) Substrates by Molecular Beam Epitaxy" (Appl. Phys. Lett., Vol. 91, 021902, 2007).

When compared to other nitrides with group IIIA elements including aluminum, gallium and boron, InN exhibits the highest electron mobility (4400 $cm^2V^{-1} s^{-1}$ at 300 K), the smallest effective mass, and the highest saturation velocity. These properties make InN an excellent candidate for next generation of nanophotonic and nanoelectronic devices, including chip level nanoscale lasers and high-speed field effect transistors. Additionally, the band gap of InN at approximately 0.7 eV (1750 nm) when compared with GaN at approximately 3.3 eV (370 nm) means that the ternary alloy InGaN can be continuously tuned from approximately 0.7 to 3.3 eV, matching almost perfectly to the solar spectrum. Therefore, InGaN has also emerged as a promising material for future high-efficiency full solar spectrum solar cells, E. Trybus et al "InN: A Material with Photovoltaic Promise and Challenges" (*J. Crystal Growth*, Vol. 288, p. 218, 2006) as well as for broadband light sources (e.g. white LEDs or UV/visible and visible/IR LEDs).

It should be apparent to one skilled in the art that in order to provide broadband spectrum photonic devices that it should be structured so that the material at the front of the device emits/absorbs the shortest wavelengths and progressively longer wavelengths are emitted/absorbed by layers within the solar cell towards the lower most surface. As such, the material within a broadband device may grade from $In_xGa_{1-x}$ where $x\approx1$ to $In_yGa_{1-y}N$ where $y\approx0$, or a limited range therein. As such it is necessary to grow $In_yGa_{1-y}N$ nanowires onto the substrate of the photonic device.

Within the prior art $In_xGa_{1-x}N$ nanowires have been predominantly grown using the conventional approach of a foreign metal catalyst via the vapor-liquid-solid growth mechanism, see for example J. Li et al in U.S. Pat. No. 6,831,017 entitled "Catalyst Patterning for Nanowire Devices", L. Romano et al in U.S. Pat. No. 7,344,961 entitled "Methods for Nanowire Growth", C. Liang et al in "Selective-Area Growth of Indium Nitride Nanowires on Gold-Patterned Si(100) Substrates" (Appl. Phys. Lett., Vol. 81, p. 22, (2002) and X. Cai et al in "Straight and Helical InGaN Core-shell Nanowires with a High In Core Content" (Nanotechnology, Vol. 17, p. 2330, 2006). They have also been formed spontaneously under nitrogen rich conditions; see for example C-K Chao et al "Catalyst Free Growth of Indium Nitride Nanorods by Chemical Beam Epitaxy" (Appl. Phys. Lett., Vol. 88, p. 233111, 2006) and S. Hersee et al in U.S. Pat. No. 7,521,274 entitled "Pulsed Growth of Catalyst-Free Growth of GaN Nanowires and Application in Group IIIA Nitride Semiconductor Bulk Material."

Whilst the influence of growth parameters on the structural and optical properties of $In_xGa_{1-x}N$ nanowires has also been extensively studied, epitaxial InN nanowires grown according to the prior art exhibit tapered morphology, with a large variation in the wire diameter along the wire length, see for example T. Stoica et al in "MBE Growth Optimization of InN Nanowires" (J. Crystal Growth, Vol. 290, p. 241, 2006) and J. Grandal et al "Accommodation Mechanism of InN Nanocolumns Grown on Si (111) Substrates by Molecular Beam Epitaxy" (Appl. Phys. Lett., Vol. 91, p. 021902, 2007), and demonstrated spectral linewidths for these InN nanowires are commonly in the range of 60-100 meV. The extremely large inhomogeneous broadening observed makes it difficult to study the fundamental properties of InN, including the temperature dependence of the band gap and the electron concentration. Additionally, the poorly defined wire geometry leads to uncontrolled electrical and optical properties, severely limiting their device applications.

Further the direct growth of $In_xGa_{1-x}N$ on silicon, the most suitable substrate for $In_xGa_{1-x}N$ in terms of lattice and thermal mismatches, has been further complicated by the development of an amorphous $SiN_x$ layer during the initial stage of growth, see J. Grandal et al. Attempts to adjust these growth techniques, either by the intentional introduction of hydrogen or buffer layers, such as GaN or AlN, have met with limited success.

The prior art whilst demonstrating $In_xGa_{1-x}N$ nanowires can be grown has not yet demonstrated them with high quality and constant cross-section nor have they been grown on suitable substrates for low cost semiconductor processing. These developments to date being hindered to a large extent by the relatively low decomposition temperature of InN (approximately 500° C.-550° C.) as well as the very high migration rate of indium. Additionally, the prior art does not provide an effective means to control the growth and properties of InN nanowires spontaneously formed under nitrogen rich conditions.

Accordingly it would be beneficial to provide a means of growing high quality, uniform $In_xGa_{1-x}N$ nanowires directly upon silicon substrates without the requirement for predeposition of a catalyst. It would be of further benefit for the growth rate and properties of the $In_xGa_{1-x}N$ nanowires to be controlled through the parameters of the growth process and for the growth to continue despite the growth of the $SiN_x$ layer.

As discussed supra graded InGaN nanowire structures would allow broad spectrum photonic devices to be implemented with a single growth process thereby greatly increasing the efficiency of solar cells, white LEDs etc and reducing their costs. In solid state lighting applications the ultimate goal is a high efficiency white LED, typically operating from approximately 400 nm to approximately 750 nm. However, according to the prior art simple LED structures whilst offering a fairly broad wavelength range operate at relatively low efficiencies and typically employ three LED devices are required to even cover a substantial portion of the wavelength range to which the human eye responds, the so-called visible wavelength range, which is 380 nm to 750 nm. As such red, green and blue centered LED devices are typically used to create the impression of white. Blue LEDs were the last to be developed based upon InGaN structures. These blue LEDs also form the basis of phosphor based white LEDs. However, increasing the efficiency of LEDs by the introduction of quantum confined structures, such as quantum wells, multi-quantum wells etc also results in a narrowing of the optical emission from the source thereby requiring that number of sources required to "blend" together for the desired white light increases, along with the cost and complexity of the devices overall.

It is within this context that semiconductor quantum dots, nanometer sized semiconductor particles which act as a very small "box" for electrons, and potentially the most efficient light sources ever developed have formed the subject of significant research. A specific class of quantum dot is the colloidal quantum dot created by solution phase chemistry. Much of the appeal of the colloidal quantum dot is that it can be readily integrated with other technology platforms at very low cost and that by varying the physical dimensions of the quantum dots they can be made to emit at points across the entire visible spectrum. Accordingly providing colloidal quantum dots with a range of dimensions within the same localized region acts to provide the required multiple sources to "blend" together to provide the illusion of a white light source. Recent work by R. R. Cooney et al entitled "Gain Control in Semiconductor Quantum Dots via State-Resolved Optical Pumping" (Phys. Rev. Lett., Vol. 102, 127404, 2009) has shown that quantum dots are in fact the most efficient material for generating gain ever measured. The use of quantum dots as white light emitters and in LEDs has also been proposed and demonstrated, see for example S. Sapra et al (Adv. Mater., Vol. 19, p. 569, 2007), M. J. Bowers et al (J. Am. Chem. Soc., Vol. 127, p. 15378, 2005), S. Coe et al (Nature, Vol. 420, p. 800, 2002), N. Tessler et al (Science, Vol. 295, p. 1506, 2002), and M. C. Schlamp et al (J. Appl. Phys., Vol. 82, p. 5837, 1997).

However, whilst colloidal quantum dots are themselves efficient an optical emitter employing them can only be efficient if the colloidal quantum dots are optically pumped with an efficient emitter at the appropriate wavelength. As noted supra InGaN nanowire structures can form the basis for very high efficiency emitters that cover the wavelength range from near UV (370 nm) to the near infra-red (1750 nm).

Accordingly it would be beneficial to provide a combination of colloidal quantum dots with high quality, uniform InGaN nanowires that can be grown directly upon silicon substrates without the requirement for predeposition of a catalyst. Such a combination beneficially combines high efficiency InGaN based nanowire LEDs for pumping highly efficient colloidal quantum dot emitters which when formed from multiple dimensions yield emission across the visible spectrum, thereby providing a high efficiency "white" LED.

To date significant progress has been made in demonstrating blue and blue-green LEDs using InGaN to create the third LED within a red-green-blue combination (RGB) approach in forming a white LED. LEDs for the remainder of the RGB combination being manufactured typically from AlGaInP and GaAsP based quaternary semiconductor systems for yellow-orange LEDs and GaAsP and AlGaAs for red LEDs. However, as noted supra InGaN allows bandgap tuning across the visible spectrum and into the UV/infrared. Within the prior art InGaN/GaN LEDs have exhibited very low internal quantum efficiencies in the green, yellow and red wavelength ranges, see for example P. T. Barletta et al (Appl. Phys. Lett., Vol. 90, p. 151109, 2007) and C. Wetzel et al (MRS Internet J. Nitride Semicond. Res., Vol. 10, p. 2, 2005). One of the primary causes for this low efficiency is the strain-induced polarization field in InGaN/GaN quantum wells and the resulting quantum confined Stark effect, which leads to a spatial charge separation.

In this regard, InGaN/GaN quantum dot heterostructures have drawn considerable attention; see for example K. Tachibana et al (IEEE J. Sel. Top. Quantum., Vol. 6, p. 475, 2000), N. Grandjean et al (Proc. IEEE, Vol. 95, p. 1853, 2007) and Q. Wang et al (Appl. Phys. Lett., Vol. 93, p. 081915, 2008). This is based upon their providing strong carrier confinement and being identified, although with some debate, as the emission mechanism for the high efficiency InGaN blue and blue-green LEDs and lasers. However, to date three-dimensional InGaN/GaN quantum dot heterostructures obtained by self-organization using Stranski-Krastanow growth or phase segregation induced In-rich clusters have yielded similar results to bulk planar InGaN/GaN quantum well heterostructures. As such high efficiency long wavelength (>550 nm) emission has been severely limited by the presence of large densities of misfit-dislocations related to the large lattice mismatch (approximately 11%) between InN and GaN. However, significantly reduced defect densities can be achieved in InGaN nanowire heterostructures, due to the effective lateral strain relaxation, see Y. Chang et al in "Molecular Beam Epitaxial Growth and Characterization of Non-Tapered InN Nanowires on Si(111)" (Nanotechnology, Vol. 20, p. 345203, 2009). This reduced strain distribution also leads to a weaker piezoelectric polarization field.

As noted supra InGaN nanowires offer advantages for LED manufacturing, including high light extraction efficiency and the compatibility with low cost, large area Si substrates, see Y. Chang et al (Appl. Phys. Lett., Vol. 96, p. 013106, 2010), and can form the basis of either discrete LEDs or LED based white LEDs in combination with colloidal quantum dots. However, to date such nanowire structures have reported extremely low internal quantum efficiency (<10%), due to the lack of effective carrier confinement in the wire axial direction as well as the nonradiative recombination associated with the presence of surface states. However, with the ability to form nearly defect-free InGaN nanowires as discussed supra then it is proposed that InGaN quantum dots directly embedded in InGaN nanowires would provide a route to realizing high efficiency green and red emission sources. Within the prior art no such nanoscale heterostructures have been reported.

According to embodiments of the invention based upon the ability to form defect-free InGaN nanowires directly onto silicon substrates without foreign metal catalysts it would be beneficial to modify the growth process such that nearly defect-free InGaN/GaN dot-in-a-wire heterostructures on silicon could be implemented. Further, by varying the growth parameters to adjust the In composition within the InGaN quantum dots these high efficiency optical emitters (approximately 45%) may be beneficially tuned to emit within the green, yellow, and amber/red regions of the visible spectrum to compliment the already existing blue and blue-green emission sources. Beneficially the nearly defect-free growth permits the formation of In-rich nanoclusters to form through phase separation within the InGaN quantum dot, such that these high efficiency optical emitters are further implemented by a unique dot-within-a-dot-in-a-wire structure rather than a prior art dot-in-a-wire approach.

Additionally, if multiple quantum dots are incorporated with high quality, uniform InGaN nanowire geometries vertically such that the InGaN nanowire device actually monolithically stacks multiple, for example blue, green and red, emitters in a single device which can then be realised with a single epitaxial growth sequence. Beneficially embodiments of the invention therefore allow for phosphor-free white LEDs that can be fabricated on low cost, large area substrates with high luminous flux.

Although progress has been made for InGaN/GaN quantum well LEDs, the performance of such devices in the green, yellow, and red wavelength ranges has been plagued by the very low efficiency, as outlined supra, and "efficiency droop", i.e. the decrease of the external quantum efficiency with increasing current. The underlying mechanism has been extensively investigated and includes factor such as defects and carrier delocalization, polarization field, Auger recombination, carrier leakage, and poor hole transport. To this end, intensive studies have been performed with the use of various nanostructures, including quantum dots and nanowires, which can exhibit significantly reduced dislocation densities and polarization field and provide a greater degree of flexibility for sophisticated device engineering, compared to conventional planar heterostructures. Multi-color emission has been realized by using InGaN/GaN core-multi-shell and well/disk-in-a-wire structures and by exploring various hybrid nanowire heterostructures, see for example "Fabrication of a High-Brightness Blue-Light-Emitting Diode Using a ZnO-Nanowire Array Grown on p-GaN Thin Film" by X. M. Zhang et al (Adv. Mater. 2009, Vol. 21, p. 2767, 2009) and "GaN/In$_x$Ga$_{1-x}$N/GaN/ZnO Nanoarchitecture Light Emitting Diode Microarrays" by C-H Lee et al (Appl. Phys. Lett., Vol. 94, p. 213101, 2009).

More recently, white light emission has been demonstrated in LEDs consisting of compositionally graded InGaN nanowires (see for example "Catalyst-Free InGaN/GaN Nanowire Light Emitting Diodes Grown on (001) Silicon by Molecular Beam Epitaxy" by W. Guo et al, Nano Lett., Vol. 10, p. 3355, 2010), InGaN/GaN nanodisks (see for example "InGaN/GaN Nanorod Array White Light-Emitting Diode" by H-W Lin et al, Appl. Phys. Lett. Vol. 97, p. 073101, 2010), and etched InGaN quantum wells ("High Performance InGaN/GaN Nanorod Light Emitting Diode Arrays Fabricated by Nanosphere Lithography and Chemical Mechanical Polishing Processes" by Y-L Chen, Opt. Express, Vol. 18, p. 7664, 2010).

However, a significant roadblock for the development of nanowire LEDs is the very low quantum efficiency, and the fact that to date, there has been no report on the internal quantum efficiency of GaN-based nanowire LEDs under electrical injection. Direct electrical injection being beneficial for high efficiency to avoid cascading efficiencies of photon generation and then optically pumping the quantum heterostructures. Due to the lack of 3-dimensional carrier confinement, the radiative electron-hole recombination in commonly reported GaN nanowire LED heterostructures has been severely limited by the presence of unoccupied Ga dangling bond and/or large densities of surface defects along the nonpolar GaN surface (m-plane), which can lead to a Fermi-level pinning on the nanowire lateral surfaces. Additionally, the device performance is adversely affected by the poor hole injection and transport processes in InGaN/GaN nanoscale heterostructures, caused by the heavy effective mass, small mobility, and low concentration of holes. While electrons can exhibit a relatively uniform distribution across the entire active region, injected holes largely reside in the small region close to the p-doped GaN layer. The highly non-uniform carrier distribution also lead to significantly enhanced Auger recombination and increased electron overflow, further limiting the optical emission efficiency at high injection levels In this regard, special techniques, including p-doped active region, electron blocking layer, and thin InGaN barriers, have been implemented with the prior art to improve the performance of conventional InGaN/GaN quantum well LEDs. However, such phenomena have not been addressed for nanowire LEDs. Accordingly, in this context, it would be beneficial for there to be a method of growing and fabricating dot-in-a-wire LED heterostructures grown on Si(111) substrates that remove the efficiency bottleneck of nanowire devices. It would be further advantageous if through varying the epitaxial growth process that the superior carrier confinement provided by the dots could be combined with a significantly enhanced hole transport, and that this be achieved in a single epitaxial growth sequence.

Whilst the discussions above have centered to the benefits of high quality uniform nanowires grown without foreign metal catalysts have centered to broadband optical emitters, detectors, and solar cells these benefits of monolithically integrated high quality optical emitters, electrodes, PIN diodes, heterostructures, etc also allow such structures to be exploited in photoelectrochemical processes as well as photocatalysis, for example the generation of hydrogen and oxygen from water through solar energy, as well as other areas including for example electrobiological devices for sensing.

According to embodiments of the invention therefore high efficiency LEDs for generating high efficiency solid state white light sources can be manufactured based upon forming nanowires, in conjunction with the carrier confinement enabled by the dot-in-a-wire structures and the enhanced carrier transport by the modulation p-doping technique, using a nearly-defect free InGaN nanowire growth process upon silicon substrates that does not require a foreign metal catalyst to be introduced or complex precursor gas control processes to achieve growth which would be incompatible with forming either quantum dot in a wire structures or the quantum dot within a quantum dot within a wire structures for increased efficiency. The process further allow single epitaxial growth and enhanced hole transport through controlled doping of the structures.

SUMMARY OF THE INVENTION

It is an object of the present invention to obviate or mitigate at least one disadvantage of the prior art.

In accordance with another embodiment of the invention there is provided a device comprising:
a substrate having at least one semiconductor nanowire of a plurality of semiconductor nanowires formed thereupon, the at least one semiconductor nanowire comprising at least one first quantum dot disposed within a second quantum dot within a predetermined portion of the at least one semiconductor nanowire and formed by a self-organization of the at least one semiconductor nanowire during its growth.

In accordance with another embodiment of the invention there is provided a device comprising a substrate having at least one semiconductor nanowire of a plurality of semiconductor nanowires formed thereupon, the at least one semiconductor nanowire comprising at least one first quantum dot disposed within a first quantum well within a predetermined portion of the at least one semiconductor nanowire and formed by a self-organization of the at least one semiconductor nanowire during its growth.

In accordance with another embodiment of the invention there is provided a device comprising:
initiating the growth of at least one wurtzite semiconductor structure of a plurality of wurtzite semiconductor structures on a substrate, the initiation achieved by providing for the at least one wurtzite semiconductor structure at least one nanoscale droplet of a plurality of nanoscale droplets of a first predetermined group IIIA element constituent of the wurtzite semiconductor on the surface of the substrate and absent both a foreign catalyst and other constituent elements of the wurtzite semiconductor;
growing from the at least one wurtzite semiconductor structure a nanowire by growing a series of semiconductor materials in a predetermined sequence atop the wurtzite semiconductor wherein a predetermined portion of the series of semiconductor materials includes at least of a predetermined second group IIIA element and a predetermined group five A (VA) element; wherein growing the nanowire comprises forming at least one first quantum dot disposed within a first quantum well by a process of self-organization within a predetermined portion of the nanowire.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 5A and 5B depict photoluminescence spectra and intensity versus temperature for InN nanowires grown according to an embodiment of the invention;

FIG. 7 depicts an exemplary process for growing InN nanowires according to an embodiment of the invention at predetermined locations upon a substrate;

FIG. 16A depicts an SEM image showing the morphology of InGaN/GaN dot-in-a-wire heterostructures grown on Si(111) according to an embodiment of the invention;

FIG. 16B depicts a low magnification bright field TEM showing the position and alignment of the InGaN dots in a GaN nanowire;

DETAILED DESCRIPTION

The present invention is directed to semiconductor nanowire devices and more specifically to broadband optical emitters and detectors formed without foreign metal catalysis.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Figure 1:
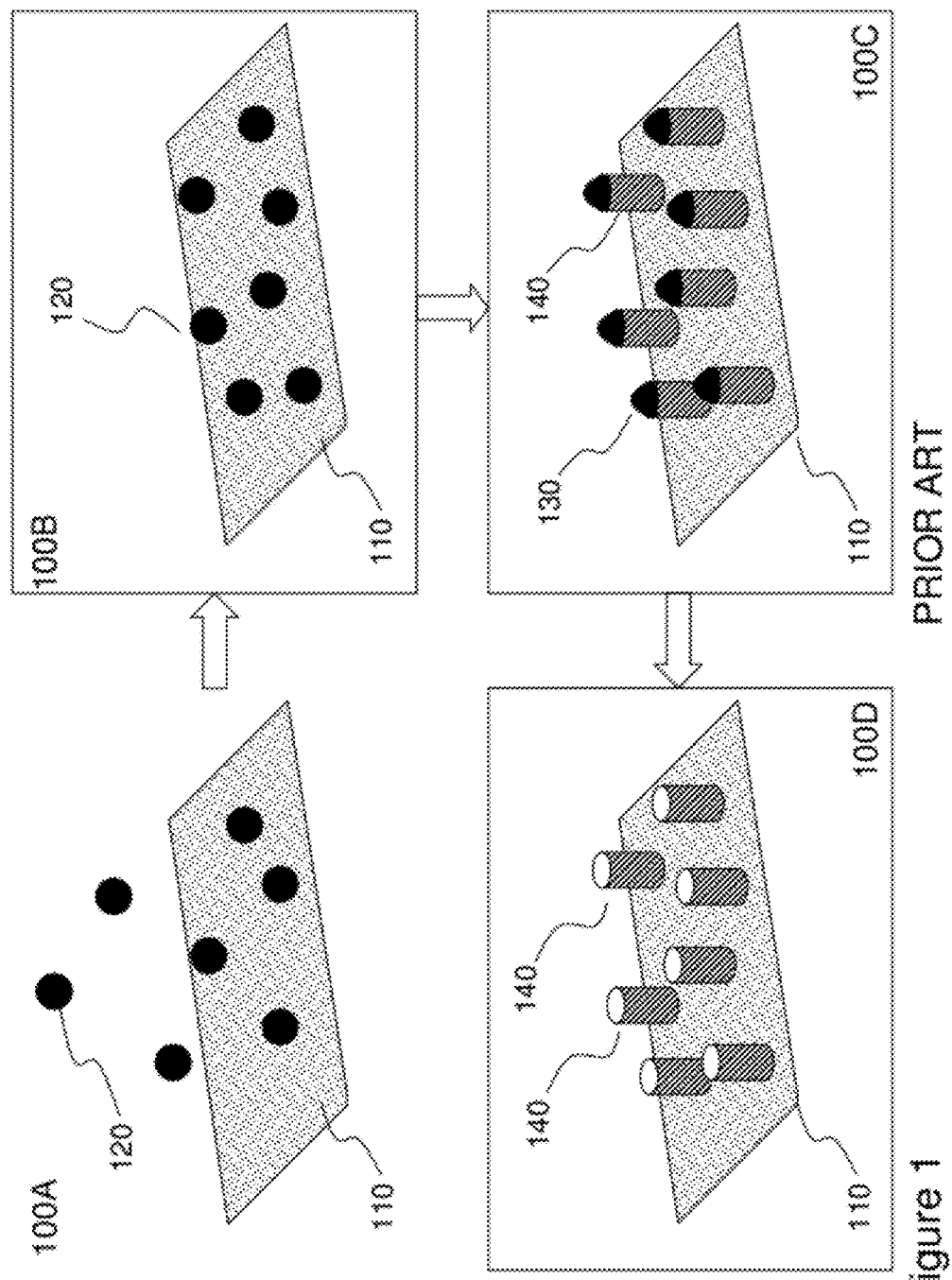
FIG. 1 is schematic sequence of growing nanowires according to the prior art with a foreign metal catalyst.

Referring to FIG. 1 there is shown a sequence of growing nanowires according to the prior art with a foreign metal catalyst. Such prior art using the vapor-liquid-solid (VLS) growth mechanism including for example J. Li et al in U.S. Pat. No. 6,831,017 entitled "Catalyst Patterning for Nanowire Devices", L. Romano et al in U.S. Pat. No. 7,344,961 entitled "Methods for Nanowire Growth", C. Liang et al in "Selective-Area Growth of Indium Nitride Nanowires on Gold-Patterned Si(100) Substrates" (Appl. Phys. Lett., Vol. 81, p. 22, 2002) and X. Cai et al in "Straight and Helical InGaN Core-shell Nanowires with a High In Core Content" (Nanotechnology, Vol. 17, p. 2330, 2006).

As shown in first step 100A a substrate 110 is disposed within a deposition environment wherein catalyst microparticles 120 are present, for example gold microparticles. Accordingly at second step 100B some of these catalyst microparticles 120 have deposited onto the substrate 110. The resultant combination of substrate 110 and microparticles 120 are then placed within a semiconductor growth reactor, for example a molecular beam epitaxy reactor (MBE), wherein the requisite precursor gases are introduced under conditions of predetermined power, temperature, pressure etc. The result is these precursors are disassociated within the semiconductor growth reactor and the active species of interest, for example indium (In), gallium (Ga) and nitrogen (N) are then present in a vapor state. These active species then condense onto the substrate 110 in the presence of the gold microparticles 120 forming a liquid phase which subsequently solidifies with the gold migrating to the upper surface of the structure as it solidifies so-called vapour-liquid-solid (VLS) growth. Accordingly a nanowire grows at the locations of the original gold microparticles 120 as shown in third step 100C wherein nanowires 140 are formed beneath gold 130 upon the substrate 110. Upon expiration of a predetermined period of time, governed by nanowire growth rate and desired nanowire length, the reaction is terminated. Then at fourth step 100D the gold 130 is etched away leaving the nanowires 140 upon the substrate.

Within the prior art other approaches for providing the metal catalyst, other than depositing gold microparticles 120 have been described, see for example J. Li et al in U.S. Pat. No. 6,831,017 entitled "Catalyst Patterning for Nanowire Devices", which include metallization and etching after photolithography, metallization onto substrates with predefined photolithographic pattern and subsequent lift-off, melting deposited metallization, evaporating through porous spheres etc. Alternative catalysts within the prior art also include iron (Fe) and nickel (Ni).

Figure 2A:
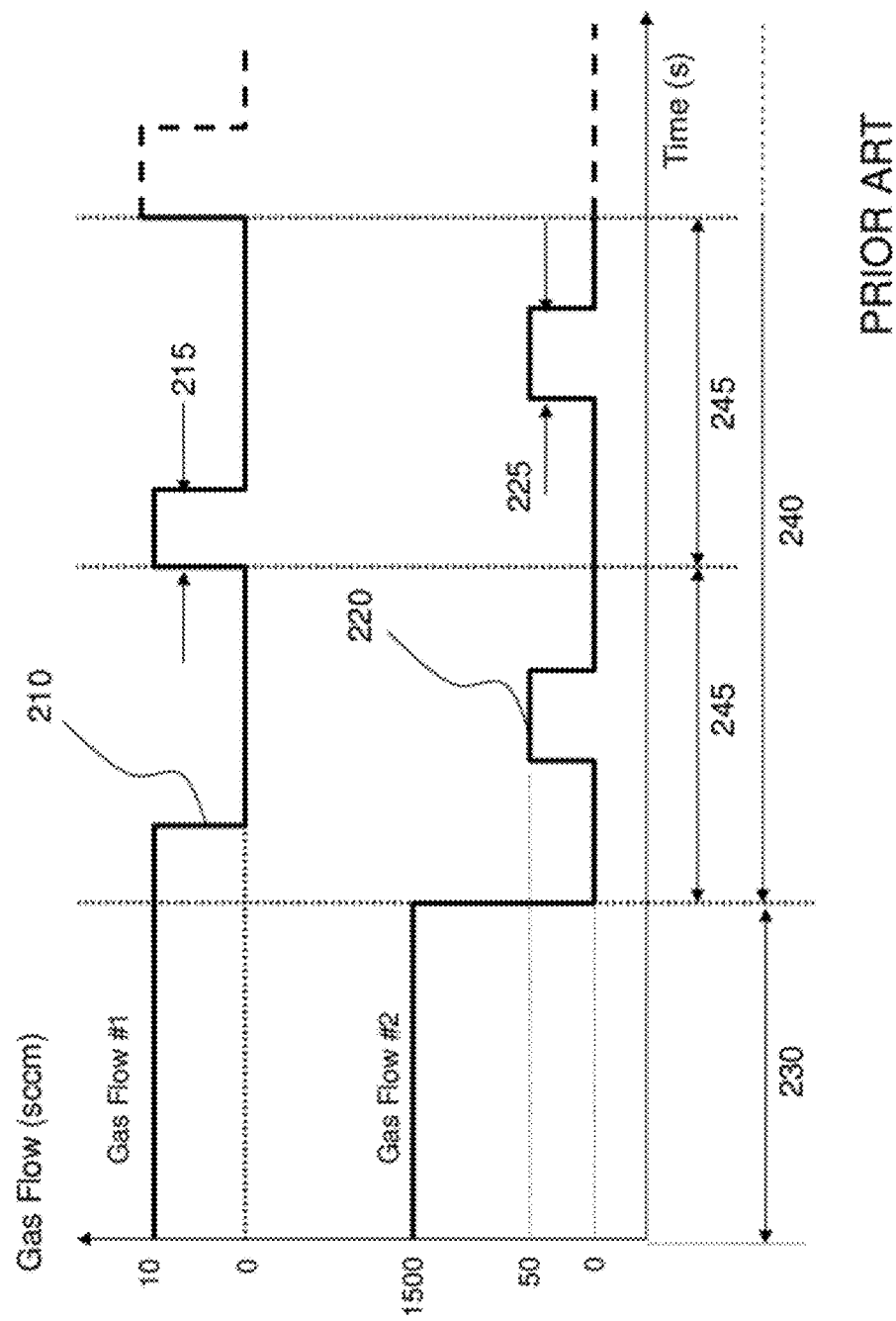
FIG. 2A is a schematic of the gas flows for growing nanowires according to the prior art without a foreign metal catalyst.

However, these prior art VLS growth based nanowires exhibit problems as the catalytic processes cannot control the uniformity of the resulting nanowires and the catalyst is inevitably incorporated into the nanowires to some degree, thereby degrading the crystalline quality of the nanowires, wherein the introduced defects result in limits to their performance and applications. Accordingly within the prior art there are also approaches to growing nanowires that relate to the spontaneous formation of growth points for nanowires under nitrogen rich environments, thereby removing the requirement for a foreign metal catalyst. Such an example of the gas control for such a prior art growth approach is shown in FIG. 2A according to the prior art of S. Hersee et al in U.S. Pat. No. 7,521,274 entitled "Pulsed Growth of Catalyst-Free Growth of GaN Nanowires and Application in Group IIIA Nitride Semiconductor Bulk Material.".

Accordingly there are shown gas flow curves for two gases in the growth of a nanowire, for example gallium nitride (GaN). Accordingly first curve 210 plots the gas flow of the first precursor gas for Ga, namely trimethylgallium (TMGa), versus time. Second curve 220 plots the gas flow of the second precursor gas, ammonia ($NH_3$). During a first continuous growth regime 230 both precursor gases are present within the reactor with an effective N:Ga ratio of 150. During this continuous growth period 230 nanowires are spontaneously formed upon a buffer layer on the substrate, the buffer layer for example being a group IIIA-N alloy including for example GaN, AlN, InN, InGaN. Subsequently the growth enters a pulsed growth regime 240 wherein the gases are intermittently introduced into the reaction chamber with a periodic sequence 245. For example Hersee teaches that the first duration 215 for the first precursor gas TMGa is typically 10-20 seconds whilst second duration 225 for the second precursor gas $NH_3$ is typically 15-30 s. Accordingly typical duration for the periodic sequence is 60-90 seconds. Further as evident from second curve 220 the N:Ga ratio is reduced to about 50 within this example. Accordingly continuous growth regime 230 corresponds to a nitrogen rich atmosphere in comparison to the pulsed growth regime 240.

However, Hersee notes that the growth behavior of the nanowire is changed significantly for even small molecular fractions of an additional precursor gas, such as trimethylaluminum (TMAl) for aluminum and trimethlyindium (TMIn) for indium, at even percentages as low as 1%, such that nanowire cross-sections change, growth rates shift, etc. Given that the growth of full solar spectrum solar cells would require the $In_xGa_{1-x}N$ composition within a nanowire to change from approximately x=0.00 to approximately x=1.00 namely a molecular fraction change of 100%, and even shifting from a blue light source (x=0.30) to a green light source (x=0.43) requires a molecular fraction change of approximately 13% it is evident that significant issues arise in forming nanowires with varying composition as required for graded nanowires or nanowires with embedded quantum wells. Additionally these varying growths during formation of a nanowire result in increased defects thereby reducing their efficiency and applications. Similarly Hersee teaches that the nanowires are grown with a cross-section determined by the selective area mask patterned onto the buffer layer rather than being determined from the process conditions of the reactor. It is also important to note that the growth mode of Hersee was based upon GaN nanowires and not InN nanowires that are the focus of this invention as the rapid lateral growth variations evident from even minor compositional changes would significantly impact the growth of InN nanowires.

Figure 2B:
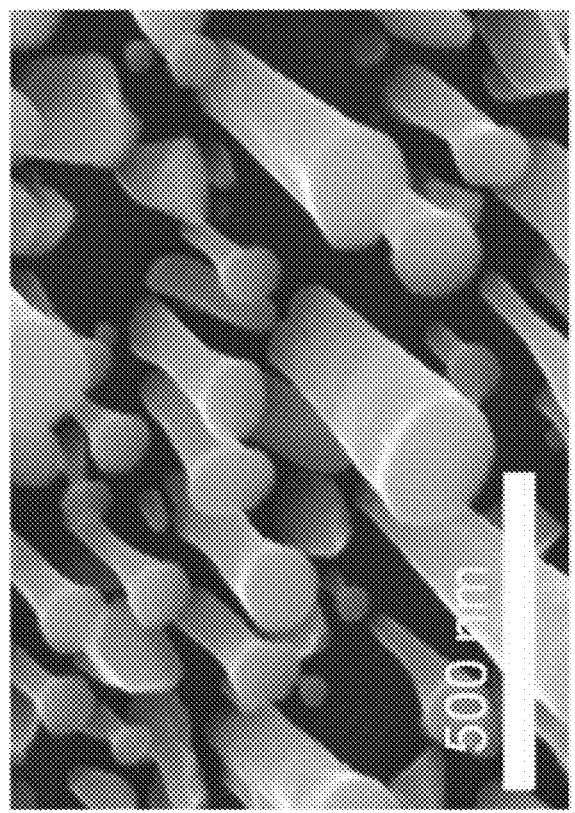
FIG. 2B is a SEM micrograph of InN nanowires grown according to the prior art.

Referring to FIG. 2B there is shown an SEM micrograph of InN nanowires grown using a continuous growth upon a silicon substrate without application of a selective area growth mask. As is evident the InN wires have grown not only at different rates, implying that nucleation occurred at different times within the process but that their geometries are not uniform. Accordingly it is believed that the approach of Hersee demonstrated with patterning of the buffer layer at dimensions of approximately 150 nm would not work at smaller dimensions as nucleation may or may not occur within the short continuous mode growth before pulsed growth mode is required to maintain the nanowire growth process.

Figure 3:
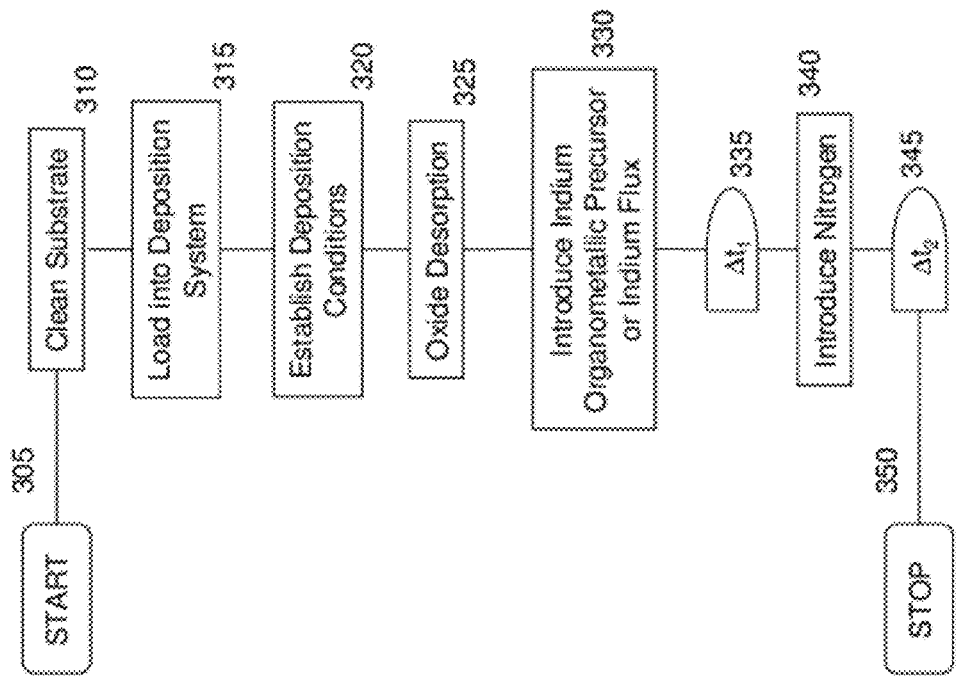
FIG. 3 is an exemplary process flow for growing InN nanowires according to an embodiment of the invention.

Referring to FIG. 3 there is shown an exemplary process according to an embodiment of the invention for growing InN nanowires onto silicon (of orientation<111>) substrates using a Veeco Gen II MBE system equipped with a radio frequency (RF) plasma source. The process starts at step 305 and moves to step 310 wherein the silicon (Si) wafer is cleaned, in this case by an ex-situ clean using standard solvent and buffer hydrofluoric acid solution, before the process moves to step 315 and the Si wafer is loaded into the MBE chamber. Next, in step 320, the deposition parameters for the nanowire growth are established, determined by the composition of the nanowire, inclusion of quantum dots, quantum wells, etc as well as physical parameters such as nanowire length. Subsequently in step 325 an in situ oxide desorption at elevated temperatures (approximately 770° C.) is performed together with a degassing procedure (approximately 850° C. for 10 minutes), the result of which is that a 7×7 reflection high energy electron diffraction (RHEED) pattern can be clearly observed as evident from first insert 370.

Next in step 330 the substrate temperature is lowered, typically between 430° C. and 520° C. for the growth of InN nanowires and the indium organometallic precursor or indium beam flux is introduced, i.e. TMIn or In respectively, and the reactor operates for a first predetermined period of time $\Delta t_1$ in step 335 in order to deposit a thin In layer, of thickness typically between 0.5 nm and 1.6 nm (representing typically 10 to 30 seconds of processing). Next in step 340 the nitrogen precursor, ammonia, is introduced and the process moves to step 345, wherein the substrate temperature is raised to 480° C. and the process continues to execute for a second predetermined period of time $\Delta t_2$ before the process terminates at step 350. The growth period $\Delta t_2$ ranged from 30 minutes to 10 hours within experiments performed.

Additionally, the formation and properties of InN nanowires under different growth conditions have been evaluated. Typical process ranges for InN nanowires include nitrogen flow rates between 1.0 sccm and 2.0 sccm, In partial pressure between $0.3$-$1.0 \times 10^{-7}$ Torr, growth temperature between 430° C. and 520° C., and RF plasma forward power between 300 W and 450 W.

Referring to FIGS. 4A through 4D there are shown SEM images taken at tilt angles of 45° for samples grown at 440° C., 460° C., 480° C., and 500° C., respectively are shown. The In flux was fixed at $1 \times 10^{-7}$ Torr for the four samples, and a 0.5 nm In seeding layer was deposited in situ prior to the growth initiation. It is evident that both the wire density and size vary considerably with the change in the growth temperature. At a relatively low growth temperature (approximately 440° C.), the nanowires are generally coalesced together and exhibit a bimodal distribution in both height and diameter, shown in FIG. 4A. A further reduction in the growth temperature will lead to compact InN layers due to the reduced In thermal desorption. With the increase in the growth temperature, the wires become well spaced, the wire densities decrease considerably from approximately 100 $\mu m^{-2}$ to approximately 1 $\mu m^{-2}$, and the wire diameters increase from approximately 50 nm to approximately 200 nm, or larger in the temperature range of 440-500° C. The wire density and size are determined, to a large degree, by both the nucleation sites as well as the subsequent thermal-driven convalescence process during the initial stage of the wire formation. The properties of the nucleation sites, or In islands, are also strongly temperature dependent. At elevated substrate temperatures, conventional InN nanowires generally exhibit a severe enlargement of diameter toward the top due to a very high In migration rate. In contrast, InN nanowires grown at high temperatures approximately 460-500° C. according to embodiments of the invention are well faceted and highly homogeneous in height and, more importantly, exhibit completely suppressed tapering or broadening effect along the entire wire length, as shown in FIGS. 4A through 4D.

It can be seen that these wires are remarkably straight, with identical top and bottom sizes. They also exhibit homogeneous height. The wires are of wurtzite structure and well-separated, with the c-axis oriented vertically to the Si(111) substrate as commonly observed for IIIA-nitride nanowires grown on Si(111), see for example C. Shen et al (Appl. Phys. Lett., Vol. 88, p. 253104, 2006) and Y. Lu et al (Appl. Phys. Lett., Vol. 91, p. 202109, 2007).

Figure 4A:
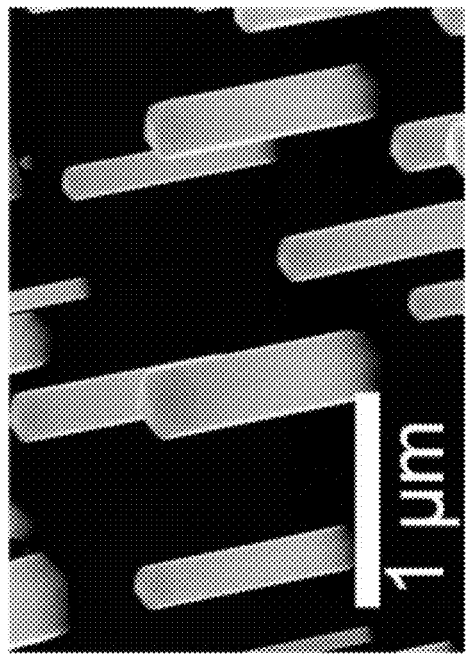
FIGS. 4A through 4D show SEM micrographs of InN nanowires grown according to an embodiment of the invention at varying growth temperature.
Figure 4B:
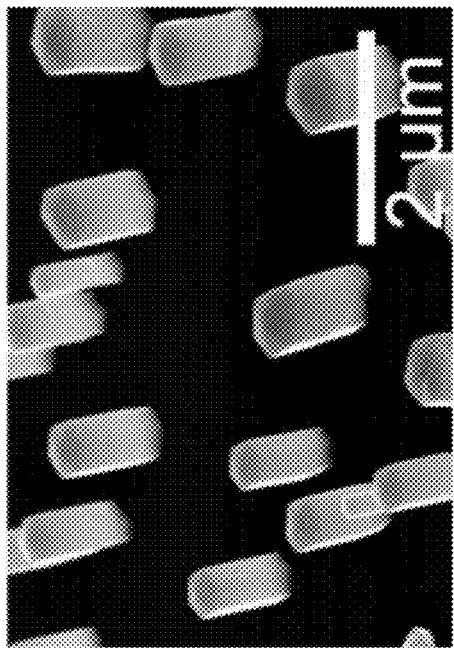
Figure 4C:
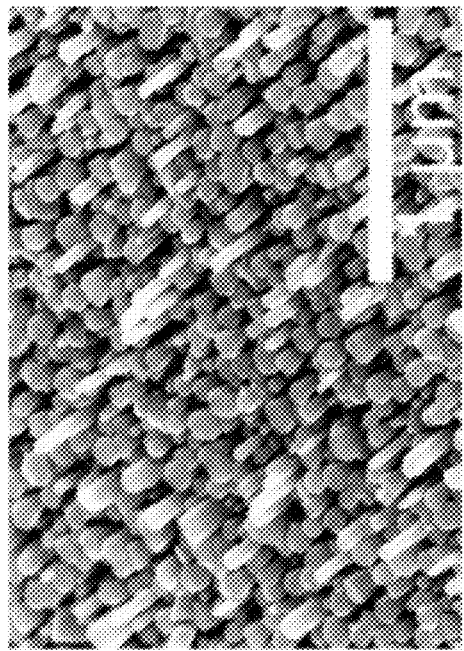
Figure 4D:
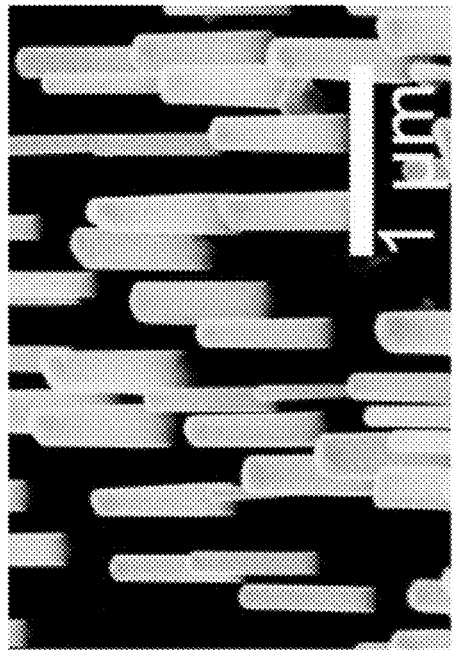

These should be compared with the InN nanowires of FIG. 2B which were grown in the same reactor without the thin In layer with the same substrate temperature of 480° C., In partial pressure of $1.0 \times 10^{-7}$, flow rate of 1.5 sccm, and growth time of approximately 2.5 hours. Referring to FIG. 4D the SEM image of an InN nanowires grown on Si at a slightly higher substrate temperature of approximately 500° C. is shown. These InN nanowires are also non-tapered, with a further reduced density but larger diameter. For comparison, conventional InN nanowires grown at such temperatures generally exhibit an inverse pyramid-like shape, with the wire top 2-5 times larger than the root; see for example T. Stoica et al in "MBE Growth Optimization of InN Nanowires" (J. Crystal Growth, Vol. 290, p. 241, 2006).

To understand the role of the pre-deposited In layer on the achievement of non-tapered InN nanowires, it is important to note that the formation of InN nanowires may involve a self-catalytic process, as suggested by recent experiments including for example T. Kang et al (Appl. Phys. Lett, Vol. 89, p. 023103, 2006) and M. He et al (J. Vac. Sci. Technol. B, Vol. 25, p. 940, 2007). However, unlike the prior processes within the embodiments of the invention the InN nanowires nucleate and grow from nanoscale In droplets created on the growing surface. During prior art spontaneous growth of InN nanowires, there are no well-defined nucleation centers, and, consequently, the continuously random nucleation of nanowires leads to InN nanowires on Si with a large variation in height and diameter. Also due to the large diffusion rate of In adatom and their preferential incorporation near the wire top, conventional InN nanowires generally exhibit severely tapered morphology, see for example T. Stoica et al in "MBE Growth Optimization of InN Nanowires" (J. Crystal Growth, Vol. 290, p. 241, 2006). On the other hand, according to the invention, the in situ deposited In layer prior to growth initiation forms nanoscale liquid droplets on the Si surface at elevated temperatures, which can therefore act as seeds to promote the nucleation of InN nanowires. As a result, the nanowire density is largely pre-determined, and the size uniformity is significantly enhanced.

Nanowire growth is controlled by the quasi-equilibrium among the various dynamic processes, including adatom diffusion, desorption, and incorporation, as well as adatom impinging on the wire top. With well-defined wire densities, these dynamic processes can be tailored by optimizing the growth conditions, including In and nitrogen flux and RF plasma power, thereby leading to perfectly straight InN nanowires on Si, as illustrated in FIGS. 4A and 4B, that were not possible before according to the prior art. To achieve a better control over the properties of InN nanowires on Si and also further elucidate the role of the In seeding layer, InN nanowires on Si were grown using predeposited In layers with different thicknesses. It has been consistently observed that, with the increase of the In layer thickness from 0.5 nm to 1.6 nm, that the density of InN nanowires increases from approximately 4 $\mu m^{-2}$ to approximately 15 $\mu m^{-2}$, or higher. This can be explained by the presence of a larger density of nucleation centers related to a thicker In layer. In the prior art growth of spontaneously formed nanowires, control over the wire density is largely achieved by varying the growth temperature, which often makes it extremely difficult to optimize other properties of the wires, as they are directly related to the growth temperature as well. The use of an in situ deposited In seeding layer can therefore provide an additional dimension to effectively control the growth and properties of InN nanowires.

Figure 4E:
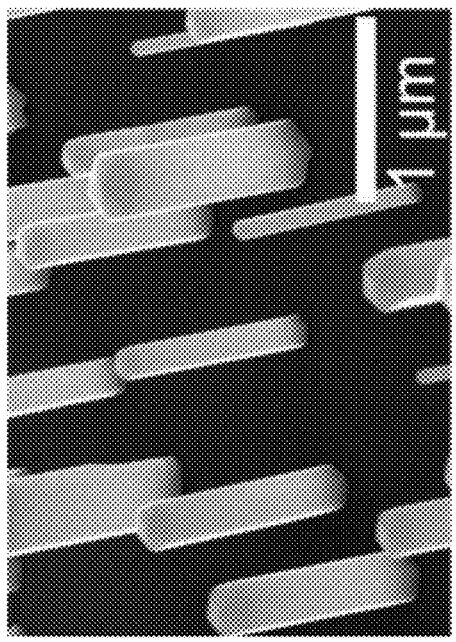
FIGS. 4E through 4G show SEM micrographs of InN nanowires grown according to an embodiment of the invention at varying In fluxes for constant growth temperature.
Figure 4F:
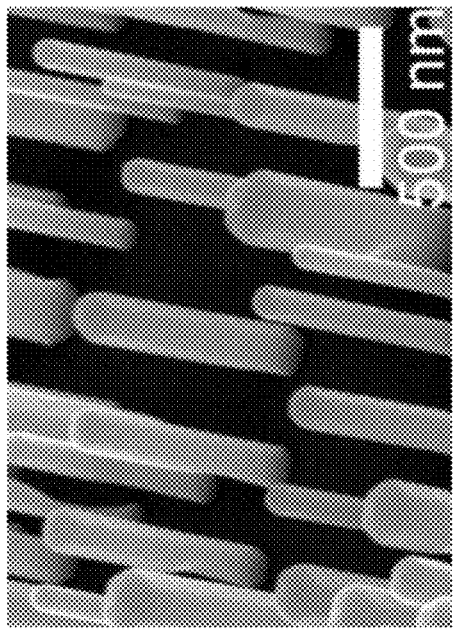
Figure 4H:
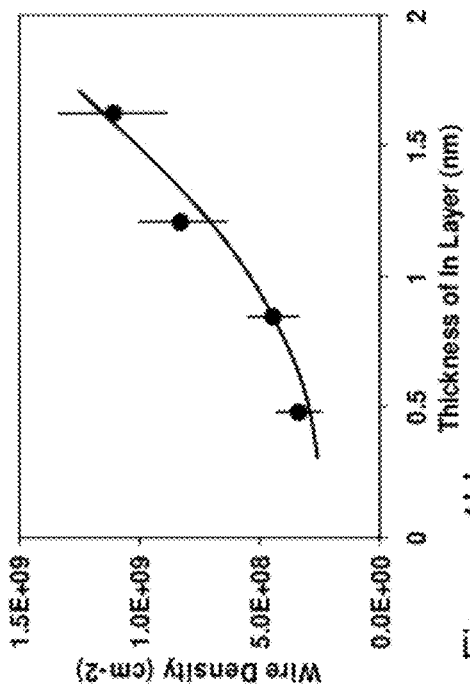
FIG. 4H shows the variation in InN nanowire density versus In seeding layer thickness according to an embodiment of the invention.
Figure 4G:
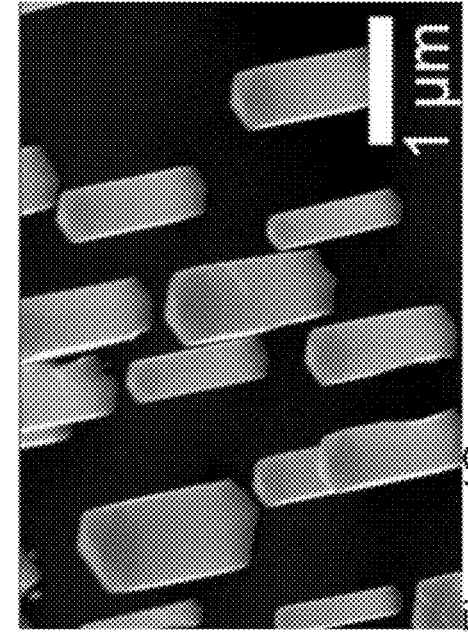

Next the effect of In flux on the structural properties of InN Nanowires is shown with reference to FIGS. 4E through 4G. The growth temperature was fixed at approximately 470° C., which is sufficiently high to yield well-separated nanowires. FIGS. 4E to 4G being SEM images taken at tilt angles of 45° for samples grown at In beam equivalent pressures (BEPs) of approximately $2\times10^{-8}$, $7\times10^{-8}$, and $1.8\times10^{-7}$ Torr, respectively, which are well within the nitrogen-rich regime. It is observed that the wire diameters increase from approximately 100 nm to approximately 250 nm, or larger, with the increase in the In deposition rate, which is attributed to the enhanced In adatom migration and the subsequent incorporation on the wire lateral surfaces. Further increase in the In flux may eventually lead to the formation of compact InN layers. The wire densities are also reduced with the increase in the In deposition rate potentially due to the enhanced coalescence of smaller wires during the initial stage of wire growth when the nitrogen/In flux ratio is reduced. According to embodiments of the invention, with the variation in the In deposition rate, InN nanowires also exhibit completely non-tapered morphology, which is in direct contrast to conventionally grown InN nanowires wherein variations in the In flux commonly induce a significant change in the ratio between the top and the bottom wire diameters.

Referring to FIG. 4H there is shown the variation in InN nanowire density versus In seeding layer thickness according to an embodiment of the invention. With the use of a thicker In seeding layer, higher densities of In islands can be formed on the substrate. Consequently, the presence of more In nucleation centers may potentially lead to the formation of a larger density of nanowires. Shown in FIG. 4H, with the increase in the In layer thickness from approximately 0.5 nm to approximately 1.6 nm, the wire density is increased from approximately $4\times10^8$ to approximately $1.3\times10^9$ cm$^{-2}$, accordingly. The growth temperature and In flux were kept at 470° C. and $7\times10^{-8}$ Ton, respectively. However, it is also important to note that the nucleation, formation, and evolution of InN nanowires are extremely complicated processes and may involve various dynamic processes that can be strongly influenced by other growth parameters as well. As a result, the presence of In islands and the subsequently grown InN nanowires may exhibit a highly nonlinear relationship, which can potentially be utilized to yield electronically pure InN nanowires with well controlled properties.

Figure 4L:
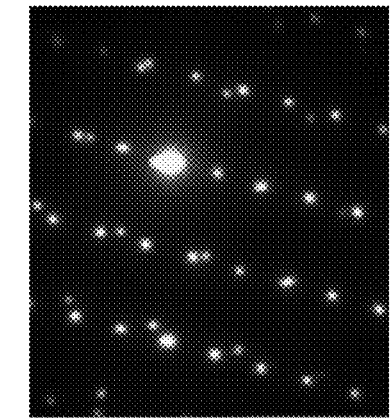
FIG. 4L shows a selected area electron diffraction measured for the InN nanowire and Si substrate interface of the nanowires within FIGS. 4A through 4K according to embodiments of the invention.
Figure 4I:
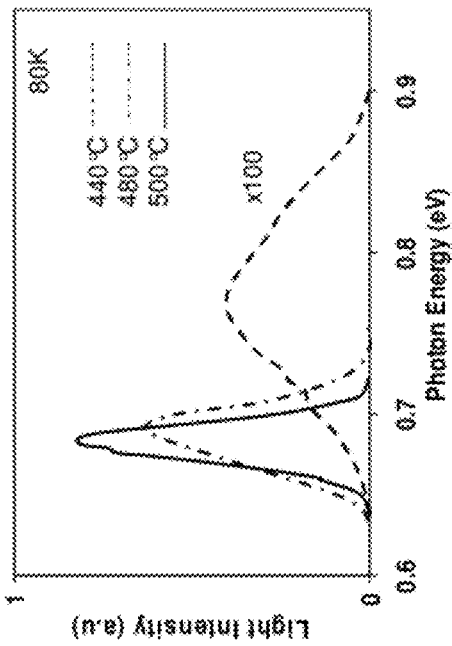
FIG. 4I shows the photoluminescence emission spectra for samples at varying growth temperature according to an embodiment of the invention.

Referring to FIG. 4I there is shown photoluminescence emission spectra for samples at varying growth temperature according to an embodiment of the invention. FIG. 4H shows the PL emission spectra of samples grown at approximately 440° C., approximately 480° C., and approximately 500° C. at 80K under an excitation power of approximately 1.5 mW. The sample grown at approximately 440° C. exhibits a very low PL efficiency and a large spectral Linewidth (full width at half maximum (FWHM) of approximately 100 meV), with a PL peak position at approximately 0.75 eV. On the other hand, the samples grown at approximately 480° C. and approximately 500° C., respectively, display considerably higher PL efficiencies, significantly narrower spectral linewidths (FWHM of approximately 20 meV), and much smaller PL peak energies (approximately 0.67 eV). We have further measured a very narrow spectral linewidth of approximately 14 meV for samples grown at approximately 500° C. at 5K.

It is also seen, see inventors paper with Y-L. Chang et al entitled "Optimization of the Structural and Optical Quality of InN Nanowires on Si(111) by Molecular Beam Epitaxy" (J. Vac. Sci. Tech. B 28(3) May/June 2010, Paper C3B7), that the samples grown at a higher temperature, e.g. approximately 500° C., exhibits substantially higher, approximately a factor of 100, PL intensity, compared to that grown at lower temperatures suggesting that a higher crystal quality can be achieved at relatively high growth temperatures due to the increased adatom mobility and the resulting optimal bonding.

The structural properties of InN nanowires on Si were also studied by high resolution transmission electron microscopy (TEM). Shown in FIG. 4J is the TEM image of a non-tapered InN nanowire transferred on a carbon membrane on a TEM grid. It is evident that the nanowire is structurally uniform, with a constant diameter of approximately 71 nm along the wire of approximately 0.95 μm. By varying growth time, non-tapered InN nanowires with lengths in the range of 0.1 μm to 5 μm have been achieved. The high resolution TEM images and selected area electron diffraction patterns reveal that the wires exhibit a wurtzite crystal structure and have an interlunar spacing of 0.308 nm. Detailed studies confirm that the entire wire is of single crystal and relatively free of dislocations. It is also noted that no excess In droplets at the ends of the nanowires occur as evident from energy dispersive spectroscopy (EDS) measurements. This is due to the possible nitridation of the In droplets during and/or after the nanowire growth.

Figure 4K:
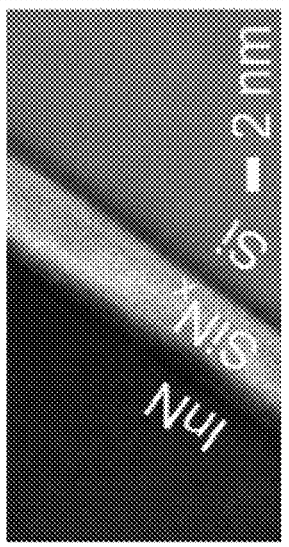
FIG. 4K shows a cross-sectional TEM image of InN/Si interface region for an InN nanowire grown on a silicon substrate according to an embodiment of the invention.
Figure 4J:
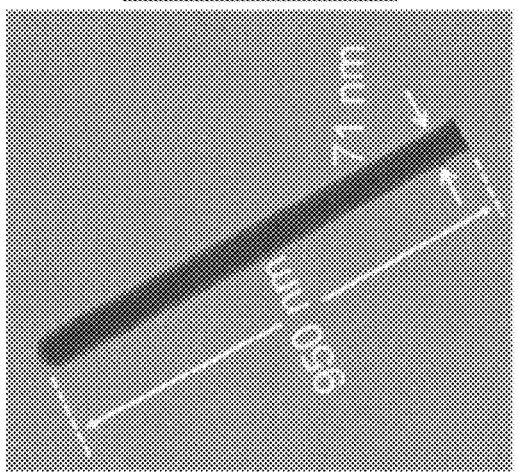
FIG. 4J shows an TEM micrograph of single InN nanowire grown according to an embodiment of the invention.

During the growth of InN on Si, an amorphous SiN$_x$ layer also develops at the misfit interface, which can be clearly identified from the cross-sectional TEM image of InN/Si interface region, shown in FIG. 4K. The presence of such an amorphous layer can severely limit the formation and properties of InN on Si. According to the prior art for thick (>2 nm-3 nm) SiNx amorphous layers, vertically oriented InN nanowires cannot be grown, see J. Grandal et al "Accommodation Mechanism of InN Nanocolumns Grown on Si (111) Substrates by Molecular Beam Epitaxy" (Appl. Phys. Lett., Vol. 91, 021902, 2007). With the use of an In seeding layer, however, single crystalline InN nanowires, that are relatively free of dislocations and stacking faults, can be achieved on Si even with the presence of a relatively thick (>4 nm-5 nm) SiN$_x$ layer, illustrated in FIG. 4K. The selected area electron diffraction measured for the InN nanowire and Si substrate interface region is shown in FIG. 4L, which consists of diffraction patterns for both the InN nanowire and the Si substrate. The perfect epitaxial alignment between Si(111) and InN(0001) is attributed to the pre-deposited In droplets, which act as seeds for the nucleation and growth of InN nanowires.

Referring to FIG. 5 the photoluminescence (PL) spectra 500 of InN nanowires grown without a foreign element catalyst were measured at 5K and 300K under excitation powers of 5 μW and 200 μW, respectively being shown as first curve 510 and second curve 520 respectively. The PL spectra are predominantly characterized by a single peak, and emission at higher energies is not observed. The measured spectral linewidths of 14 and 40 meV are significantly smaller than the commonly reported values of 60-120 meV for InN nanowire ensembles. The significantly reduced inhomogeneous broadening is attributed to the minimized, or completely eliminated, size variation along the wire axial direction and amongst the wires.

The PL spectra of conventional InN nanowires generally exhibit high energy tails (that can be described by approximately $\exp(-E_{ph}/E_0)$ where $E_{ph}$ is the photon energy and $E_0$ is the specific energy corresponding to both the thermal distribution of carriers as well as the nanowire inhomogenity. The values of $E_0$ are typically smaller for nanowires with better quality. As evident from first curve 510 in FIG. 5 there is no high energy tail in the PL spectra at 5K, suggesting the high quality of non-tapered InN nanowires. Additionally, the high energy tail shown in the 300K PL spectrum, second curve 520 in FIG. 5, is characterized by a specific energy of $E_0 \approx 30$ meV, which corresponds well to the thermal energy kT, further confirming the extreme homogeneity of the non-tapered nanowires grown according to embodiments of the invention. To evaluate the nonradiative recombination processes in InN nanowires the thermal quenching behavior of the PL emission was measured and is shown as quenching curve 550 in FIG. 5B under an excitation power of approximately 1.5 mW. The intensity decreases exponentially increasing temperature, with an activation energy of $E_a \approx 6.4$ meV over the temperature range of 5-300K. One of the major non-radiative recombination processes in InN is Auger recombination where recent studies suggested that Auger recombination in InN is a phonon assisted process, which is weakly dependent on temperature, with activation energy in the range of 4-9 meV, see D. Jang et al "Auger recombination in InN thin films" (Appl. Phys. Lett., Vol. 92, 042101, 2008). Therefore, the thermal quenching of PL emission can be well explained by non-radiative Auger recombination in InN nanowires.

Figure 6:
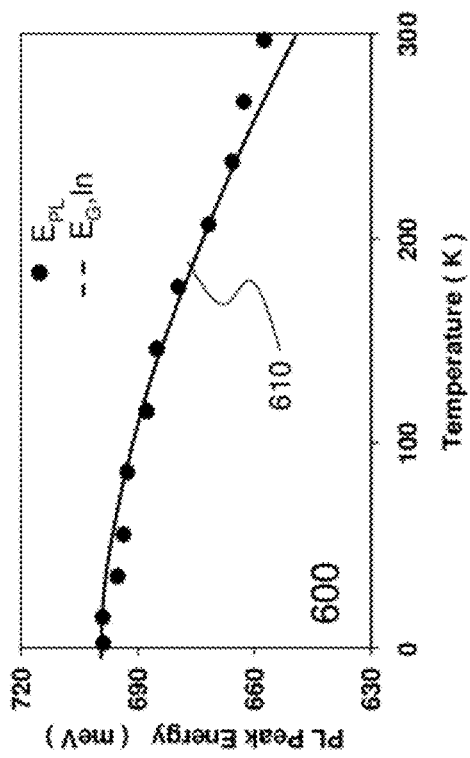
FIG. 6 depicts the variation of photoluminescence peak wavelength versus temperature for InN nanowires grown according to an embodiment of the invention.

One of the fundamental properties of InN, the direct band gap, is still a subject under debate. To date, the temperature dependence of the band gap has not been reliably obtained from InN nanowires, due to the large inhomogeneous broadening and very poor structural and optical quality. Shown in FIG. 6 is a graph 600 of the measured PL peak position of non-tapered InN nanowires grown according to an embodiment of the invention as a function of temperature under an excitation power of 1.5 mW. Solid line 610 plots the variation of the band gap of InN with temperature, calculated using the Varshni's equation $E_g(T) = E_h(0) - \gamma T^2/(T+\beta)$, where $E_g(0) = 0.70$ eV, $\gamma = 0.41$ meVK$^{-1}$, and $\beta = 454$K, see J. Wu et al "Superior Radiation Resistance of $In_{1-x}Ga_xN$ Alloys: a Full-Solar-Spectrum Photovoltaic Materials System" (J. Appl. Phys., Vol. 94, p. 6477, 2003). The agreement is excellent, which further confirms the extremely high quality and homogeneity of the non-tapered InN nanowires grown using an In seeding layer deposited during the InN nanowire growth process.

Referring to FIG. 7 there is shown an embodiment of the invention for providing InN nanowires at predetermined locations upon a substrate 710. In first step 700A the substrate 710 has patterned a buffer material 720 that has been patterned with apertures where it is intended for InN nanowires to be formed. The buffer material should be capable of withstanding in situ oxide desorption at elevated temperatures (approximately 770° C.) as described supra in respect of FIG. 3. Next at step 700B the substrate 710 and buffer material 720 are shown at an early stage within the growth process wherein the organometallic precursor trimethylindium, TMIn, is introduced without nitrogen forming an initial thin layer. As the thickness increases the In nucleates and forms liquid droplets 735 as shown in step 700C. The process continues as shown in step 700D, as presented supra in FIG. 3, with the introduction of the second precursor, ammonia, such that InN growth occurs and the InN nanowires 740 are formed where the In droplet 735 existed which as the thickness increases. The growth process is then terminated after the predetermined period of time such that the InN nanowires 740 are the required height. Subsequently the wafer is removed from the growth reactor and the buffer layer 720 is removed leaving free standing InN nanowires 740 where the openings within the buffer layer 720 existed.

Whilst the embodiments presented supra have been presented in respect of InN nanowires it would be evident to one skilled in the art that the principle applies to other group IIIA-nitrides where the group IIIA material nucleates and forms a liquid droplet upon the substrate during the initial phase of the nanowires growth where the nitrogen has not been admitted into the reaction chamber. These group IIIA elements all form a wurtzite crystalline structure in their nitrides. Accordingly the invention applies to structures formed with GaN deposited onto the substrate as well as the previously described InN deposited onto the substrate. It would also be apparent to one skilled in the art that alternate approaches to patterning the nanowires are feasible without departing from the scope of the invention.

Figure 8:
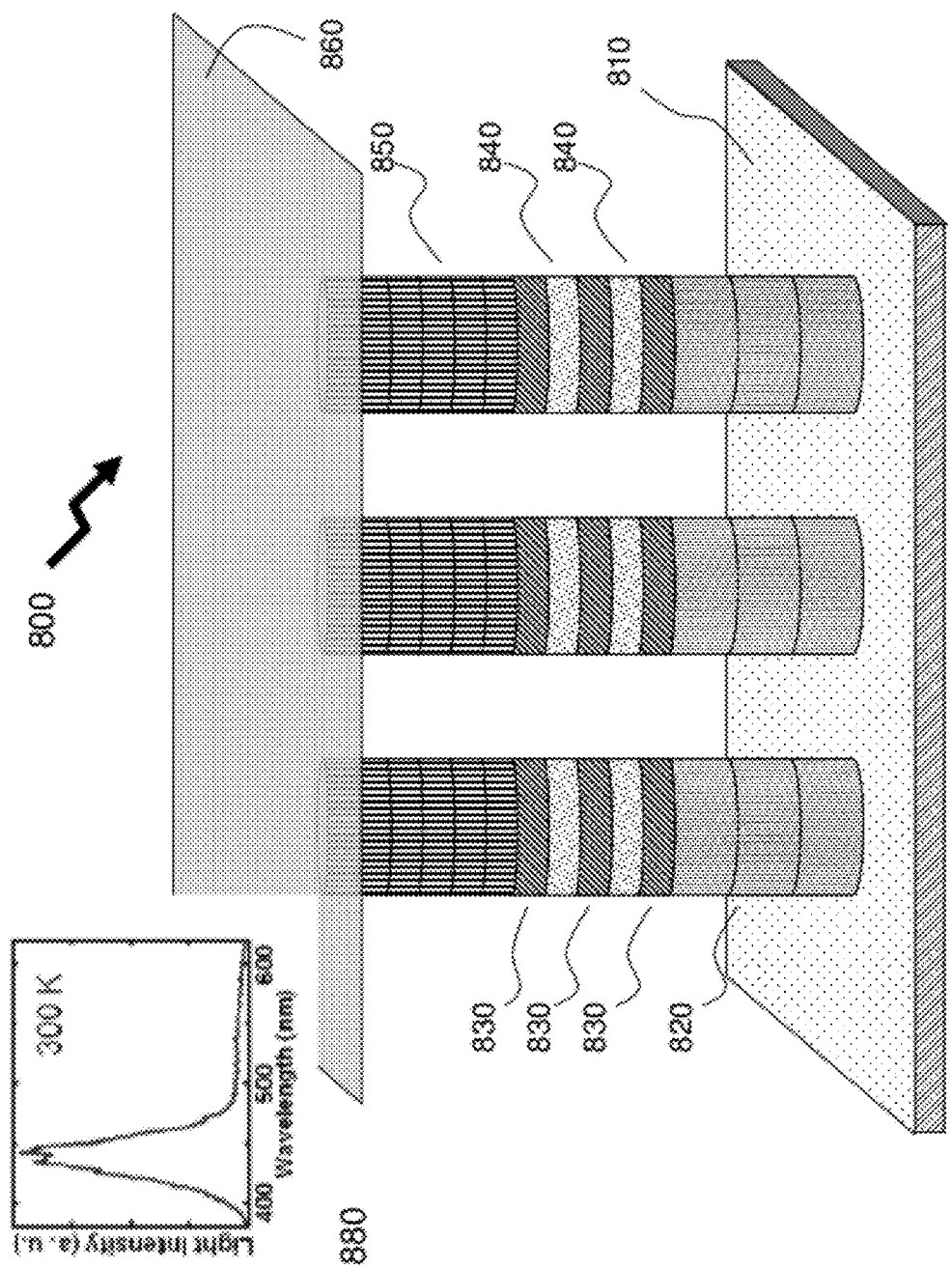
FIG. 8 depicts a nanowire based light source according to an embodiment of the invention.

Now referring to FIG. 8 there is depicted a nanowire light source 800 comprising InGaN/GaN well-in-a-wire nanowires LEDs formed according to embodiments of the invention. The substrate 810 for the nanowire light source 800 is an n-type silicon substrate upon which are grown 0.5 µm GaN nanowires doped with silicon to provide the lower n-type GaN material 820. The device active region consists of three InGaN quantum wells 830 separated by GaN spacers 840. Due to the growth methodology of the nanowires according to an embodiment of the invention as described supra in respect of FIGS. 3 to 7 these nanowires should exhibit negligible dislocations when compared to conventional InGaN/GaN quantum wells grown on silicon or sapphire substrates due to the highly effective stress relaxation. Atop the three InGaN/GaN quantum wells magnesium (Mg) doped GaN is grown to form the p-type GaN 850. The upper electrode for the InGaN/GaN well-in-a-wire nanowires LEDs forming the nanowires light source 800 is formed from indium tin oxide (ITO) 860, this being a transparent conductor. The nanowires light source 800 as fabricated and tested emits at 440 nm at 300K with high efficiency as evident from insert 880 showing the emission spectrum for such a GaN LED with InGaN/GaN quantum wells.

Figure 9:
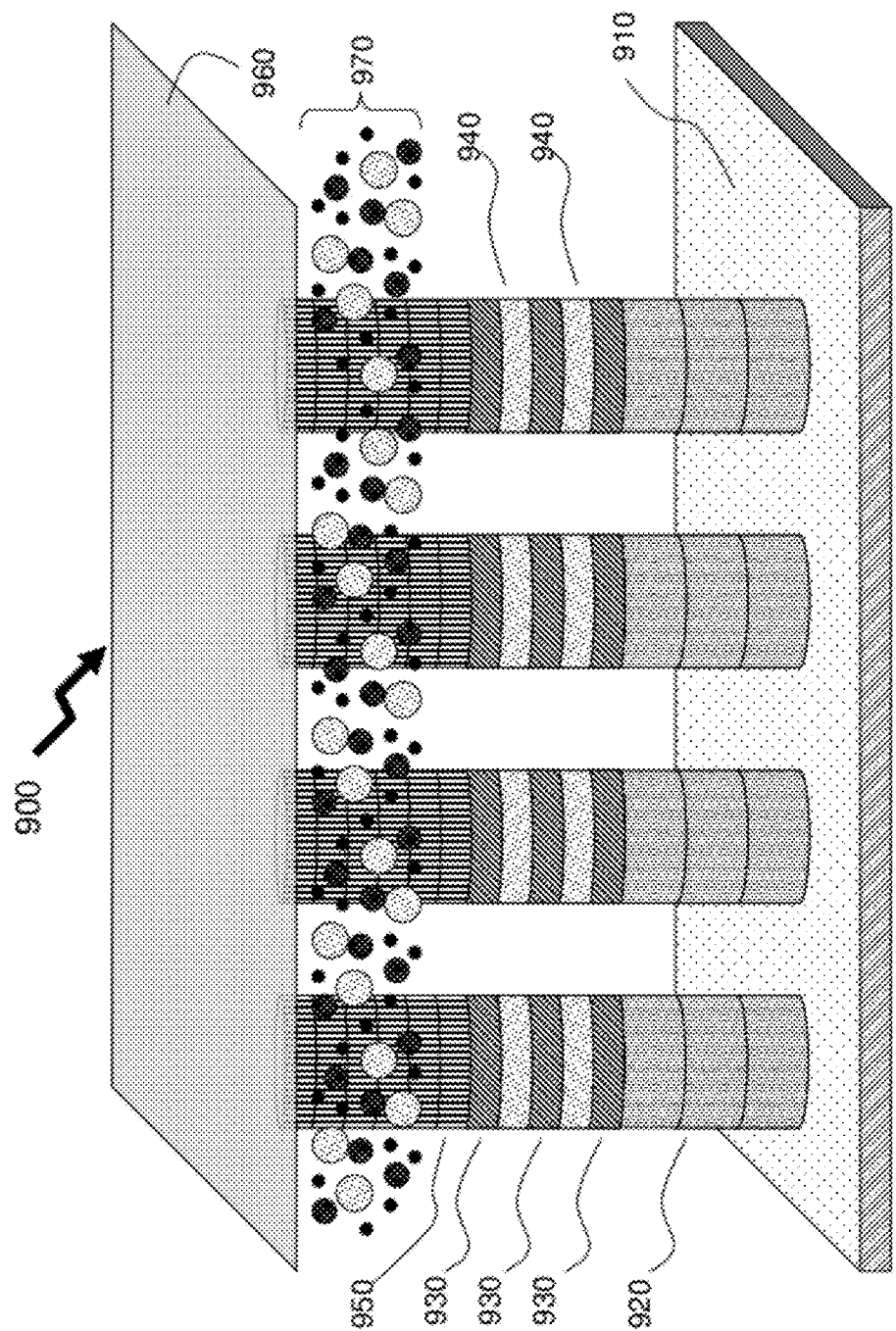
FIG. 9 depicts a nanowire and colloidal quantum dot based light source according to an embodiment of the invention.

FIG. 9 depicts a nanowire dot source 900 according to an embodiment of the invention. In common with nanowire light source 800 the substrate 910 is an n-type silicon substrate upon which are grown 0.5 µm GaN nanowires doped with silicon to provide the lower n-type GaN material 920. The device active region consists of three InGaN quantum wells 930 separated by GaN spacers 940. Atop the three InGaN/GaN quantum wells magnesium (Mg) doped GaN is grown to form the p-type GaN 850. Due to the growth methodology of the nanowires according to an embodiment of the invention as described supra in respect of FIGS. 3 to 7 these nanowires should exhibit negligible dislocations when compared to conventional InGaN/GaN quantum wells grown on silicon or sapphire substrates due to the highly effective stress relaxation.

Next colloidal quantum dots 970 have been spin-coated onto the surface after a planarization process to infill around the nanowires. The upper surfaces of the nanowires are then exposed using a selective etching process followed by the deposition of the ITO upper contact 960. As the colloidal quantum dots 970 largely reside above the InGaN/GaN quantum well regions their presence does not affect significantly the current flow, contact resistance or recombination process within the InGaN/GaN quantum well heterostructures. A portion of the emitted photons from the InGaN/GaN nanowires will be absorbed by the colloidal quantum dots 970 and "down converted" to photons with colors determined by the size and composition of the colloidal quantum dots 970.

For example the colloidal quantum dots may be CdS, CdSe, and CdTe to cover the blue/green/red portions of the visible spectrum. Some overlap of emission ranges occurs for example by size tuning the quantum dots, for example large CdS dots emit close to that of small CdSe dots. As taught by R. Cooney et al entitled "Gain Control in Semiconductor Quantum Dots via State-Resolved Optical Pumping" (Phys. Rev. Lett., Vol. 102, p. 127404, 2009) at quantum dot diameters below 2.5 nm no optical gain had been demonstrated within the prior art thereby removing some of the expected value of confinement based tunability. However, R. Cooney et al demonstrated that optical gain in any quantum dot could be achieved if the quantum dots are pumped using state resolved optical pumping. Such state resolved optical pumping implying that potentially multiple InGaN/GaN quantum wire heterostructures may be required and/or the distribution of the colloidal quantum dots be controlled to ensure that dots requiring state resolved optical pumping have sources, be it the InGaN/GaN quantum wire heterostructures or other colloidal quantum dots.

It would be apparent to one skilled in the art that other energy transfer processes may occur, including Forster resonant energy transfer and Dexter electron transfer processes, and at small quantum dot—nanowire separations direct tunnel injection of carriers will occur, increasing efficiency.

Figure 10:
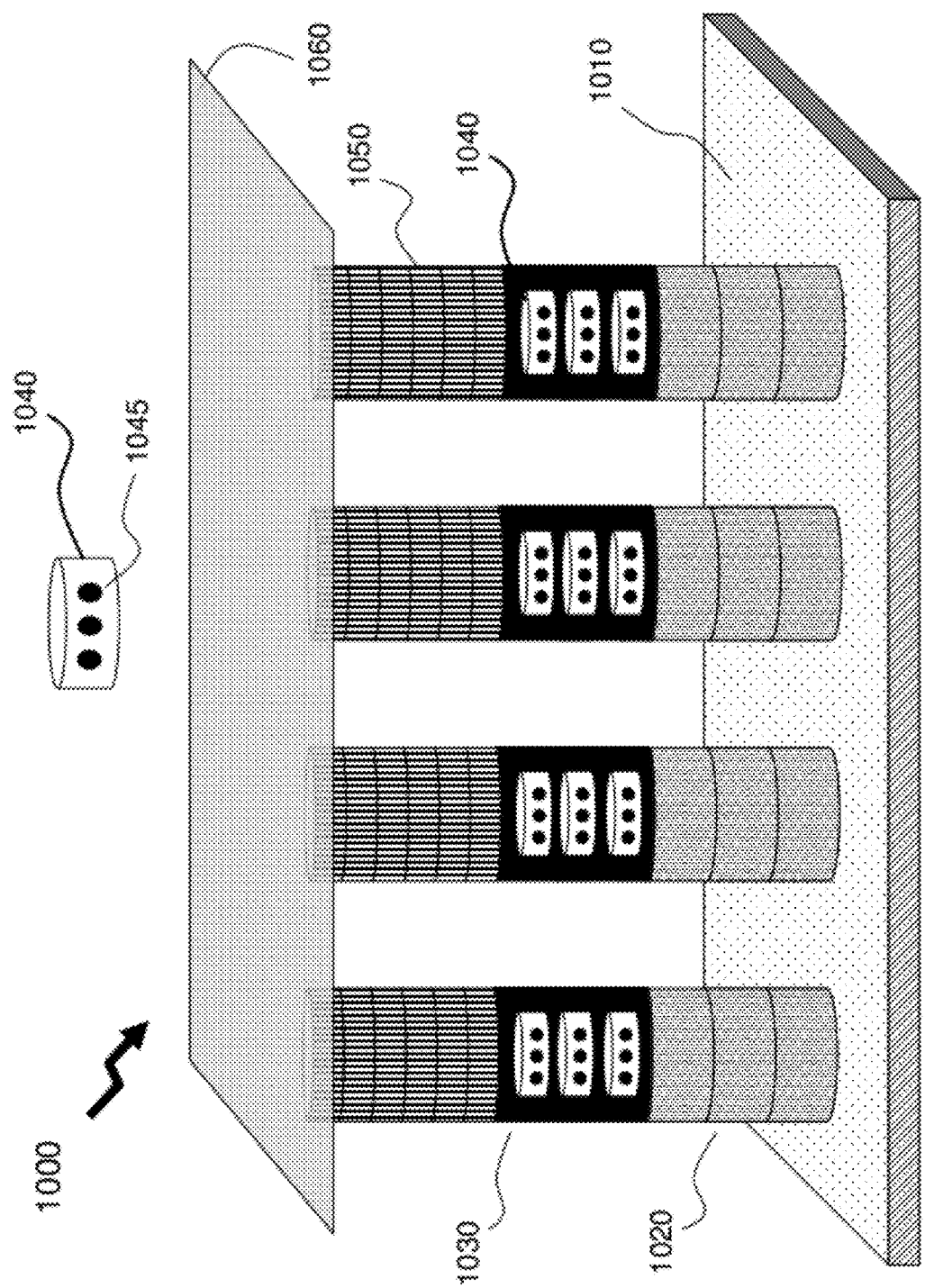
FIG. 10 depicts a nanowires light source employing nanowires featuring dot-within-a-dot-in-a-nanowire features for efficient optical sources according to an embodiment of the invention.

With the ability to form very high quality and uniform nanowires which are relatively defect free, as discussed supra in respect of FIGS. 3 through 7, it is feasible to consider growing so called dot-within-a-dot-in-a-nanowire heterostructures, employing quantum dots formed within the nanowires, for efficient photon generation. Such a dot-within-a-dot-in-a-nanowire light source 1000 is shown in FIG. 10 comprising a substrate 1010, for example n-type <111> silicon, upon which a GaN buffer 1020 is grown, followed by three vertically aligned large quantum dots 1040 within GaN barrier 1030, and a GaN capping layer 1050. An ITO electrode (with the incorporation of a thin metal layer in some cases) 1060 is formed on top of the GaN capping layer 1050 to provide the top electrode to the dot-within-a-dot-in-a-nanowire light source 1000. However, due to the very high quality, relatively defect free, and uniform growth provided by the invention within the quantum well and quantum dots localized In rich nanoclusters can form within each quantum dot as it is grown, thereby forming small quantum dots 1045 within each of the large quantum dots 1040. Such a dot-within-a-dot-in-a-nanowire has not been reported in the prior art and accordingly only feasible at this time using growth according to embodiments of the invention.

Such a dot-within-a-dot-in-a-nanowire heterostructure is shown in first SEM micrograph 1110. The InGaN/GaN dot-in-a-wire heterostructures consist of approximately 0.5 µm GaN buffer, three vertically aligned quantum dots separated by approximately 5 nm GaN barrier layers, and an approximately 0.3 µm GaN capping layer. The nanowire heterostructures were grown on silicon (<111>) substrates using a Veeco Gen II MBE system equipped with a radio frequency (RF) plasma source. According to this embodiment a thin layer of gallium is initially deposited forming nanoscale liquid droplets on the surface of the silicon wafer that form the nucleation sites for the growth of the GaN upon introduction of the ammonia precursor along with the trimethylgallium. Throughout the growth, the Ga flux and nitrogen flow rate were kept at approximately $5\times10^{-8}$ Torr and 1 sccm, respectively. The substrate temperature for GaN nanowires was approximately 800° C. that was lowered to approximately 550° C. during the growth of InGaN quantum dots. InGaN/GaN dot-within-a-dot-in-a-wire samples with different emission wavelengths were grown by varying the In/Ga flux ratios.

Figure 11:
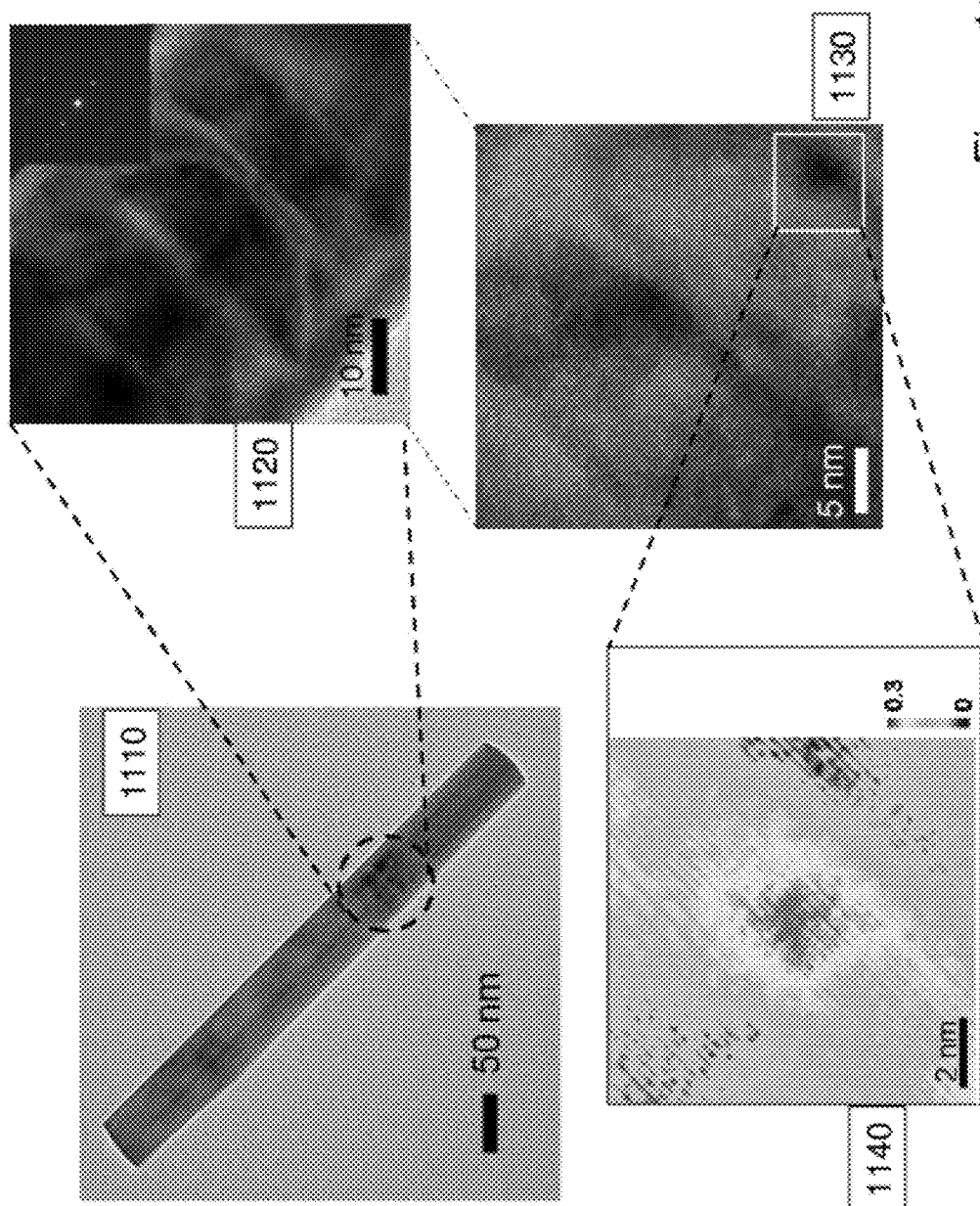
FIG. 11 depicts micrographs of a fabricated dot-within-a-dot-in-a-nanowire structure for a nanowires light source according to an embodiment of the invention.

It can be seen in first SEM micrograph 1110 that the nanowire as grown are vertically aligned and exhibit a diameter of approximately 50 nm. The nanowire densities can be varied from approximately $1\times10^9$ to $1\times10^{10}$ cm$^{-2}$ by changing the growth temperature and N/Ga flux ratios. It can also be seen in first SEM micrograph 1110 that the vertically aligned InGaN quantum dots can be identified. The InGaN/GaN nanowire is structurally uniform with a length of approximately 0.8 µm. Also shown in FIG. 11 is high resolution TEM image 1120 for the quantum dot active region as highlighted in first SEM micrograph 1110 for the three vertically aligned InGaN quantum dots, which are located at the center of the wire, and have been formed by the strain-induced self-organization. They exhibit a height of approximately 7 nm and a width of approximately 30 nm, which are larger than the commonly reported values for InGaN/GaN quantum dots embedded in planar heterostructures, see K. Tachibana et al (IEEE J. Sel. Top. Quantum., Vol. 6, p. 475, 2000). The InGaN quantum dots and surrounding GaN bather layers are nearly free of dislocations, due to the reduced strain distribution in the nanowire heterostructures grown according to an embodiment of the invention.

The average In compositions in the dots are estimated to be in the range of approximately 15 to 25%, depending on the growth conditions, for green, yellow, and amber/red light emitting structures. It was also noted that a small amount (approximately 6%) of In atoms are incorporated in the GaN barrier layers. Also shown in FIG. 11 is detailed TEM image 1130 which shows the presence of the In-rich nanoclusters, small quantum dots 1045, thereby leading to the unique dot-in-a-dot heterostructures which due to their close spacing may be electronically coupled. These In-rich nanoclusters are formed by phase segregation, and their sizes vary from approximately 2 nm to approximately 5 nm from measurements on dot-within-a-dot-in-a-nanowires grown under varying conditions according to the embodiments of the invention. Also shown in FIG. 11 is an In composition distribution profile 1140, derived from the Vegard's law, for the selected region in detailed TEM image 1130. This shows an In-rich nanocluster with an In composition of approximately 28% and dimensions of approximately 3.5 nm.

Optical properties of InGaN/GaN dot-within-a-dot-in-a-nanowires nanoscale heterostructures were studied using temperature variable photoluminescence spectroscopy.

Figure 12:
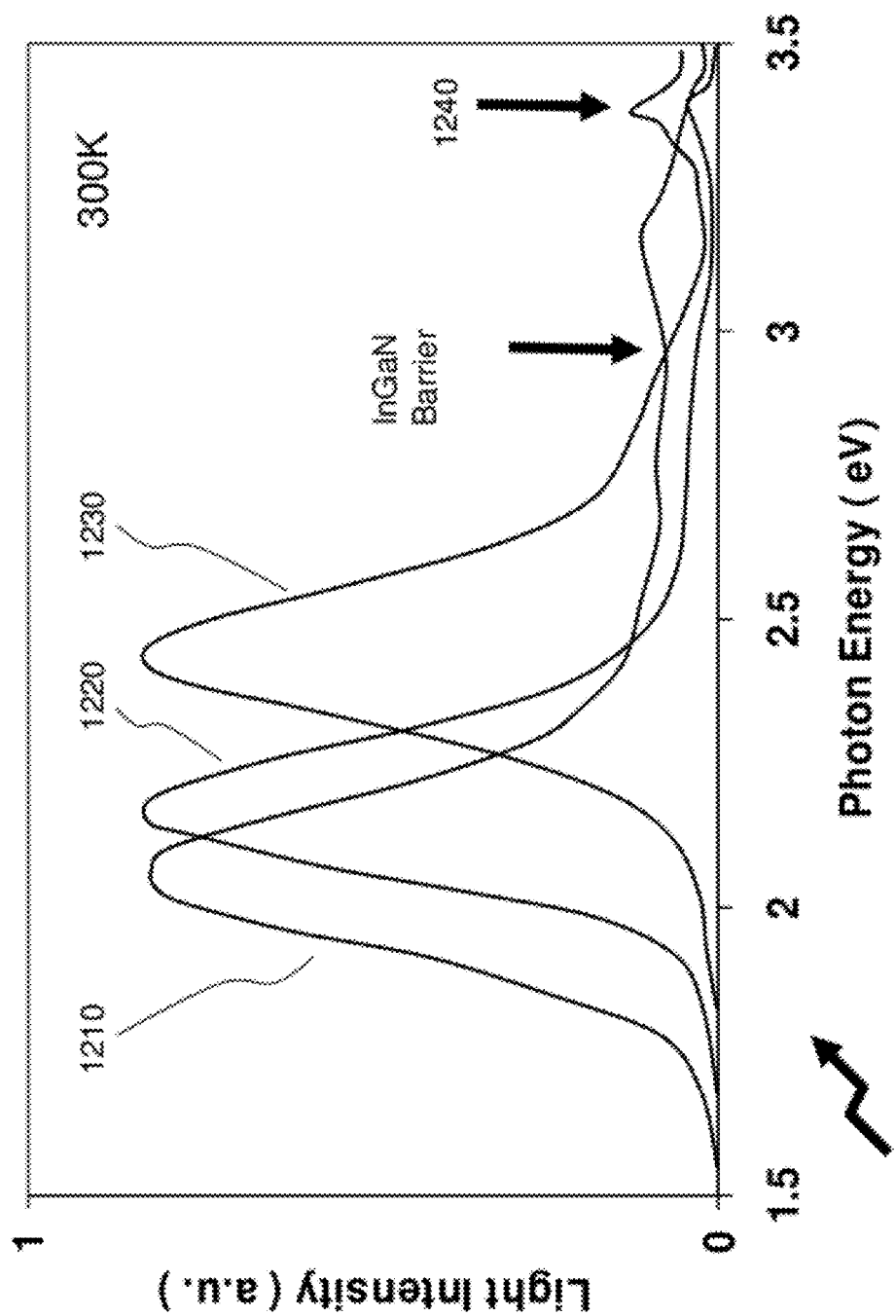
FIG. 12 depicts photoluminescence spectra for optical sources employing dot-within-a-dot-in-a-nanowire heterostructures with varying indium concentration according to embodiments of the invention.

FIG. 12 shows the normalized PL spectra 1200 measured under a pump power of approximately 100 W/cm$^2$ at room temperature for three InGaN/GaN dot-within-a-dot-in-a-nanowire heterostructures grown with different In/Ga flux ratios. The peak energy positions are at approximately 2.5 eV, approximately 2.2 eV, and approximately 2.0 eV, corresponding to green (approximately 495 nm), yellow (approximately 565 nm) and amber/red (approximately 620 nm) emission, respectively. The measured spectral linewidths are in the range of approximately 200 meV to 260 meV. For all three samples, luminescence emission from the GaN nanowires themselves can also be observed as peak 1240 at approximately 3.4 eV (approximately 365 nm) in FIG. 12. The intensity of this emission however is significantly smaller than that of the InGaN quantum dots, in spite of the thick GaN segments surrounding the dot layers. This further confirms the excellent optical quality of InGaN quantum dots. It may also be noted that a weak photoluminescence emission at approximately 3.0 eV (approximately 415 nm) can also be measured, which is likely from the portion of surrounding GaN barrier layers that incorporates the small (approximately 6%) amount of In atoms, due to phase segregation.

Figure 13:
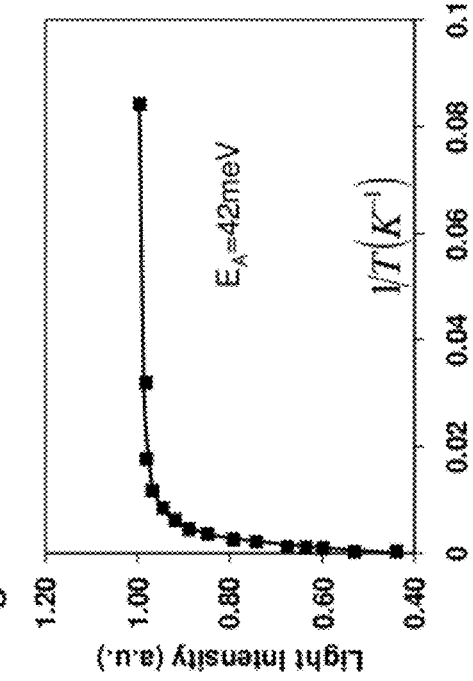
FIG. 13 depicts the variation of the integrated photoluminescence intensity with temperature for the yellow emitting InGaN/GaN dot-within-a-dot-in-a-nanowire heterostructures according to an embodiment of the invention.

The variation of the integrated photoluminescence intensity versus temperature is shown in FIG. 13 for the yellow emitting InGaN/GaN dot-within-a-dot-in-a-nanowire heterostructures ($\lambda_{pk} \approx 2.2$ eV (565 nm) measured under a pump power of approximately 100 W/cm². By modeling the data using an Arrhenius plot, activation energy $E_A \approx 42$ meV was derived based on the slope of the straight line in the high temperature range. The internal quantum efficiency at room temperature can be estimated by comparing the photoluminescence intensities measured at 300K and 10K respectively. Accordingly the InGaN/GaN dot-within-a-dot-in-a-nanowire heterostructures exhibit an internal quantum efficiency of approximately 45%, which is nearly a factor of 5 to 10 times larger than that measured in prior art InGaN ternary nanowires in the same wavelength range, see for example C. C. Hong et al (Optics. Exp., Vol. 17, p. 17227, 2009).

The emission mechanism of the unique InGaN/GaN dot-within-a-dot-in-a-nanowire heterostructures has also been investigated. Charge carriers are first incorporated in the vertically aligned InGaN quantum dots (large quantum dots 1040), which provides strong carrier confinement and therefore greatly reduce any nonradiative recombination associated with the nanowire surface states. The carriers subsequently drift to the localized deep potentials created by In-rich nanoclusters (small quantum dots 1045) and recombine radiatively. Further initial studies indicate that the large inhomogeneous broadening shown in the photoluminescence spectra is directly related to the size and compositional variations of these small quantum dots 1045 (I.e. the In-rich nanoclusters). The superior carrier confinement provided by both the self-organized InGaN quantum dots (large quantum dots 1040) and the In-rich nanoclusters (small quantum dots 1045) in conjunction with the nearly defect-free GaN nanowires grown according to an embodiment of the invention therefore explain the large internal quantum efficiency measured in the green, yellow, and amber/red wavelength ranges that was not previously possible using either InGaN nanowires, planar InGaN/GaN quantum dots, or well heterostructures according to the prior art.

Figure 14:
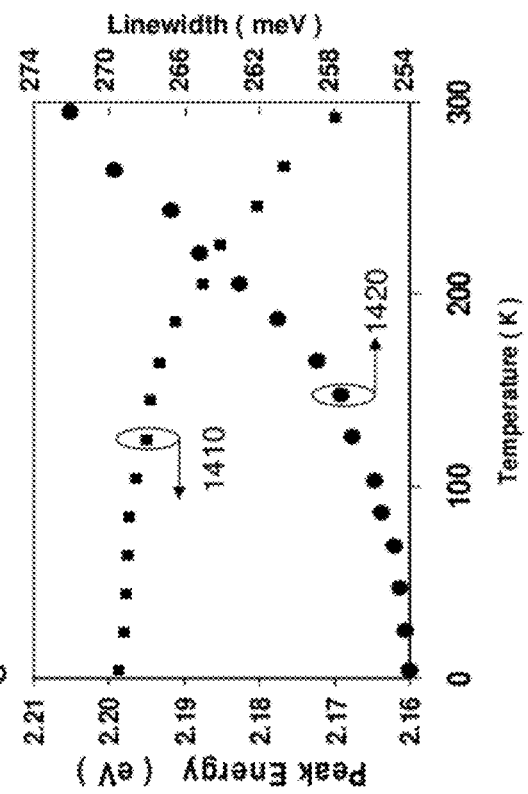
FIG. 14 depicts photoluminescence and spectral linewidth versus temperature for a yellow optical source employing nanowires with dot-within-a-dot-in-a-nanowire features.

Further studies indicate that these small quantum dots 1045 (In-rich nanoclusters) within the large quantum dots 1040 are electronically coupled. Shown in FIG. 14 is the variation of the photoluminescence peak energy 1410 and spectral linewidth 1420 measured for the yellow emitting InGaN/GaN dot-within-a-dot-in-a-nanowire heterostructure. It is seen that the photoluminescence peak energy 1420 decreases monotonically with the increase of temperature from 10K to 300K. The "S" shaped behavior, i.e. the initial increase of the peak energy with the increase of temperature, commonly observed for InGaN/GaN quantum wells and InGaN nanowires, see for example C. C. Hong et al (Optics. Exp., Vol. 17, p. 17227, 2009), due to the presence of localized states in the tail density of states, is absent in the InGaN/GaN dot-within-a-dot-in-a-nanowire heterostructures grown according to an embodiment of the invention. The unique carrier dynamics of emitting InGaN/GaN dot-within-a-dot-in-a-nanowire heterostructure can be well explained, if the small quantum dots 1045 in the large quantum dots 1040 are electronically coupled. Under this condition, they can be modeled as 3-dimensional superlattices with discrete energy levels such that confined carriers will relax into the lower energy states before recombining, since the InGaN/GaN dot-within-a-dot-in-a-nanowire heterostructures are nearly free of dislocations. It is therefore expected that the photoluminescence peak energy follows the typical temperature dependence of the energy bandgap, instead of the anomalous "S" shaped behavior. The equilibrium carrier distribution in a single wire is also evidenced by the variation of the spectral linewidth 1420 with temperature, shown in FIG. 14, which displays a small increase with the increase of temperature, due to phonon scattering.

To date, the realization of InN nanowire solar cells, as well as many other semiconductor devices, has been further limited by the difficulty in achieving p-type doping. In this regard, Mg-doped InN films and the formation of p-type carriers have been investigated both theoretically and experimentally, see for example J. H. Song et al in "Stabilization of Bulk p-Type and Surface n-Type Carriers in Mg-Doped InN {0001} Films" (Phys. Rev. Lett., Vol. 101, p. 186801, 2008). A Fermi level shift toward the valence band was measured in InN:Mg layers, see Kudrawiec et al in "Photoreflectance of InN and InN:Mg Layers—Evidence of a Fermi Level Shift Toward the Valence band upon Mg Doping in InN" (Appl. Phys. Lett., Vol. 93, p. 131917, 2008), and the possibility of p-type doping has also been further suggested by electrolyte capacitance-voltage measurements. In order to compensate the presence of large electron densities of nominally non-doped InN as well as the associated surface electron accumulation, a relatively high concentration of Mg dopant is required, which, however, may lead to the formation Mg-related, donor like defects. Additionally, the growth and characterization of InN:Mg nanowires, to the best knowledge of the inventors, has not been reported. It has been observed that the incorporation of Mg can significantly affect the formation and structural properties of GaN nanowires, see for example F. Furtmayr et al in 'Nucleation and Growth of GaN Nanorods on Si {111} Surfaces by Plasma Assisted Molecular Beam Epitaxy—The Influence of Si and Mg Doping" (J. Appl. Phys. Lett., Vol 104, p 034309). The presence of Mg can greatly reduce the nanowire nucleation time and enhance the growth rate on the nonpolar surfaces, thereby leading to wires with increased diameters and reduced lengths. Additionally deteriorated crystal structures have been reported in the prior art at relatively high Mg concentrations. It is therefore of tremendous importance to develop nearly intrinsic InN nanowires as well as InN nanowire p-n junctions, in order to exploit the full potential of InN for third generation photovoltaics.

Electronically pure InN nanowires were grown on Si(111) substrates by plasma-assisted MBE under nitrogen-rich conditions according to an embodiment of the invention using conditions as described supra in respect of FIGS. 4A through 4D. Important for practical device applications such as optical sources, solar cells, etc is a precise control of the carrier concentration and conductivity of InN nanowires. The residual electron density of InN can be derived from a Hall-effect measurement or by analyzing the photoluminescence spectral linewidth measured at low temperatures. For conventional n-type degenerate InN, the measured photoluminescence linewidths are generally in the range of 50 to 100 meV, which correspond to residual electron densities of approximately $10^{18}$ cm$^{-3}$, or higher. Photoluminescence spectra for non-tapered InN nanowires measured under various laser powers at 5 K resulting in an extremely narrow spectral linewidth of 8 meV under low excitation conditions. Detailed analysis revealed that the electron density in the undoped InN nanowires was approximately $2 \times 10^{15}$ cm$^{-3}$, or less, which is nearly a factor of 500 times smaller than the commonly reported values, see for example T. Stoica in "Photoluminescence and Intrinsic Properties of MBE-grown InN Nanowires" (Nano. Lett., Vol. 6, p. 1541, 2006), suggesting for the first time that nearly intrinsic InN has been achieved, see also Y-L. Chang et al in "Photoluminescence Properties of Nearly Intrinsic Single InN Nanowire" (Adv. Funct. Mater, 2010, Vol. 20, p. 4146, 2010).

Figure 15B:
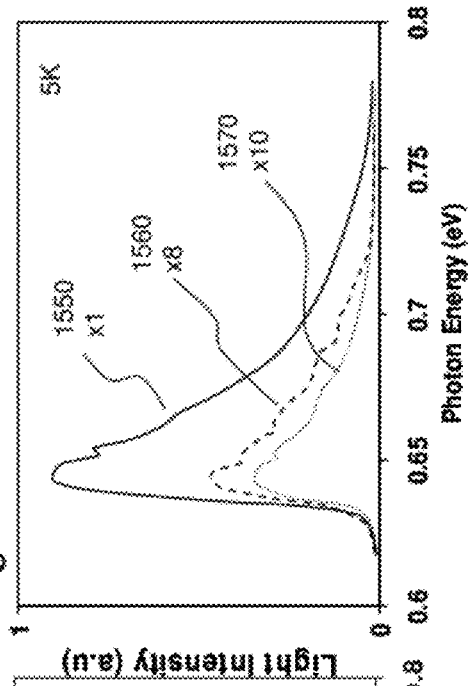
FIGS. 15A and 15B depict photoluminescence spectra for Si and Mg doped InN nanowires according to embodiments of the invention.
Figure 15A:
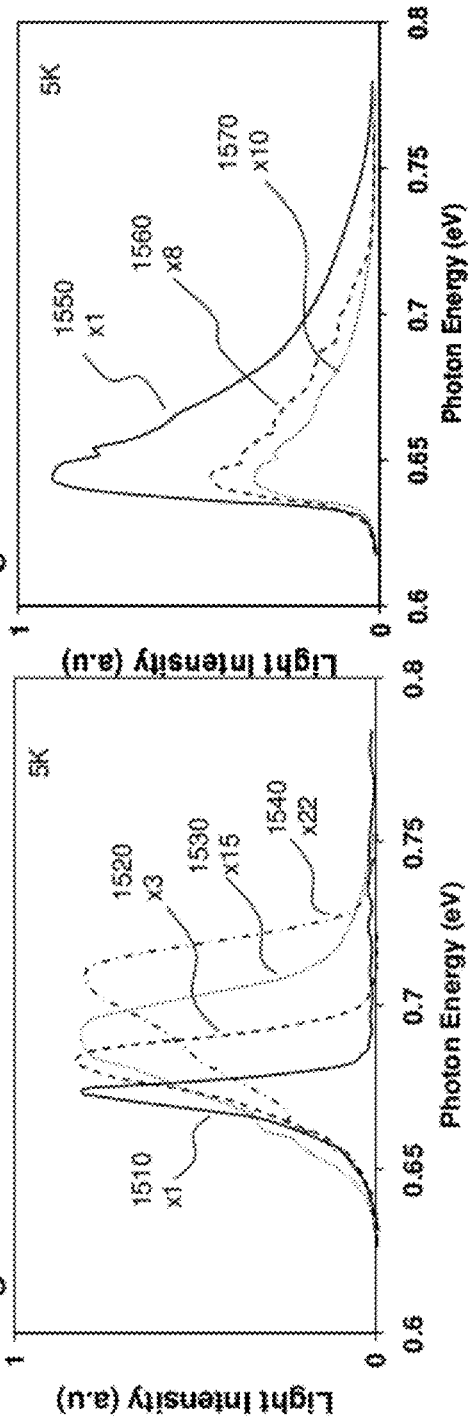

With the achievement of nearly intrinsic InN nanowires, the inventors have investigated the growth and optical properties of Si- and Mg-doped InN nanowires. These nanowires are grown by introducing the respective dopants during nanowire growth without any modifications to the previously described growth conditions. Due to the significantly enhanced In adatom surface migration and the preferred growth along the nanowire length direction, the resulting doping level is generally smaller, compared to that of planar heterostructures. The inventors believe that the local dopant fluctuation in the wires may also be negligible, due to the relatively large (>100 nm) wire diameters. For the Si doping concentrations considered (<approximately $1\times10^{18}$ cm$^{-3}$), no morphological changes to the InN nanowires were observed. However, the incorporation of Si-dopant can significantly modify the optical properties of InN nanowires. Referring to FIG. 15A there are shown the photoluminescence spectra of InN:Si nanowires measured at 5 K for various Si doping levels.

As shown first curve 1510 represents the spectra for Si doping at $1\times10^{18}$ cm$^{-3}$ magnified 22 times, second curve 1520 for $2\times10^{17}$ cm$^{-3}$ magnified 15 times, third curve 1530 for $5\times10^{16}$ cm$^{-3}$ magnified 3 times, and 1540 for non-doped nanowires without scaling, all measurements being made at 5K. It is seen that, with increasing Si-doping concentration, the InN nanowires exhibit a considerable blue shift in the photoluminescence peak energy, a drastic increase in the spectral linewidth, and a significant decrease in the luminescence efficiency Now considering Mg doping then it was determined from photoluminescence measurements of InN:Mg films, it was determined that the Mg acceptor activation energy was about 61 meV, see X. Q. Wang et al in "Growth and Properties of Mg-Doped In-Polar InN Films" (Appl. Phys. Lett., Vol. 90, p. 201913, 2007). However, to the best of the inventors' knowledge, the growth and properties of InN:Mg nanowires have not been reported. In this study, InN:Mg nanowires, with Mg effusion cell temperatures varying from 185° C. to 235° C., were grown and characterized. It was observed that, for relatively low Mg concentrations, InN nanowires with excellent surface morphology and structural properties were obtained but that with increasing Mg flux, the wires showed increasing diameter and reducing length, potentially due to the reduced adatom surface migration. A further increase of the Mg concentration generally led to an onset of tapered surface morphology, with decreasing width with growth time, and the generation of dislocations Referring to FIG. 15B there are shown photoluminescence spectra for InN:Mg nanowires measured at 5K for various Mg effusion cell temperatures. It is observed that the photoluminescence peak intensity decreases considerably with increasing Mg incorporation, which may be directly related to the formation of Mg-related defects. First curve 1550 representing an effusion cell temperature of 185° C., second curve 1560 an effusion cell temperature of 215° C., and third curve an effusion cell temperature of 235° C. Second and third curves 1560 and 1570 being magnified by 8 and 10 times respectively.

Mg and Si doped regions of a nanowire when disposed either side of an intrinsic region allow for the formation of a PIN structure providing for electrical injection of carriers into the dot-in-a-wire structures. Additionally, intentional controlled variations (modulation) of the doping with the quantum dot active regions can provide for enhanced hole transport thereby addressing a major bottleneck to high quantum efficiency, as discussed supra.

According to an embodiment of the invention catalyst-free, vertically aligned InGaN/GaN dot-in-a-wire heterostructures were grown on Si(111) substrates by radio-frequency plasma-assisted molecular beam epitaxy. The GaN nanowires being formed under nitrogen rich conditions with conditions that included a growth temperature of approximately 750° C., nitrogen flow rate of 1-2 sccm, and a forward plasma power of approximately 400 W. Shown in FIG. 16A are 45 degree tilted SEM images of the resulting InGaN dot-in-a-wire heterostructures grown on Si (111) substrate. The areal density of the nanowires is estimated to be approximately $1\times10^{10}$ cm$^{-2}$. It is evident that the nanowires are vertically aligned to the substrate and exhibit a high degree of size uniformity.

Within the preceding descriptions of dot-in-a-wire nanowires in respect of FIGS. 10 through 15 above the InGaN/GaN dot-in-a-wire heterostructures consisted of approximately 0.5 μm GaN buffer layer, three vertically aligned quantum dots separated by approximately 5 nm GaN barrier layers, and an approximately 0.3 μm GaN capping layer wherein variations in emission from green (approximately 495 nm) through yellow (approximately 565 nm) to amber/red (approximately 620 nm) being achieved by growing the heterostructures with different In/Ga flux ratios.

As discussed supra the provisioning of white light sources with LED devices in the prior art is to co-package red, green, and blue LEDs as fabricating all three devices on a single substrate requires three separate epitaxial growth sequences with intermediate processing. However, the inventors have established a vertically integrated multi-element white light LED that is formed in a single epitaxial growth and processing sequence. According to an embodiment of the invention multiple self-organized InGaN quantum dots are incorporated into each GaN nanowire. A bright field scanning transmission electron microscopy (STEM) image of a single InGaN/GaN dot-in-a-wire is shown FIG. 16B, wherein the vertically aligned multiple InGaN quantum dots can be identified. The nanowires are of wurtzite crystal structure, with the c-axis aligned along the growth direction as discussed supra. The quantum dot layers were grown at relatively low temperatures of 550° C. to 600° C. to enhance the In incorporation. The quantum dot widths are in the range of 20 nm to 40 nm, and the quantum dot heights, which can be varied by varying the growth time at each specific stage in the growth sequence for each quantum dot, were within the range from approximately 3 nm to approximately 10 nm. Unlike prior art quantum well/disk-in-a-wire heterostructures, the quantum dots are completely embedded in the center region of the nanowires, thereby leading to superior three-dimensional carrier confinement. It can also be seen that the InGaN quantum dot alignment is correlated along the growth direction, due to strain-induced self-organization, which is indicated by the white arrow shown in FIG. 16B.

Figure 17:
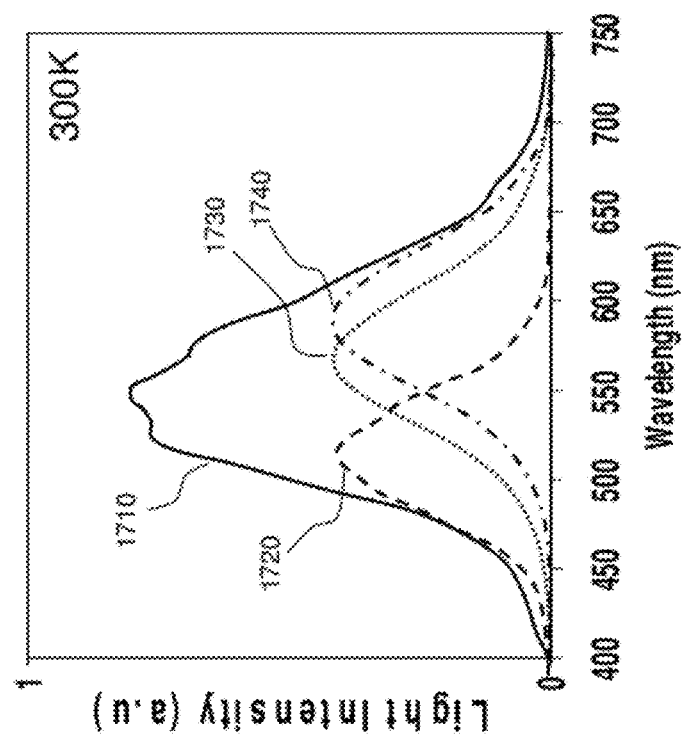
FIG. 17 shows photoluminescence spectra for InGaN/GaN dot-in-a-wire heterostructures grown on Si(111) according to different conditions.

Now referring to FIG. 17 the photoluminescence spectra of InGaN/GaN dot-in-a-wire heterostructures grown under different conditions measured at room temperature are depicted. The optical properties of the quantum dots are determined by the sizes and compositions of the quantum dots and, to lesser extent, the nanowire diameter. Consequently, multicolor emission, illustrated in FIG. 17 by first to third spectra 1720 to 1740 respectively, can be controllably achieved by varying the growth conditions, including the substrate temperature, growth duration, and In/Ga flux ratio. Defect related yellow luminescence, which is commonly observed in GaN films, is absent in catalyst-free GaN nanowires. Compared to previously reported InGaN/GaN quantum wells, InGaN ternary nanowires, or InGaN/GaN well/disk-in-a-wire heterostructures, the use of self-organized quantum dots can enable ultrahigh emission efficiency in the entire visible spectrum, due to the superior 3-dimensional carrier confinement and a high degree of tunability offered by the dots. Significantly, intrinsic white light can be achieved by light mixing of the blue, green and red emission from self-organized quantum dots incorporated in single GaN nanowires. This is evidenced by the photoluminescence spectrum 1710 shown in FIG. 17 for GaN nanowires that incorporate ten vertically aligned InGaN/GaN quantum dots with varying In compositions. The emission peak of the nanowire LED white light source was centered at approximately 545 nm and spans nearly the entire visible wavelength range. It would be evident that the spectral profile may be adjusted with variations in the number of quantum dots and their composition/geometry to broaden the profile, flatten it, weight it to the red or blue ends of the spectrum or even extend it into the near ultraviolet and/or near infrared.

Figure 18:
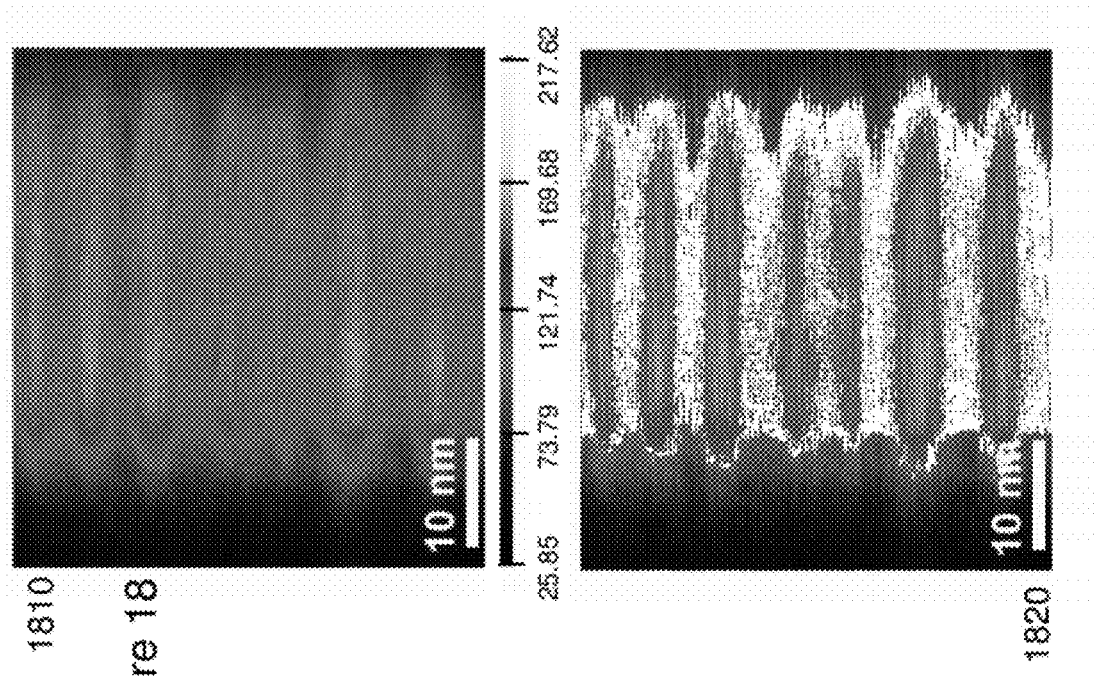
FIG. 18 is a high-resolution dark field image showing the contrast between the InGaN dots and GaN barriers.

A better understanding of the growth and emission mechanisms, STEM imaging and spectrum imaging (SI) were performed on single nanowires to investigate the structural properties of the InGaN/GaN dot-in-a-wire heterostructures. A high-resolution high angle annular dark field (HAADF) image showing the atomic number contrast is illustrated in FIG. 18 by first image 1810. Due to the issues of false coloring and reproduction in black and white for the patent specification this image has also been reproduced as second image 1820 wherein removal of coloring in the region of atomic numbers approximately 100-140 has been performed through color selection in a graphics image processing application to try and accentuate the differentiation between quantum wells, the barriers, and the nanowire. The intensity at each pixel in the image is presented as a pseudo-color display in order to highlight the changes in intensity quantitatively. The InGaN dots are located at the regions with relatively high intensity, since the average atomic number in the quantum dot region is larger than that in the GaN barriers. Importantly, no extending defects such as dislocations or stacking faults are observed in the InGaN/GaN quantum dot active regions.

Figures 19A, 19B:
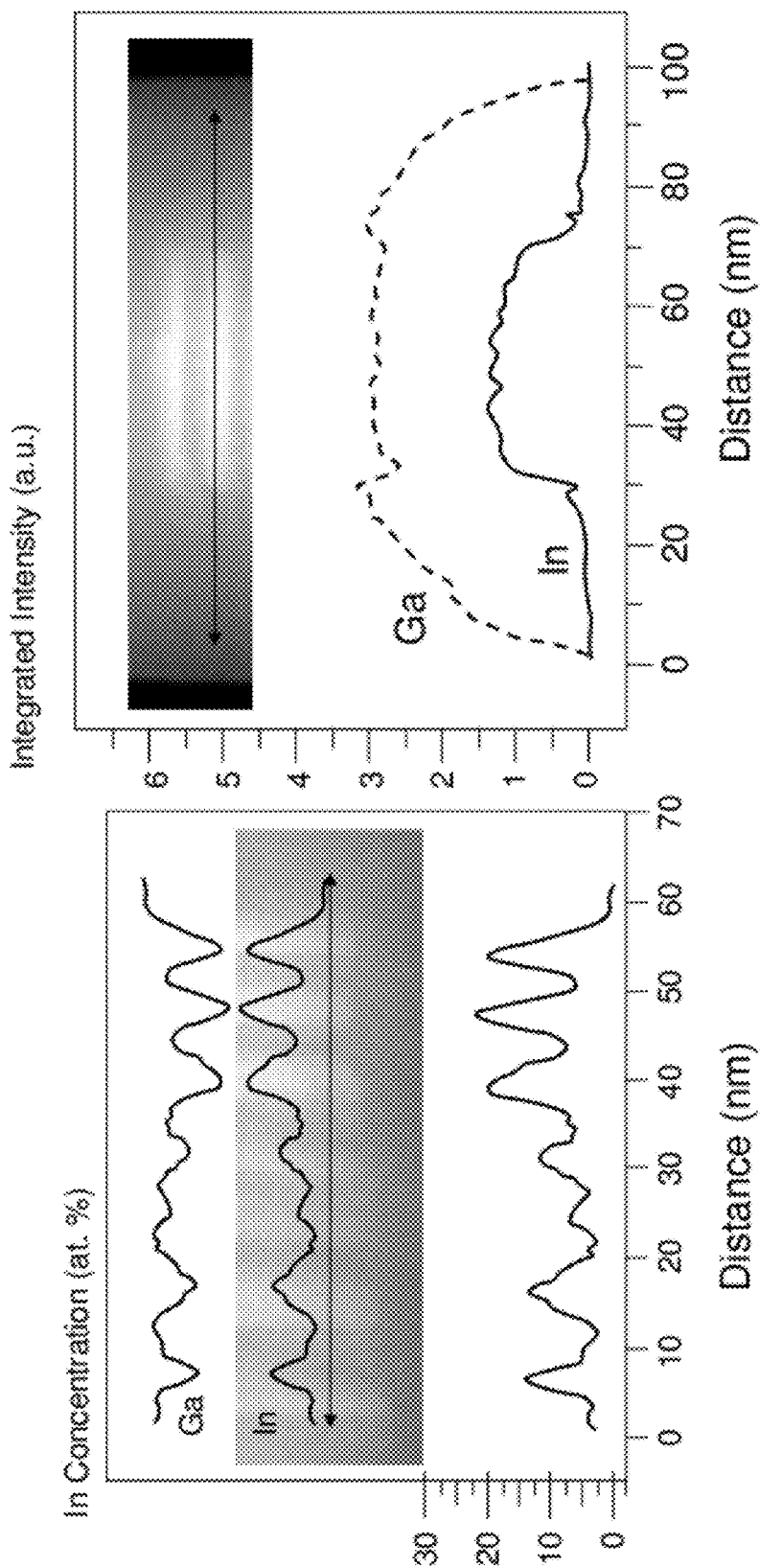
FIGS. 19A and 19B depict energy dispersive X-ray spectrum images of dot-in-a-wire heterostructures showing the In and Ga signal levels along the lateral and transverse directions.

In order to study the elemental distribution in the InGaN dots, energy dispersive X-ray spectrometry spectrum image (EDXS-SI) was performed across the centers of InGaN/GaN quantum dots. From the qualitative variation of the In $L_\alpha$, and Ga $K_\alpha$, signals shown in FIG. 19A, an In-rich or Ga-deficient region is observed in each of the InGaN dots. Using the Ga signal from the top GaN capping region as a built-in reference, the In concentration in each $In_{1-x}Ga_xN$ dot is quantified and shown as the line profile in FIG. 19A. The In composition (x) in each dot is not uniform, and it varies from 10% to 50% atomic percent. Although these values are based on the through thickness averaging, the compositional variation of the dots is consistent with the large inhomogeneous broadening observed in the photoluminescence spectra evident in FIG. 17.

Since the sub-nanometer spatial resolution EDXS conditions were used, it may also be noticed both from the HAADF images and the EDXS data that the barrier layers contain a small percentage of In, due to In segregation, thereby leading to unique dot-in-a-wire core-shell nanoscale heterostructures. Besides the EDXS analysis, an electron energy loss spectrometry spectrum image (EELS-SI) was taken along the lateral direction, indicated by the arrow, of an individual InGaN dot, illustrated in the inset of FIG. 19B. The line profile of the integrated intensity for In $M_{4,5}$ and Ga $L_{2,3}$ edge are also depicted, and a drop/increase of the Ga and In signal respectively is observed in the dot region. The diameter of the dot is estimated to be approximately 40 nm based on the In profile. It was also evident that the quantum dots were positioned centrally within the nanowire.

Figure 20:
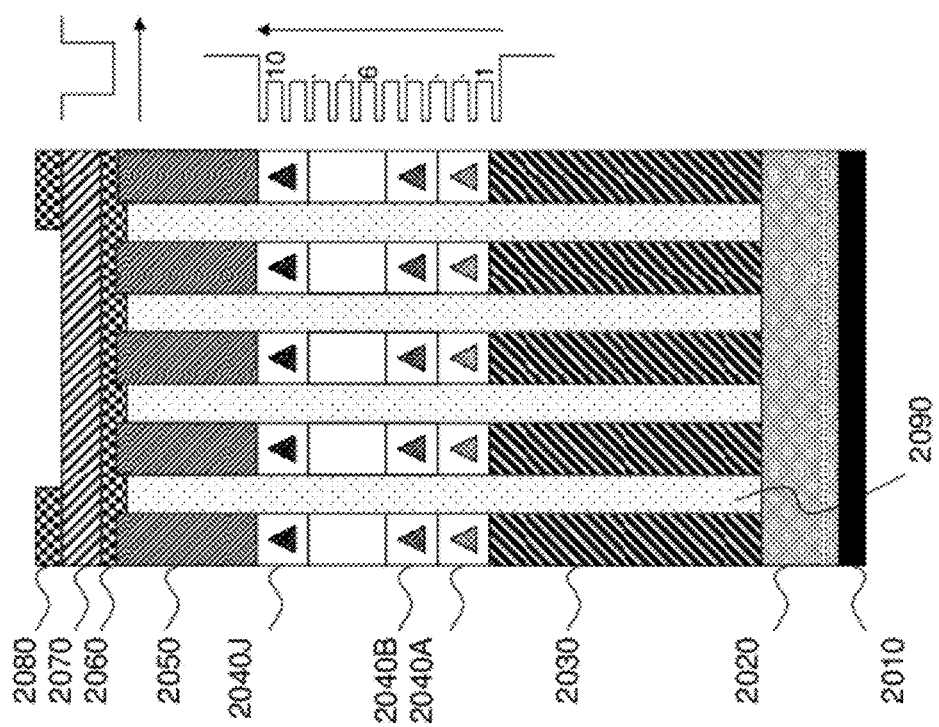
FIG. 20 depicts a schematic construction of a dot-in-a-wire white light LED source according to an embodiment of the invention.

The self-organized InGaN/GaN dot-in-a-wire LED heterostructures, schematically illustrated in FIG. 20, were grown on low resistivity n-type Si(111) substrates 2020. The bottom n-type Si doped GaN 2030 is formed atop this, followed by the ten quantum dots 2040A through 2040J, and then the upper p-type Mg doped GaN 2050. Providing the electrical contacts are lower Ti/Au contact 2010 and upper Ni/Au contacts 2060 and 2080 that are separated by an indium tin oxide (ITO) 2070. The nanowires are separated by polyimide 2090. As shown the device active region consists of ten vertically aligned InGaN quantum dots, 2040A, 2040B, to 2040J separated by GaN barrier layers, typically approximately 3 nm thick. The flat energy band diagrams along the nanowire axial direction and along the lateral direction of the quantum dot active region are also illustrated in FIG. 20. Due to In segregation, the GaN barrier layers also contain a small percentage (approximately 5-10%) of In.

The resulting thin, approximately 3 nm, InGaN barrier layers can enhance the hole injection and transport in the quantum dot active region, thereby leading to more uniform hole distribution, reduced electron leakage, and enhanced internal quantum efficiency at relatively high current levels. To further enhance the hole transport the structure is modulation doped p-type, which is achieved by incorporating Mg in part of the GaN barrier layer, with the Mg effusion cell temperature at approximately 150° C. to approximately 200° C. This technique of modulation p-doping being shown by the inventors to reduce deleterious effects associated with the direct Mg incorporation in the quantum dots. As a consequence, no degradation in the optical properties of the p-doped dot-in-a-wire heterostructures was measured, compared to the undoped LED device heterostructures.

During the device fabrication process, the InGaN/GaN nanowire arrays were first planarized using a polyimide 2090 resist layer by spin-coating, which was followed by an appropriate dry etching process to reveal the top GaN:Mg 2050 sections of the dot-in-a-wire heterostructures. The p-metal and n-metal contacts, consisting of Ni (approximately 5 nm)/ Au (approximately 7 nm)/indium tin oxide (ITO) 2060 and Ti/Au 2010 layers, were then deposited on the exposed wire surface and the backside of the Si substrate 2020, respectively. The fabricated devices with Ni/Au 2060 and Ti/Au 2010 metal contacts were first annealed at approximately 500° C. for 1 minute in nitrogen ambient. Upon deposition of the ITO transparent contact, a second annealing step was performed at approximately 300° C. in vacuum for approximately 1 hour.

Figure 21:
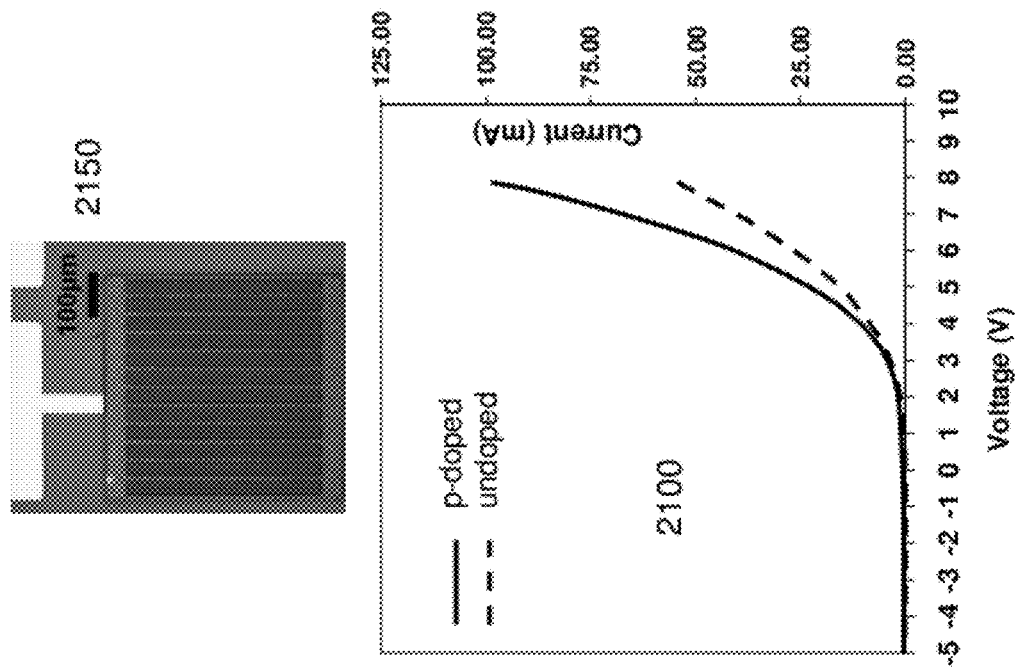
FIG. 21 depicts the current-voltage characteristics of undoped and p-doped dot-in-a-wire LEDs at room temperature according to an embodiment of the invention.

An optical microscopy image of a fabricated nanowire LED device is shown as LED 2150 in FIG. 21 wherein metallic contact grids were made on the device surface to facilitate the hole transport and injection processes. The measured current-voltage characteristics at room temperature, for both the undoped and modulation p-doped implementations of the nanowire dot-in-a-wire LEDs, are shown in graph 2100 of FIG. 21. The devices exhibit excellent diode characteristics, with relatively small (approximately 20Ω to 50Ω) series resistances and negligible leakage current under reverse bias. The p-doped nanowire LEDs also shows slightly higher current densities, compared to the undoped device under the same bias conditions.

Figure 22:
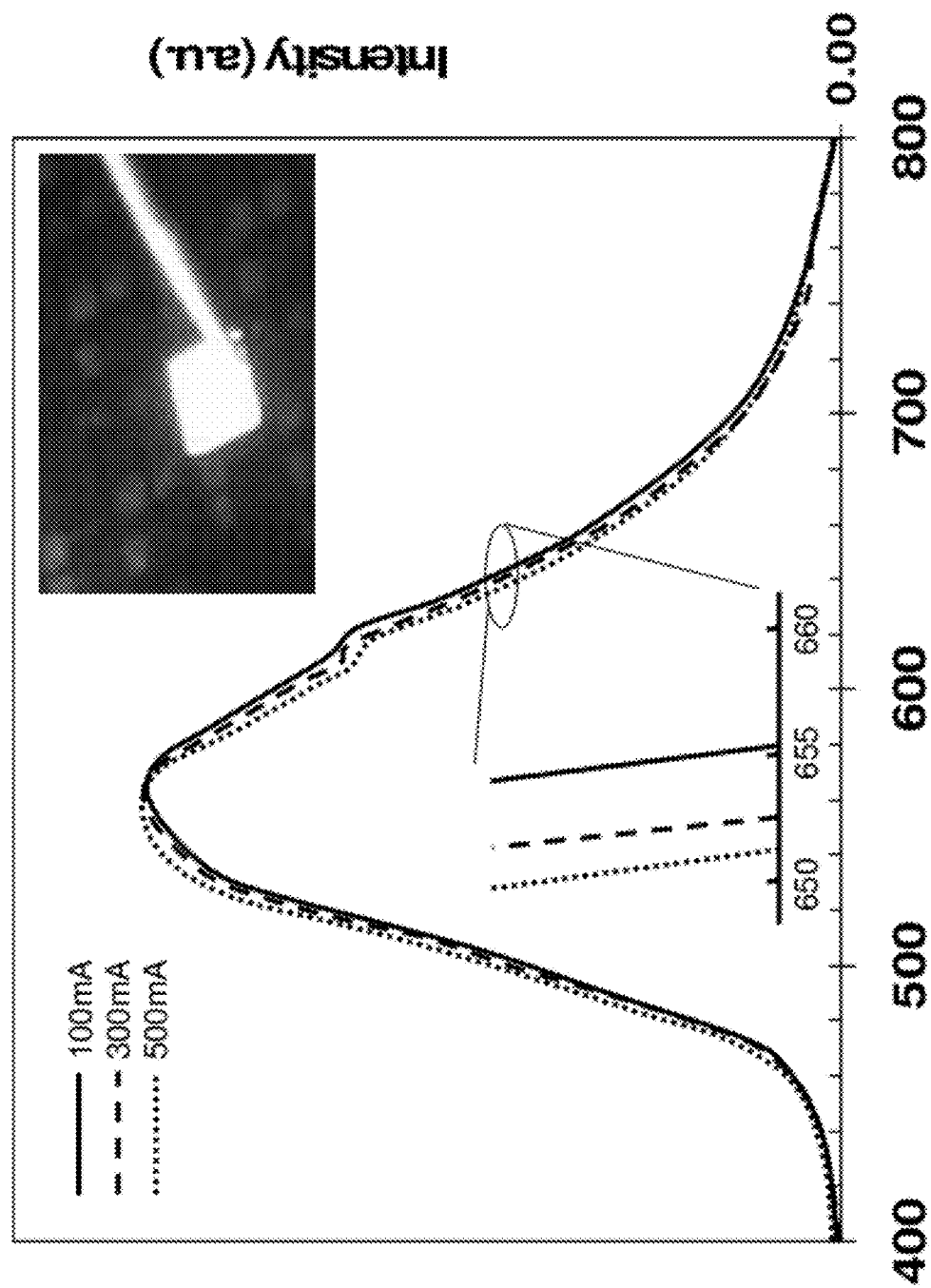
FIG. 22 depicts electroluminescence spectra of a p-doped InGaN/GaN dot-in-a-wire LED at room temperature.

Emission characteristics of InGaN/GaN dot-in-a-wire LEDs were studied, where to minimize junction heating effects impacting measurements, pulsed bias conditions, with duty cycles in the range of 0.1% to 5%, were utilized during the measurements. Strong white light emission, illustrated in the inset of FIG. 22, was observed for the p-doped dot-in-a-wire LEDs, which is a direct consequence of the polychromatic emission of the InGaN/GaN quantum dots, due to both the large inhomogeneous broadening and their varying thickness. The device area is approximately 0.5×0.5 mm2. Importantly, emission spectra of the p-doped LEDs are nearly invariant with increasing injection currents. As shown in FIG. 22, a very small (approximately 4 nm) blue shift was measured for the p-doped dot-in-a-wire LEDs with increasing injection current from 100 mA to 500 mA, signifying the presence of a very small, or negligible quantum-confined Stark effect.

Figure 23:
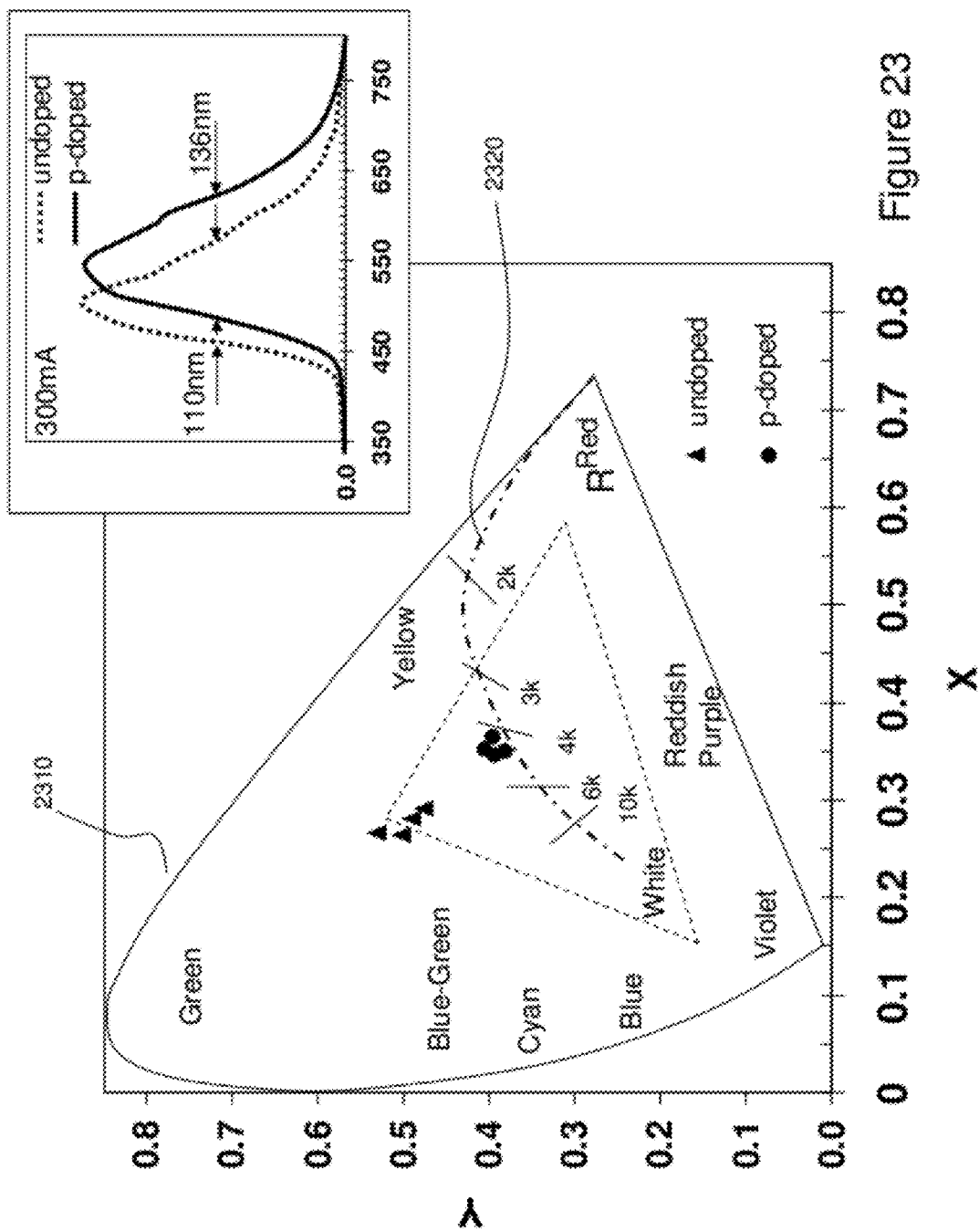
FIG. 23 depicts undoped (triangles) and p-doped (circles) dot-in-a-wire LED emission on a chromaticity diagram.
Figure 24:
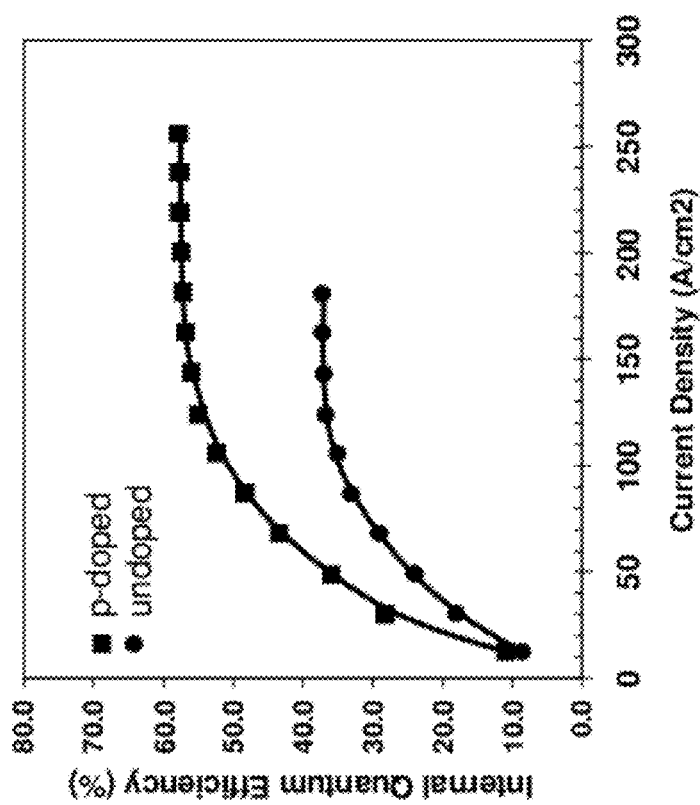
FIG. 24 depicts room temperature internal quantum efficiency of the undoped and p-doped dot-in-a-wire LEDs versus injection currents.

Additionally, the spectral linewidths, measured at full-width half-maximum (FWHM), at approximately 136 nm are comparatively larger than those of the undoped devices, FWHM approximately 110 nm, as illustrated in the inset of FIG. 23, although both LED structures exhibit nearly identical emission spectra under optical pumping. Locations of the light emission on the chromaticity diagram 2310 are shown in FIG. 23 for both the undoped (solid triangles) and p-doped (solid circles) LEDs at injection currents from 100 mA to 400 mA. It is seen that the p-doped LEDs exhibit improved CIE chromaticity coordinates (x≈0.350±0.015 and y≈0.370±0.015) with increasing injection currents, with a correlated color temperature at approximately 4500K and high color rendering properties, the color temperature being shown by curve 2320. The undoped LEDs, on the other hand, show varying chromaticity coordinates (x≈0.28±0.02 and y≈0.49±0.03) over the same current range. The internal quantum efficiency of the undoped and p-doped dot-in-a-wire LEDs was also determined. To date, there has been no report on the internal quantum efficiency of GaN-based nanowire LEDs under electrical injection. The room-temperature internal quantum efficiency, relative to that at 5 K, is derived by comparing the light intensity measured at these temperatures under the same injection current. The results are shown in FIG. 24 for both the undoped and p-doped dot-in-a-wire LEDs. The internal quantum efficiency initially increases with increasing injection currents for both types of devices. It reaches the maximum values of 36.7% and 56.8% at approximately 130 A/cm$^2$ and 200 A/cm$^2$, for the undoped and p-doped devices, respectively. These values are significantly higher than the internal quantum efficiencies of any previously reported nanowire LEDs under either electrical injection or optical pumping, see for example "Catalyst-Free InGaN/GaN Nanowire Light Emitting Diodes Grown on (001) Silicon by Molecular Beam Epitaxy" by W. Guo et al (Nano Lett., Vol. 10, p. 3355, 2010) and "Strong Green Photoluminescence from InxGa1−xN/GaN Nanorod Arrays" by C. C. Hong et al (Opt. Express, Vol. 17, 20, p. 17227, 2009). More importantly, with the use of modulated p-doping, the internal quantum efficiency (approximately 56.8%) shows a more than 50% increase over undoped structures, which is the most efficient phosphor-free white LED when compared to the prior art.

Compared to the undoped dot-in-a-wire LEDs, the remarkably high internal quantum efficiency of the p-doped white LEDs, as well as their stable emission characteristics, are attributed to the significantly enhanced hole transport in the InGaN quantum dot active region. Poor hole transport, due to their heavy effective mass, has been identified as one of the primary limiting factors for achieving high performance LEDs. In conventional LED heterostructures, injected holes largely reside in the small region close to the p-GaN layer, which predominantly determines the emission characteristics. The poor hole transport and injection processes also lead to many undesirable properties, including electron overflow, enhanced Auger recombination, and hot carrier effect. In typical nanowire LED heterostructures, the wire diameters are comparable to, or smaller than the active region thickness. The resulting strong surface scattering, as well as the presence of surface charges, may further aggravate the hole transport and injection processes and deteriorate the device performance.

With the use of p-doing in the device active region, enhanced hole transport and, consequently, more uniform, less current dependent hole injection can be achieved, which is consistent with the relatively large spectral linewidth (approximately 136 nm) measured for the p-doped LEDs, compared to that (approximately 110 nm) of the undoped devices wherein optical emission is restricted to a relatively small quantum dot active region close to the p-GaN layer. Consequently, emission characteristics of the p-doped dot-in-a-wire LEDs are governed by the inhomogeneous broadening of the dots, which can be controlled by varying the dot properties during epitaxial growth and can lead to highly stable, robust optical emission with increasing current, compared to prior art approaches for monolithic white LEDs. If we assume unity electrical injection efficiency, the internal quantum efficiency ($\eta_i$) is typically modeled by $$\eta_i = \frac{BN^2}{AN + BN^2 + CN^3 + f(N)} \quad (1)$$

where N is the carrier density and A, B, and C are the Shockley-Read-Hall nonradiative recombination, radiative recombination, and Auger recombination coefficients, respectively, and f(N) represents the carrier leakage outside of the quantum dots.

The very high internal quantum efficiencies for both undoped and p-doped LEDs are attributed to the significantly reduced nonradiative recombination and carrier leakage, owning to the superior carrier confinement provided by the dot-in-a-wire heterostructures. The improved hole injection and transport processes in the LED active region further reduce carrier leakage, carrier recombination outside of the dots, and hot carrier effect, which explains the drastic increase (>50%) in the internal quantum efficiency, compared to the undoped devices.

Figure 25:
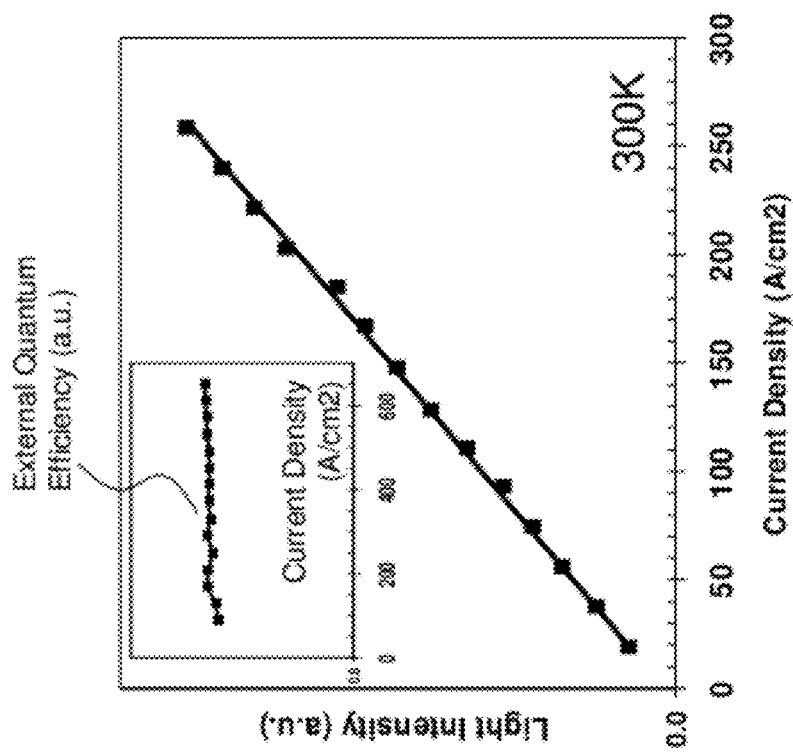
FIG. 25 electroluminescence intensity versus current density for a p-doped dot-in-a-wire LED measured at room temperature.

To achieve high luminous efficacy, it is important to maintain the high efficiency at relatively high injection levels, i.e. to minimize or eliminate any efficiency droop. Although reduced efficiency droop has been demonstrated in InGaN/GaN nanowire LEDs within the prior art, the measured current densities were generally limited to approximately 50-100 A/cm$^2$. Referring to FIG. 25, the light-current characteristics for a p-doped dot-in-a-wire LED were measured up to approximately 300 A/cm$^2$, and no saturation was observed, suggesting the presence of a small, or negligible efficiency droop even under relatively high current injection conditions. It is also important to notice that these measurements were performed for unpackaged devices without any proper thermal management. Therefore, the intrinsic device performance is expected to be significantly better. To this end, the external quantum efficiency of the p-doped dot-in-a-wire LEDs was measured at 5 K, which remains nearly invariant for injection current densities as high as 640 A/cm2, shown in the inset of FIG. 25. The absence of efficiency droop at high injection levels is attributed to the superior carrier confinement provided by the quantum dot heterostructures, the nearly dislocation- and strain-free GaN nanowires, as well as the significantly enhanced hole transport and reduced carrier leakage, due to the p-type modulation doping.

It would be evident to one skilled in the art that whilst the embodiments described supra in respect of FIGS. 16 through 25 consider broadband LEDs the principles described may be applied to broadband photodetectors. It would also be evident that whilst some of the plurality of vertically aligned quantum dot-in-a-wire structures may be used in optically pumping colloidal quantum dots disposed within the overall device structure that others may be used to optically pump other quantum dots within the dot-in-a-wire structures.

Figure 26:
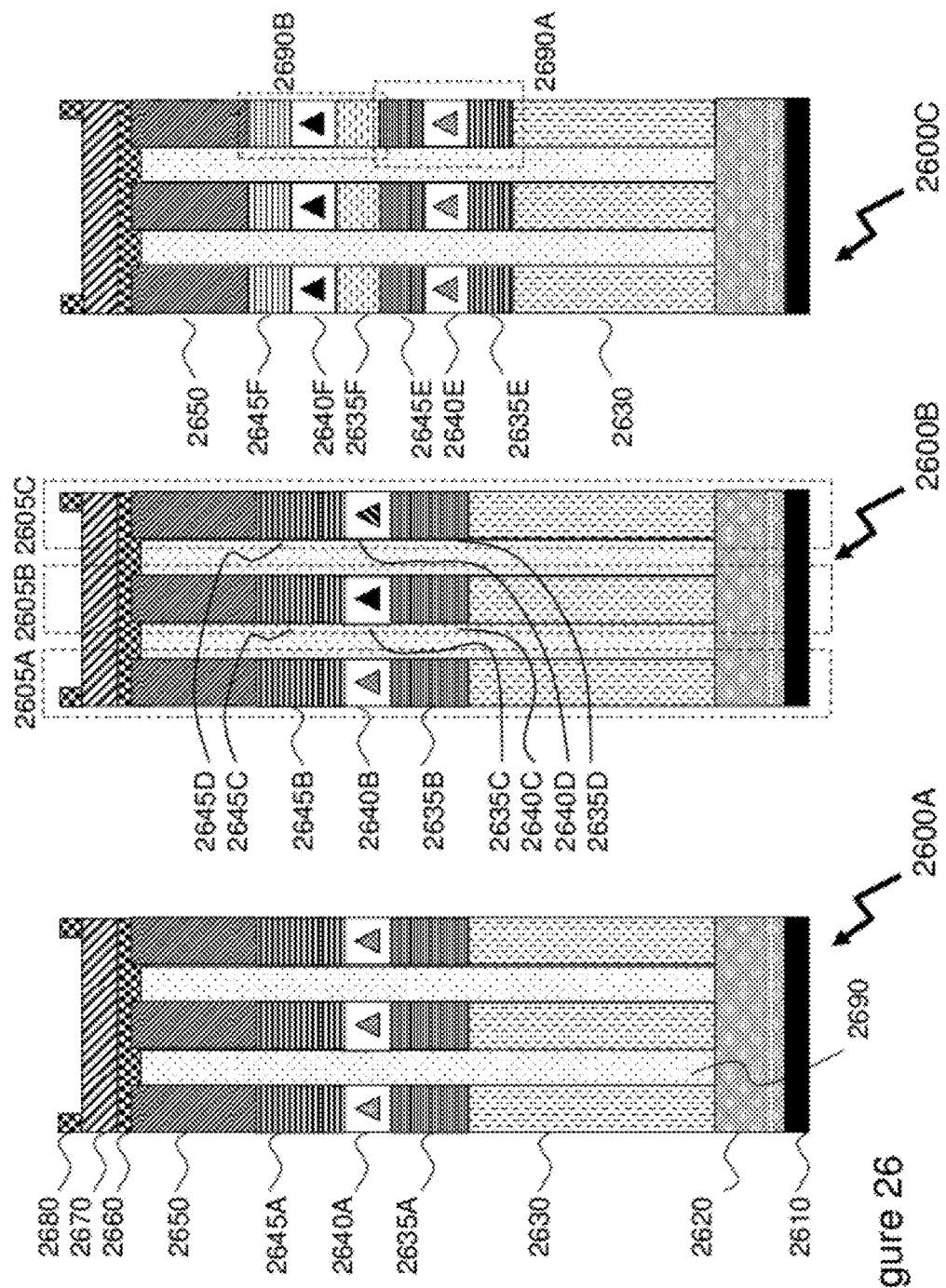
FIG. 26 depicts schematic constructions of dot-in-a-wire laser structures according to embodiments of the invention.

Referring to FIG. 26 there are shown first to third schematics 2600A through 2600C respectively of dot-in-a-wire laser structures according to embodiments of the invention. Considering first schematic 2600A then there is shown a self-organized InGaN/GaN dot-in-a-wire laser heterostructures on a low resistivity n-type Si(111) substrate 2620. The bottom n-type Si doped GaN 2630 is formed atop this, followed by lower distributed Bragg reflector (DBR) 2635A forming one minor of the laser structure, then a single quantum dot 2640A, upper DBR 2645A, and the upper p-type Mg doped GaN 2650. Providing the electrical contacts are lower contact 2610, for example Ti/Au, and upper contacts 2660 and 2680, for example Ni/Au, that are separated by an ITO 2670, ITO being electronically conductive and optically transparent. The nanowires being separated by polyimide 2690 that has been spin-coated post-nanowire fabrication and prior to electrode metallization. The dot-in-a-wire laser structure is formed from quantum dot 2640A that acts as optical emitter, being injected electrically through n-type Si doped GaN 2630 and p-type Mg-doped GaN 2650, and lower DBR 2635A and upper DBR 2645A that act as the highly reflective facets required to establish the lasing operation.

Now referring to second schematic 2600B a multi-laser structure is shown comprising three nanowire lasers, 2605A to 2605C respectively. First nanowire laser 2605A employs an active region comprising first bottom DBR 2635B, first quantum dot 2640B, and first top DBR 2645B. Second nanowire laser 2605B employs an active region comprising second bottom DBR 2635C, second quantum dot 2640C, and second top DBR 2645C whilst third nanowire laser 2605C employs an active region comprising third bottom DBR 2635D, third quantum dot 2640D, and third top DBR 2645D. In each instance the top and bottom DBR structures are optimized for the respective quantum dot heterostructure. It would be evident to one skilled in the art that whilst the three nanowire lasers 2605A to 2605C would be grown in sequence that aspects of the epitaxial process may be undertaken together, e.g. the quantum dot structures may potentially all be grown simultaneously after the bottom DBR structures were grown if the emission wavelengths permitted as the operating wavelengths of each nanowire laser would be defined by the DBR structure.

Referring to third schematic 2600C there is shown an alternative multi-laser structure exploiting vertical integration. Accordingly each nanowire as shown now comprises vertically of bottom n-type Si doped GaN 2630 atop which are first lower DBR 2635E, first quantum dot 2640E, first upper DBR 62645E, second lower DBR 2635F, second quantum dot 2640F, second upper DBR 2645F, and the upper p-type Mg doped GaN 2650. First lower DBR 2635E, first quantum dot 2640E, and first upper DBR 2645E respectively forming first dot-in-a-wire laser 2690A whilst second lower DBR 2635F, second quantum dot 2640F, second upper DBR 2645F form a second dot-in-a-wire laser 2690B. It would be apparent to one skilled in the art that such a vertically stacked dot-in-a-wire multi-laser structure may be implemented where the emission wavelengths of the individual lasers are not overlapping with the subsequent DBR structures and that the quantum dot absorption edges are not overlapping either.

Figure 27:
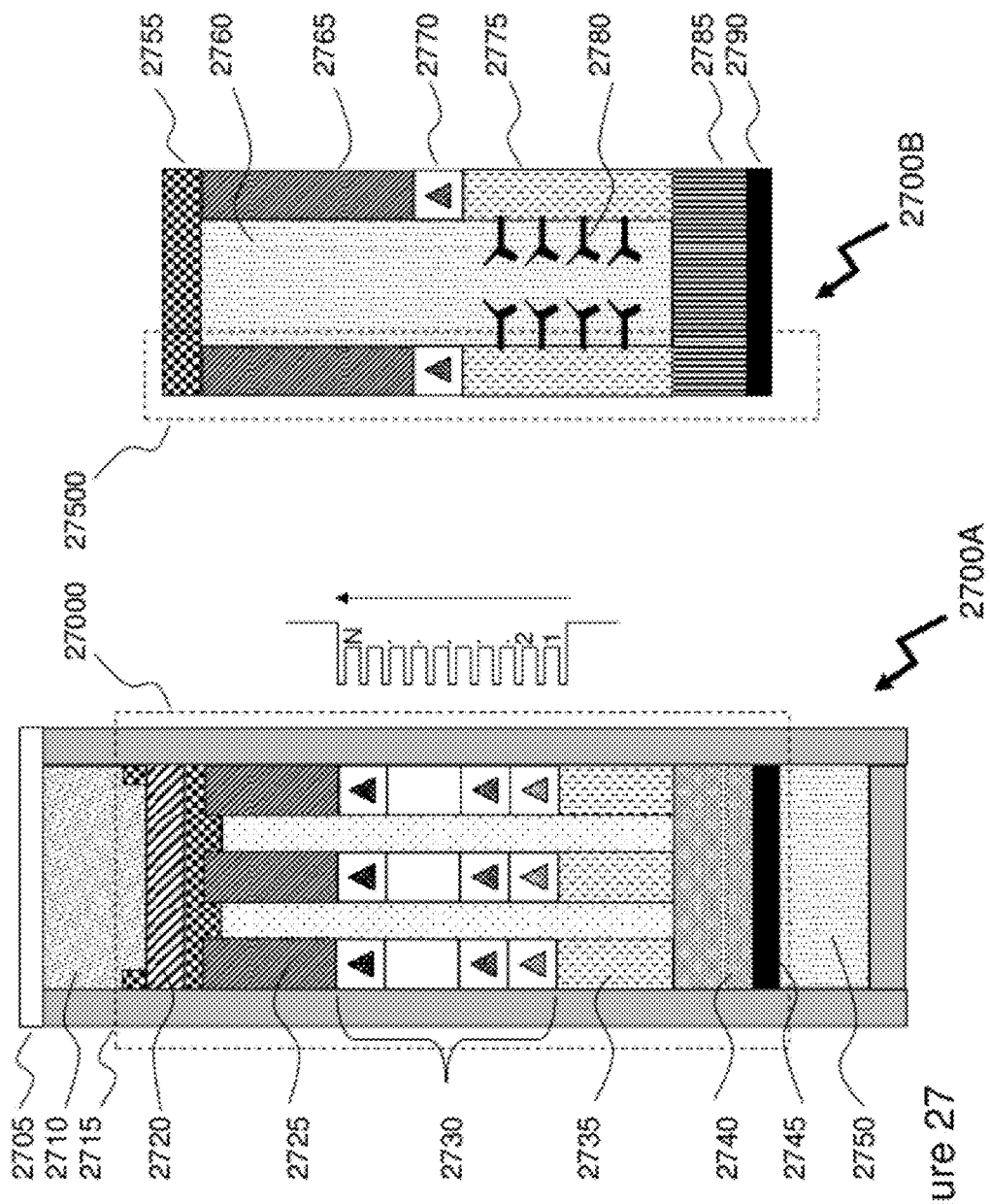
FIG. 27 depicts schematic constructions of photoelectrochemical and electrobiological devices exploiting dot-in-a-wire structures.

Now referring to FIG. 27 there are depicted schematics of photoelectrochemical device 2700A and electrobiological device 2700B respectively according to embodiments of the invention exploiting dot-in-a-wire structures. Considering initially photoelectrochemical device 2700A then a photovoltaic hydrogen/oxygen generator is depicted. The photoelectrochemical device 2700A exploiting a self-organized InGaN/GaN dot-in-a-wire photovoltaic structure 27000 that has been grown on a low resistivity n-type Si(111) substrate 2740. N-type Si doped GaN 2735 is formed atop this followed by vertically stacked array 2730 of quantum dot heterostructures, and p-type Mg doped GaN 2725. Atop this structure once planarized upper contacts, for example Ni/Au, that are separated by an ITO layer, ITO being electronically conductive and optically transparent. The bottom contact to the low resistivity n-type Si(111) substrate 2740 being Ti/Au, for example.

The self-organized InGaN/GaN dot-in-a-wire photovoltaic structure 27000 is then disposed within a housing 2715 having a transparent window 2705. Adjacent the upper ITO layer is disposed first electrolyte 2710 and adjacent the bottom contact is second electrolyte 2750. Accordingly, optical illumination of the photoelectrochemical device 2700A through the transparent window 2705, i.e. by solar radiation, results in the self-organized InGaN/GaN dot-in-a-wire photovoltaic structure 27000 generating a potential across the device such that the ITO layer and bottom layer are electrically charged such that electrochemical reaction occurs in the first and second electrolytes 2710 and 2750 respectively such that for example hydrogen is generated in the first electrolyte 2710 and oxygen in the second electrolyte 2750. By suitable ancillary equipment around the photoelectrochemical device 2700A these released gases can be collected and used for energy generation. The economics of such hydrogen generation using photoelectrochemical processes is heavily dependent upon the cost of the photovoltaic structures and their efficiency, see for example "Technoeconomic Analysis of Photoelectrochemical (PEC) Hydrogen Production—Final Report" December 2009 B. D. James et al report for the US Department of Energy (http://www1.eere.energy.gov/hydrogenandfuelcells/pdfs/pec_technoeconomic_analysis.pdf).

It would be evident to one skilled in the art that the vertically stacked array 2730 of quantum dot heterostructures, shown as comprising N elements, acts as multielement photovoltaic increasing the efficiency and thereby allowing both efficient hydrogen generation under low illumination conditions and a reduction in complexity through reducing the requirements for solar collector optics.

Referring to electrobiological device 2700B a self-organized InGaN/GaN dot-in-a-wire diode 27500 that has been grown on a low resistivity n-type Si(111) substrate 2785. N-type Si doped GaN 2775 is formed atop this followed by quantum dot 2770, and p-type Mg doped GaN 2765. Atop this structure is upper contacts 2755, for example Ni/Au, and the bottom contact 2790, to the low resistivity n-type Si(111) substrate 2785, being Ti/Au, for example. Accordingly the electrobiological device 2700B has within a medium 2760, which may for example be a sample taken from a patient. The n-type Si doped GaN 2775 has disposed upon it first receptors 2780 such that the presence of the biomolecule or inorganic molecule to which the receptors 2780 are receptive within the medium 2760 results in a change in the electrical characteristics of the n-type Si doped GaN 2775 such that the self-organized InGaN/GaN dot-in-a-wire diode 27500 performance varies.

It would be evident to one skilled in the art that accordingly the sensitivity may be substantially increased as the response of the diode may be substantially non-linear. In some instances the self-organized InGaN/GaN dot-in-a-wire diode 27500 may be optically emissive and the presence of the biomolecule or other molecule being sensed may above a specific concentration or threshold result in the electrical characteristic being shifted sufficiently either to result in the optical emitter turning on or turning off. Alternatively the receptors 2780 may be disposed upon the p-type Mg doped GaN 2765 or in some instances the quantum dot 2770. Accordingly by varying the receptors 2780 across an area of the n-type Si(111) substrate 2785 and partitioning one or both of the upper contacts 2755 and bottom contact 2790 a compact, high sensitivity, high efficiency assay device may be provided.

As discussed above prior art GaN-based planar heterostructures have been limited in their low efficiency and exhibit efficiency droop in the green to red spectral range. Within the prior art this has been explained by the presence of polarization fields, Auger recombination, poor hole transport, defects/dislocations, and/or electron leakage and overflow. Nanowire devices such as those described above in respect of embodiments of the invention means that many mechanisms that may contribute to efficiency degradation, including dislocations, polarization fields, as well as the associated quantum-confined Stark effect (QCSE) can be minimized. However, the inventors have noted that compared to conventional planar heterostructures the performance of such nanoscale LEDs is more susceptible to electron leakage out of the device active region, due to the presence of large densities of states/defects along the wire surface and the one-dimensional carrier transport process. The resulting carrier loss and nonradiative carrier recombination thereby limit the maximum quantum efficiency achievable at high current injection levels.

Figure 28:
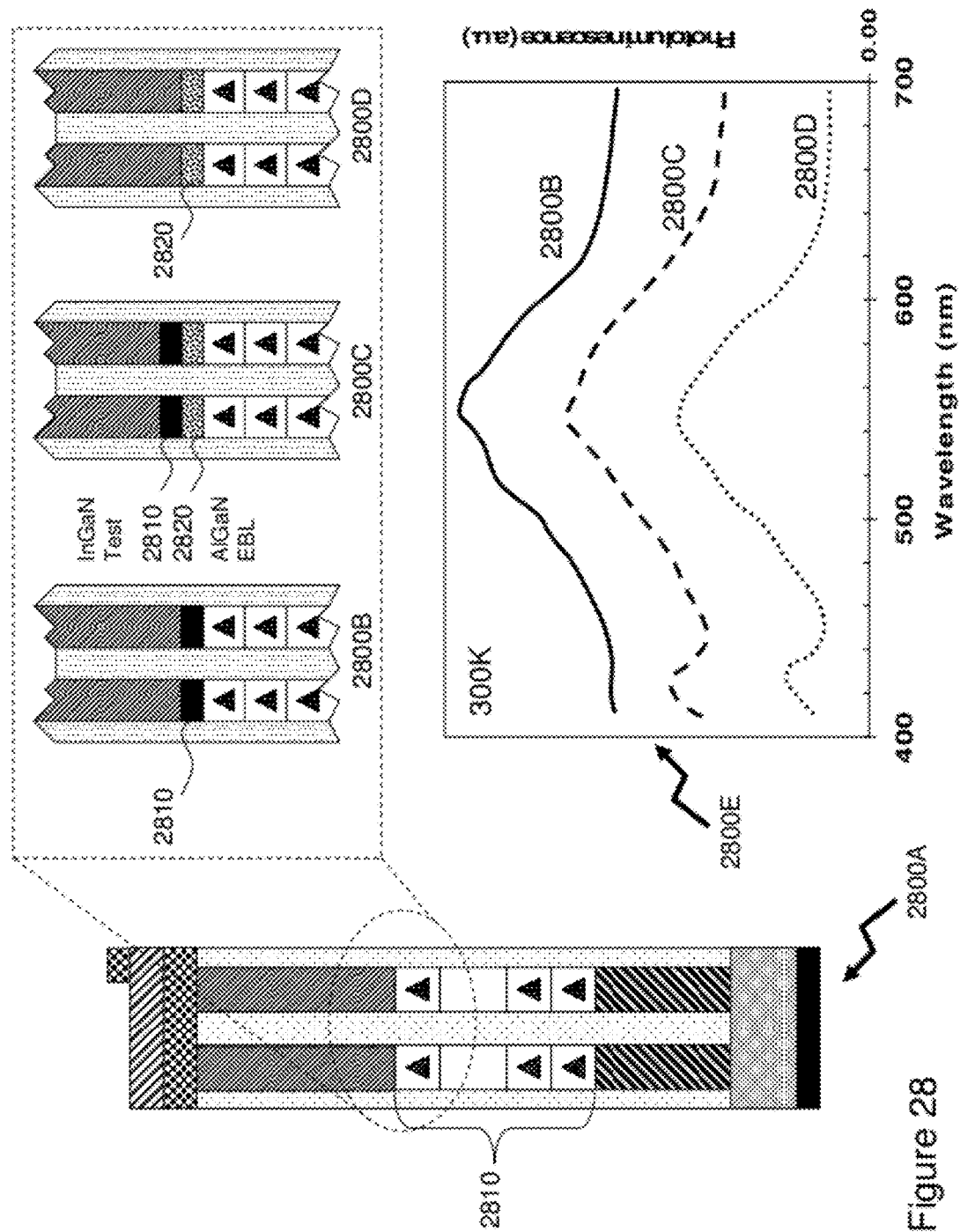
FIG. 28 depicts schematic constructions of dot-in-a-wire laser structures according to embodiments of the invention.

Referring to FIG. 28 there is shown a schematic of a dot-in-a-wire LED 2800A according to an embodiment of the invention as described above in respect first schematic 2600A in FIG. 26 wherein the single quantum dot 2640A has been replaced with multiple quantum dots 2810. To investigate the electron overflow phenomena an InGaN/GaN dot-in-a-wire LED heterostructures a first test nanowire LED 2800B was grown incorporating a p-doped InGaN/GaN quantum well between the device active region and p-GaN section. Accordingly electrons leaking out of the quantum dots can recombine with holes in the test well, which has smaller In compositions than that of the InGaN/GaN quantum dots and the resulting optical emission can therefore be used to evaluate the electron overflow in nanowire LEDs.

Additionally, a second test nanowire LED 2800B was grown incorporating a p-doped AlGaN electron blocking layer (EBL) between the LED active region and the InGaN test quantum well. A third test nanowire LED 2800C was also grown wherein the p-doped AlGaN EBL was incorporated but the InGaN test well omitted. is also investigated. Graph 2800E depicts the photoluminescence spectra of first to third test nanowire LEDs 2800B to 2800D respectively at room temperature. The peak at approximately 550 nm is related to the emission from the quantum dot active region of the nanowires, while the peak at approximately 430 nm is due to the presence of an InGaN test well, which can be measured by comparing first and second test nanowire LEDs 2800B and 2800C respectively.

Figure 29:
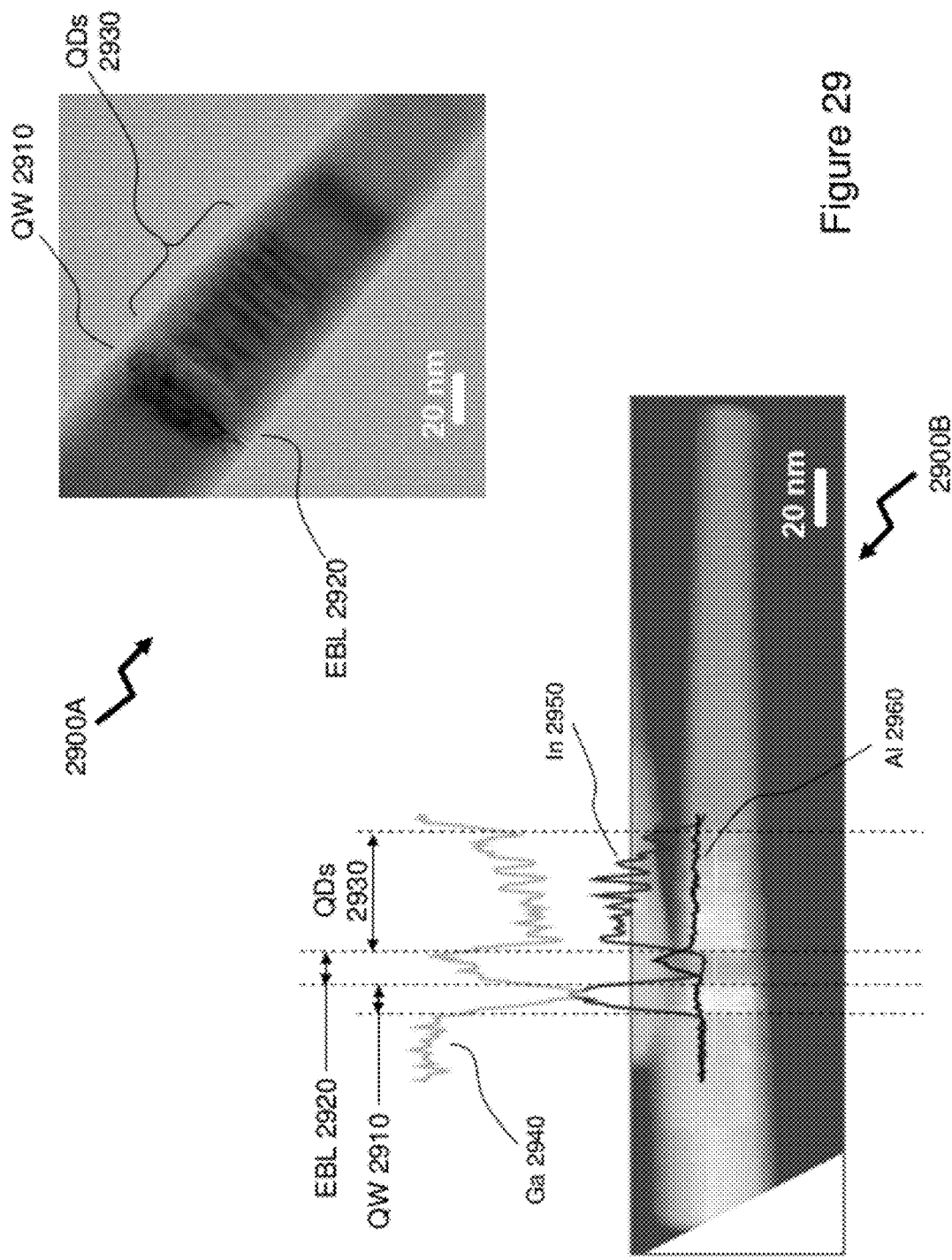
FIG. 29 depicts bright field and annular dark fields images of InGaN/GaN dot-in-a-wire LED structures and energy dispersive x-ray spectrometry signal for In, Ga, and Al of the dot-in-the-wire LED according to embodiments of the invention.

Referring to first image 2900A in FIG. 29 a TEM image of a second test nanowire LED, such as depicted by second test nanowire LED 2800C in FIG. 28, are shown wherein the vertically stacked 10 InGaN/GaN quantum dots 2930, the AlGaN electron blocking layer (EBL) 2920 and the test InGaN quantum well (QW) 2910 can be easily identified. There are no extended defects, such as misfit dislocations and stacking faults observed in such images and the InGaN/GaN quantum dots 2930 can be seen to be positioned in the center of the nanowires, due to the strain-induced self-organization. In order to confirm the existence of each region and obtain an estimation of the elemental variations, EDXS analysis together with the annular dark field image were also performed as depicted in second image 2900B. The first to third EDXS line profiles 2940 through 2960 respectively show the signal variations of Ga, In and Al respectively across the InGaN/GaN quantum dots 2930, the AlGaN EBL 2920 and the test InGaN quantum well 2910. The variation of the In signal, second EDXS line profile 2950, reveals the existence of the InGaN/GaN quantum dots 2930 and InGaN QW 2910. With the Ga signal, depicted by first EDXS line profile 2940, within the GaN region as a reference and also considering the thickness of the dots along the electron beam traveling path, the maximum In is estimated as approximately 50% constituting group III elements for the dot. From the third EDXS signal profile 2560 for Al the AlGaN EBL 2920 is observed between the InGaN/GaN quantum dot 2930 and InGaN QW 2910 regions. The thickness of the EBL is about 8 nm and within fabricated nanowires according to embodiments of the invention the Al composition of the EBL 2920 was varied from approximately 8% to approximately.

Figure 30:
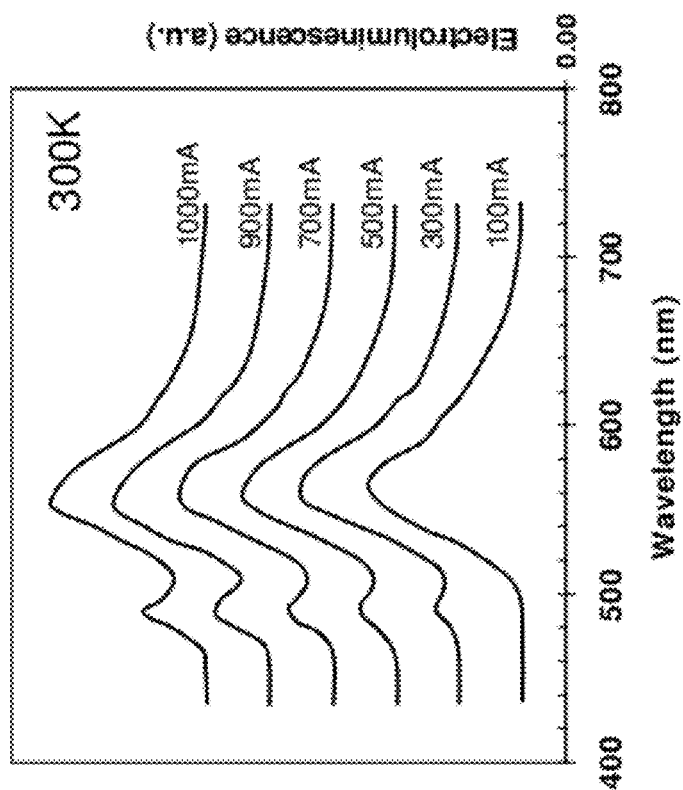
FIG. 30 depicts normalized electroluminescence spectra of a dot-in-the-wire LED according to an embodiment of the invention under various injection currents.

Characterisation of the dot-in-a-wire LEDs described in respect of FIG. 28 was performed using electroluminescence under pulsed biasing conditions at various temperatures. Junction heating was minimized by using a low (approximately 0.1%) duty cycle. Referring to FIG. 30 there are depicted the normalized electroluminescence spectra of first test nanowire LED 2800B under various injection currents. As discussed above first test nanowire LED 2800B incorporates an InGaN test well, shown as InGaN QW 2910 in FIG. 29, between the device active region and the upper p-GaN section of the nanowire LED. The peak at approximately 550 nm is related to the emission from the quantum dot active region, which agrees well with the photoluminescence measurements depicted in graph 2800E of FIG. 28. However, with increasing current from 100 mA to 1,000 mA, it can be seen that the emission at approximately 430 nm becomes progressively stronger, which is attributed to the carrier recombination in the InGaN/GaN test well, InGaN QW 2910. The inventors believe that these measurements confirm that injected electrons can escape from the quantum dot active region and subsequently recombine with holes in the InGaN test well.

Figure 31:
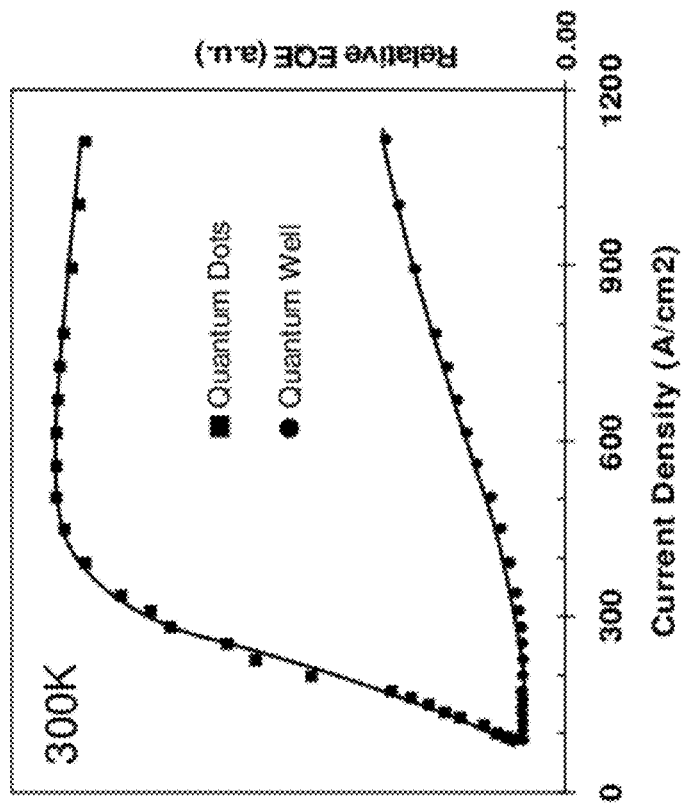
FIG. 31 depicts the relative external quantum efficiency (EQE) with injection current for the emission from the quantum dot active region and the test well of a dot-in-the-wire LED according to an embodiment of the invention.

Referring to FIG. 30 there is plotted the derived relative external quantum efficiency (EQE) (in arbitrary units) related to the electroluminescence emission from the quantum dot active region as well as that from the test well measured at room temperature. It can be seen that, for the emission from the test well, the quantum efficiency continuously increases with current, which can be explained by the increased electron overflow and therefore enhanced emission from the test well region with increasing current. For the emission of the quantum dot active region, the relative external quantum efficiency reaches its peak value at approximately 300-400 $A/cm^2$ and shows a continuous drop (approximately 6%) with increasing current up to 1,100 $A/cm^2$ thereafter, which can be explained by the enhanced electron overflow at high injection conditions. It can also been seen when looking at FIG. 30 in combination with FIG. 31 that electron overflow is appreciable below such injection levels, evidenced by the presence of emission peak from the test well at an injection current of approximately 300 A/cm².

Figure 32:
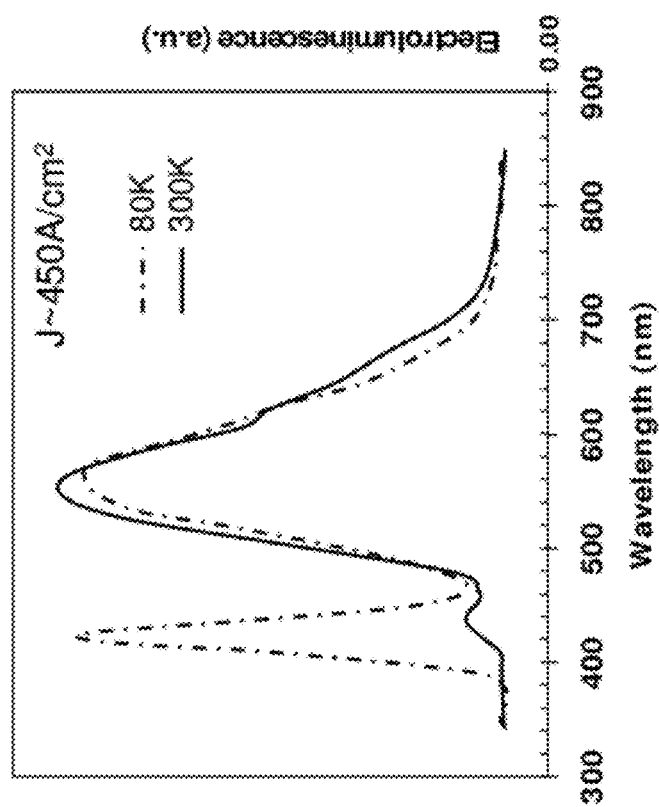
FIG. 32 depicts normalized electroluminescence spectra of a dot-in-the-wire LED according to an embodiment of the invention at different temperatures under constant injection current.

Referring to FIG. 32 it can be seen that electron overflow is relatively enhanced with decreasing temperature. As shown the emission intensity from the test well becomes comparable to that from the quantum dots when measured under an injection current of approximately 450 A/cm² at low temperatures (80K), while its intensity is only approximately 10% of that from the quantum dots when measured at the same injection current at room temperature. Consequently, the quantum efficiency related to the optical emission from the quantum dot active region shows a more severe drop with decreasing temperature.

Figure 33:
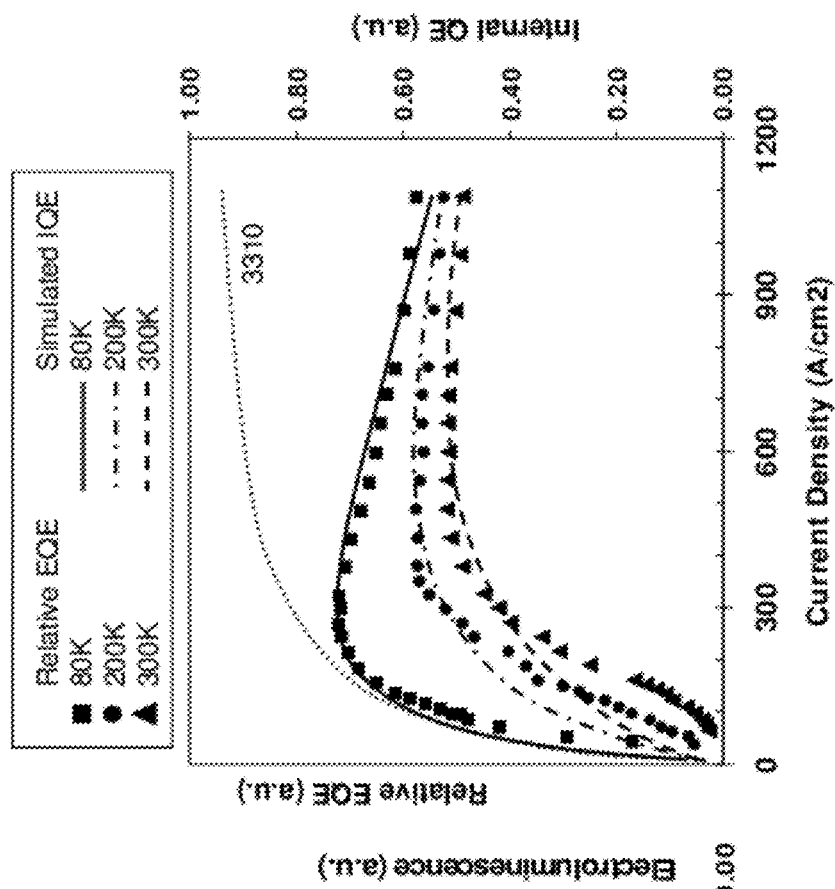
FIG. 33 depicts the relative EQE and simulated internal quantum efficiency (IQE) for a dot-in-the-wire LED according to an embodiment of the invention at varying temperature.

Now referring to FIG. 33 the derived relative EQE (in arbitrary units) is plotted as a function of injection current density for three different temperatures. The estimated efficiency drop is approximately 6%, 10%, and 21% for measurements performed under an injection current of approximately 1,100 A/cm² at 300K, 200K, and 80K, respectively. The increased electron overflow at low temperatures is consistent with recent theoretical studies, see for example Piprek et al in "Electron Leakage Effects on GaN-based Light-Emitting Diodes" (J. Opt. Quantum Electron., Vol. 42, p. 89, 2010). At low temperatures, the hole concentration in the p-GaN region is drastically reduced, due to the large activation energy for Mg dopant, thereby leading to reduced hole injection efficiency and further enhanced electron overflow. It can also be seen in FIG. 33 that with decreasing temperature the peak quantum efficiency shifts to lower current densities due to the reduced Shockley-Read-Hall recombination as well as enhanced bimolecular radiative recombination rate.

These phenomena can be simulated by using the model given by Equation (1) below for the internal quantum efficiency, where N is the carrier density in the device active region, and A and B are the Shockley-Read-Hall nonradiative recombination and radiative recombination coefficients, respectively as provided for example by Ryu et al in "Evaluation of radiative efficiency in InGaN blue-violet laser-diode structures using electroluminescence characteristics" (App. Phys. Lett., Vol. 89, 171106, 2006) and Dai et al in "Carrier recombination mechanisms and efficiency droop in GaInN/GaN light-emitting diodes" (App. Phys. Lett., Vol. 97, p. 133507, 2010). The term f(N) represents any other higher order effects, including Auger recombination and carrier leakage outside of the device active region, which are generally described by $CN^3+DN^4$. The carrier density (N), is related to the injection current density (J) by Equation (2) below where the term $W_{QD}$ represents the total thickness, approximately 25-30 nm, of the quantum dot active region.

$$\eta_i = \frac{BN^2}{AN + BN^2 + f(N)} \quad (1)$$

$$J = qW_{QD}[AN + BN^2 + f(N)] \quad (2)$$

As presented in FIG. 33 the measured relative external quantum efficiency at various temperatures can be well simulated using this model. The derived values of (A, B, C) are approximately $(5\times10^8\ s^{-1}, 1.2\times10^{-9}\ cm^3\ s^{-1}, 1.1\times10^{-28}\ cm^6\ s^{-1})$, $(1.5\times10^9\ s^{-1}, 1.1\times10^{-9}\ cm^3\ s^{-1}, 1.1\times10^{-28}\ cm^6\ s^{-1})$, and $(1.6\times10^9\ s^{-1}, 9\times10^{-10}\ cm^3\ s^{-1}, 1.1\times10^{-28}\ cm^6\ s^{-1})$ at 80K, 200K, and 300K, respectively. It can also be seen from FIG. 33 that the quantum efficiency of nanowire LEDs according to embodiments of the invention generally reaches its peak value at significantly higher current densities (>200 A/cm²), compared to that (<20 A/cm²) of conventional prior art InGaN/GaN quantum well blue-emitting LEDs. This observation is consistent with the simulated Shockley-Read-Hall recombination coefficient (A of approximately $1.0\times10^9\ s^{-1}$) at 300K in the nanowire LEDs according to embodiments of the invention, which is significantly larger than the values commonly employed in InGaN/GaN quantum well blue-emitting LEDs and can be partly explained by the significantly enhanced non-radiative surface recombination, due to the very large surface-to-volume ratios of nanowires. The commonly observed surface band bending in GaN nanowires, as well as the inefficient carrier capture by quantum dots due to hot carrier effect, may also contribute considerably to the non-radiative carrier recombination on nanowire surfaces.

As a result the emission characteristics of nanowire LEDs are predominantly determined by surface-related nonradiative carrier recombination under relatively low carrier injection conditions. In the absence of any $3^{rd}$ or higher order carrier loss mechanisms, it is further expected that the quantum efficiency should display a small, continuous increase under high injection conditions, illustrated as the dotted line 3310 in FIG. 33. The inventors note that such phenomena have not been observed in nanowire LEDs of the prior art, suggesting the presence of electron overflow or any other high order carrier loss mechanisms, which can lead to either a nearly constant quantum efficiency or efficiency droop under high injection currents has not been commonly measured for prior art nanowire LEDs.

Within the prior art carrier leakage and electron overflow have been noted to play a dominant role in the efficiency droop of prior art GaN based planar LEDs, which is directly related to the ineffective electron confinement, poor hole transport, and possibly Auger recombination and can be further exasperated by the presence of polarization fields. However, the observed severe efficiency degradation measured at lower temperatures indicates that Auger recombination and Auger-assisted overflow are not likely the primary mechanisms responsible for efficiency droop in nanowire LED devices according to embodiments of the invention, since the Auger recombination coefficient (C) generally decreases exponentially with decreasing temperature.

Figure 34:
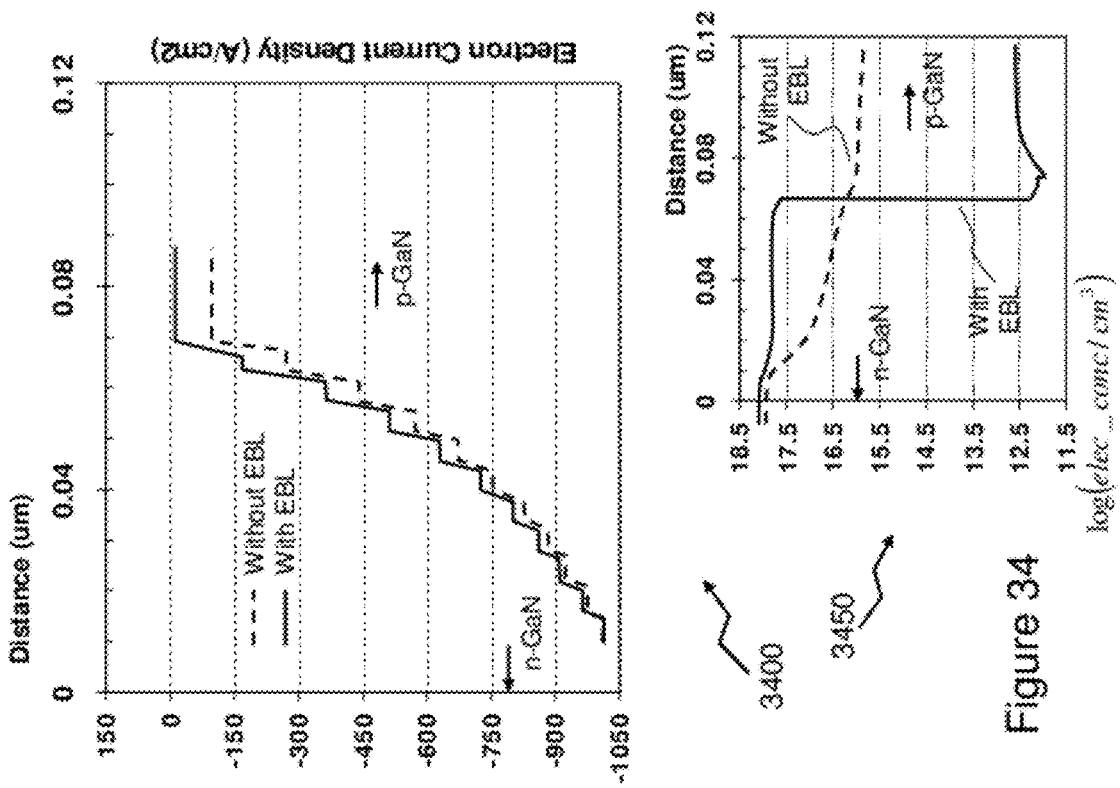
FIG. 34 depicts simulated electron current density across an InGaN/GaN quantum dot active region according to embodiments of the invention with and without the electron blocking layer (EBL)

This study is also consistent with recent results that Auger recombination is drastically reduced in nearly defect-free GaN-based nanowire devices, see Guo et al in "Catalyst-free InGaN/GaN nanowire light emitting diodes grown on (001) silicon by molecular beam epitaxy" (Nano. Lett., Vol. 11, p. 1434, 2011). Analysis of the electron overflow was performed by simulating the band-diagram and carrier distribution in the device active region using the advanced LED device simulation software APSYS (Crosslight Software, 2011). The simulated LED, according to an embodiment of the invention without an EBL such as dot-in-a-wire LED 2800A in FIG. 28, employed an active region consisting of ten vertically coupled InGaN quantum dots, separated by approximately 3 nm GaN barrier layers. With an average In composition of approximately 20% in the dots, approximately 10% of the injected current density can leak into the p-GaN region under an injection current density of approximately 1,000 A/cm², illustrated as the dashed curve in first graph 3400 in FIG. 34. However, much more severe electron overflow is expected, due to the highly non-uniform In distribution along the lateral dimension of the wires. More importantly, the current path associated with the near-surface GaN region, presented by the dashed curve in second graph 3450 in FIG. 34, can contribute significantly to electron overflow in InGaN/GaN dot-in-a-wire LEDs as well.

Simulations were also performed on third test nanowire LED 2800E wherein a p-doped AlGaN EBL is incorporated between the quantum dot active region and p-GaN. It can be seen that the electron overflow, through either the quantum dot active region or the near-surface GaN, can be largely eliminated, illustrated by the solid curves in first and second graphs 3400 and 3450 respectively in FIG. 34. Al compositions in the range of approximately 10% to 20% demonstrated satisfactory performance. The use of higher Al composition, however, may reduce the hole injection efficiency thereby limiting device efficiency. Additional simulations by the inventors also indicate that the use of an EBL can also be effective in preventing electron overflow in InGaN/GaN nanowire LEDs according to embodiments of the invention, due to the drastically reduced polarization fields, compared to prior art InGaN/GaN quantum well devices.

Figure 35:
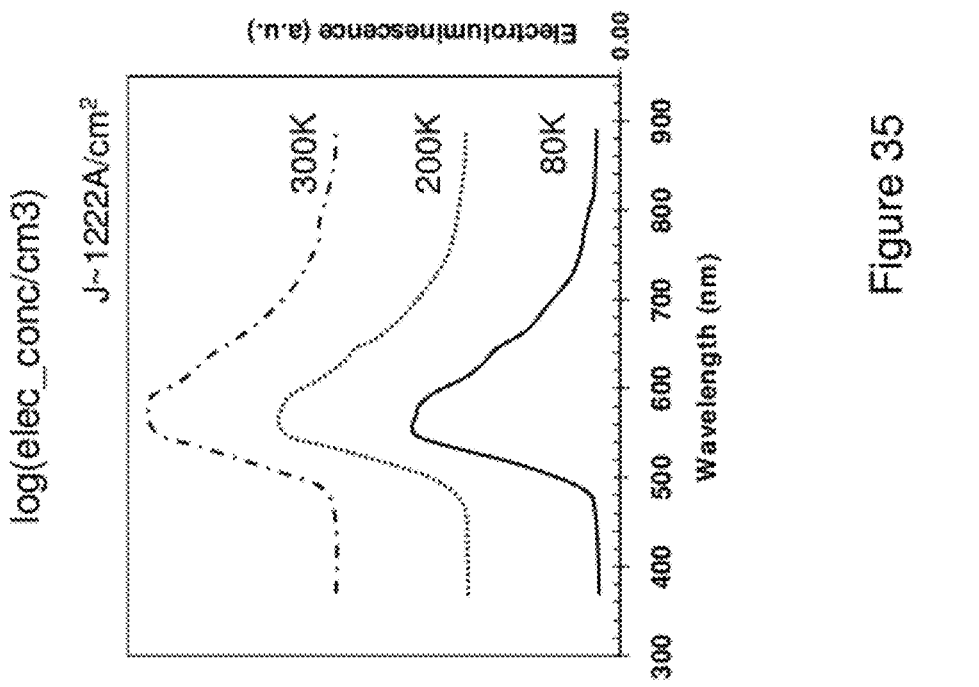
FIG. 35 depicts normalized electroluminescence spectra of a dot-in-the-wire LED according to an embodiment of the invention at different temperatures under constant injection current.

The effectiveness of utilizing an AlGaN EBL to limit electron overflow in nanowire LEDs according to embodiments of the invention can be observed in respect of the electroluminescence spectra of a second test nanowire LED 2800C as presented in FIG. 35. An 8 nm $Al_{0.15}Ga_{0.85}$ (15% Al) EBL was incorporated between the quantum dot active region and the InGaN test well. The measurements were performed up to very high injection conditions, approximately 1220 $A/cm^{-2}$, at 80K, 200K, and 300K for the results presented in FIG. 35. Compared to the photoluminescence results shown in FIG. 28 only emission from the quantum dot active region ($\lambda$peak of approximately 550 nm) can be observed under electrical injection, and any emission from the test well (approximately 430 nm) is absent for measurements performed at various injection conditions and temperatures, which confirms the reduced, or eliminated electron overflow by use of an AlGaN EBL.

Figures 36, 37:
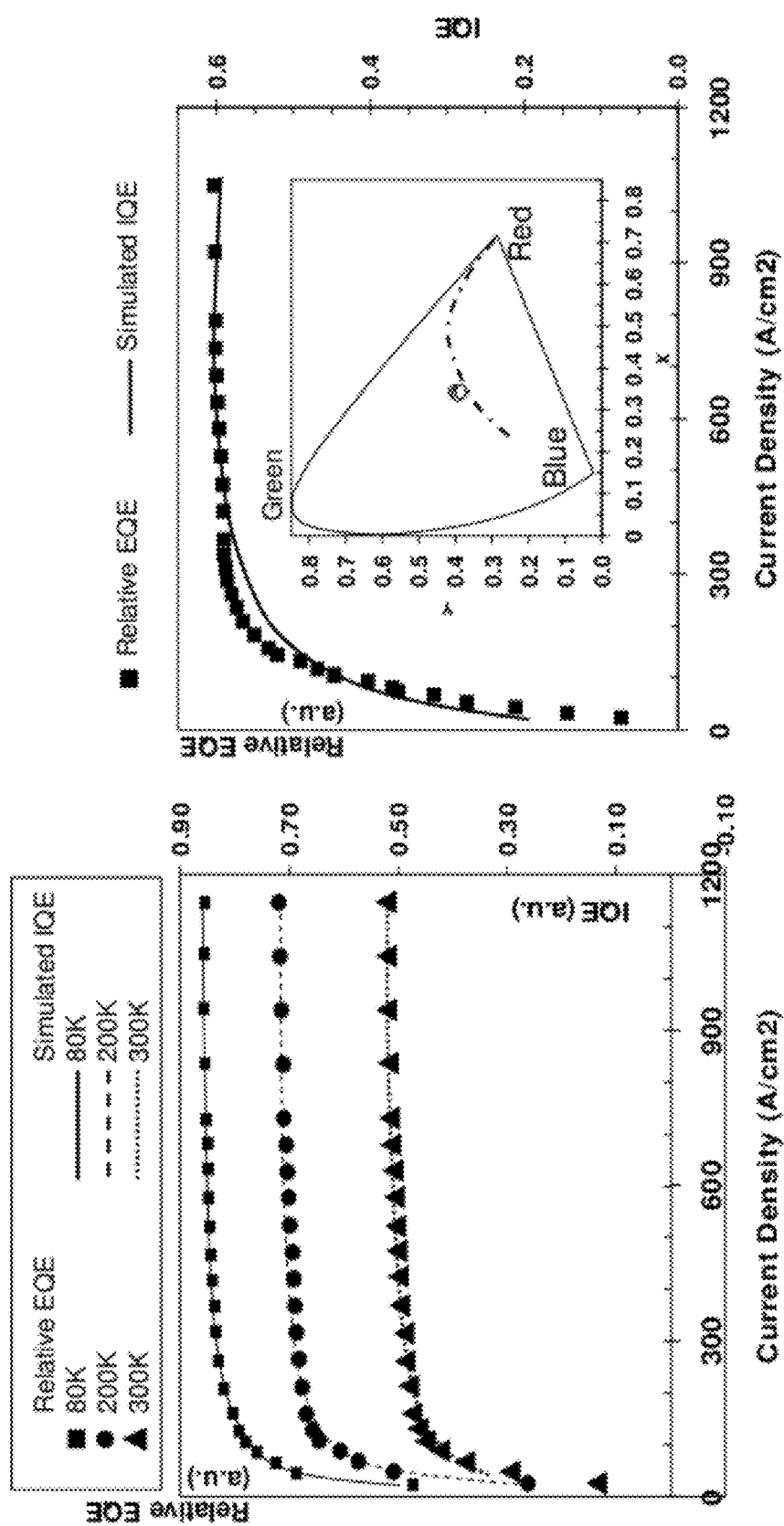
FIG. 36 depicts the relative EQE and simulated IQE for a dot-in-the-wire LED according to an embodiment of the invention at varying temperature.
FIG. 37 depicts relative EQE for a dot-in-the-wire LED according to an embodiment of the invention with an AlGaN EBL and p-type modulation doping in the active region together with emission distribution on standard chromaticity diagram.

Now referring to FIG. 36 the performance characteristics of a dot-in-a-wire nanowire according to an embodiment of the invention, described above as third test nanowire LED 2800D, consisting of ten vertically aligned InGaN/GaN quantum dots and an AlGaN EBL are presented depicting the variations of measured relative EQE with varying injection current at 80K, 200K, and 300K. The relative EQE shows an initial rapid increase with increasing current, which is directly related to the saturation of surface defects with increasing carrier density, followed by a smaller, continuous increase right up to very high injection currents (approximately 1,222 $A/cm^2$). This has not been measured for prior art nanowire LEDs such as presented by Guo et al (Nano. Lett., Vol. 11, p. 1434, 2011) and Nguyen et al in "P-type modulation doped InGaN/GaN dot-in-a-wire white light-emitting diodes monolithically grown on Si(111)" (Nano. Lett., Vol. 11, p. 1919, 2011).

This new characteristic can be simulated with good accuracy using Equation (1) above for the LED internal quantum efficiency (IQE). These simulation results are also shown in FIG. 36 wherein the calculated IQE (curves) show excellent agreement with the experimental results (shapes). The derived (A, B, C) values are ($7.2 \times 10^7$ s$^{-1}$, $6.8 \times 10^{-10}$ cm$^3$ s$^{-1}$, $1.0 \times 10^{34}$ cm$^6$ s$^{-1}$), and ($9.6 \times 10^7$ s$^{-1}$, $3.9 \times 10^{-10}$ cm$^3$ s$^{-1}$, $3.0 \times 10^{-34}$ cm$^6$ s$^{-1}$) at 80K, 200K, and 300K, respectively. Whilst the values for A and B are reasonably close to those calculated for the first test nanowire LED 2800B, the values for C are nearly approximately 6 orders of magnitude smaller, confirming the drastic reduction of electron overflow by the AlGaN EBL introduced into nanowire design. Accordingly the inventors believe these results suggest that Auger recombination plays a very small, or negligible role on the performance nanowire LEDs, since the Auger coefficient (C) could be reasonably expected to be relatively independent of the incorporation of an AlGaN EBL.

Now referring to FIG. 37 there are presented experimental and simulation results for InGaN/GaN dot-in-a-wire LEDs according to an embodiment of the invention combining an AlGaN EBL with p-type modulation doping in the device active region. As demonstrated previously, by Nguyen et al p-type modulation doping can significantly improve the performance of nanowire LEDs by enhancing the hole injection and transport process in the quantum dot active region. Accordingly, the relative EQE with current density at room temperature is plotted (shapes) in FIG. 37 and it can be seen that the quantum efficiency shows initially a rapid rise (up to approximately 400 $A/cm^2$), followed by small, continuous increase at higher injection conditions. There is virtually no efficiency degradation for injection current density up to approximately 1200 $A/cm^2$. Using the model of Equation (1) the values of A, B and C were estimated to be approximately ($1.0 \times 10^8$ s$^{-1}$, $1.8 \times 10^{-10}$ cm$^3$ s$^{-1}$, $1.0 \times 10^{-34}$ cm$^6$ s$^{-1}$), respectively. The inventors have also demonstrated that dot-in-a-wire LEDs according to an embodiment of the invention can exhibit highly stable white-light emission. As shown in the inset of FIG. 37 the locations of light emission by sources can be plotted on a chromaticity diagram. The locations plotted were measured under different injection conditions between 333 $A/cm^2$ and 1100 $A/cm^2$, with the values of x and y in the approximate ranges of 0.346-0.333 and 0.379-0.361, respectively. The stable white light emission of the dot-in-a-wire LEDs grown according to embodiments of the invention with p-doping modulation and EBL is attributed to the large inhomogeneous broadening of the quantum dots, the highly uniform carrier distribution within the LED active region, and the substantially reduced QCSE within the nanowire heterostructures.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A device comprising:
a substrate having at least one semiconductor nanowire of a plurality of semiconductor nanowires formed thereupon, the at least one semiconductor nanowire comprising at least one first quantum dot disposed within a second quantum dot within a predetermined portion of the at least one semiconductor nanowire and formed by a self-organization of the at least one semiconductor nanowire during its growth,
wherein:
a first predetermined portion of the plurality of semiconductor nanowires comprises a first semiconductor element and a second semiconductor element in a first predetermined ratio; and
a second predetermined portion of the plurality of semiconductor nanowires comprises the first semiconductor element and the second semiconductor element in a second predetermined ratio.

2. The device according to claim 1, wherein the growth process for the at least one semiconductor nanowire of a plurality of semiconductor nanowires comprises:
providing a wurtzite semiconductor whose growth was initiated by providing nanoscale droplets of a first group IIIA element constituent of the wurtzite semiconductor on the surface of the substrate and absent both a foreign catalyst and other constituent elements of the wurtzite semiconductor.

3. The device according to claim 1, wherein at least one semiconductor nanowire of a plurality of semiconductor nanowires further comprises at least one of a third quantum dot, a quantum well within which the second quantum dot is formed, a quantum well spatially separated from the second quantum dot, an electron barrier, a heterostructure, a p-doped semiconductor, an intrinsic semiconductor, a n-type semiconductor, and a graded semiconductor grading from a first composition to a second composition.

4. The device according to claim 1, wherein the first quantum dot comprises a group IIIA element at a composition higher than that of the same group IIIA element within the second quantum dot.

5. The device according to claim 1, wherein
the at least one semiconductor nanowire of a plurality of semiconductor nanowires comprises at least one of a p-i-n diode, a light emitting diode, a laser structure, a superluminescent light emitting diode, a photodiode, and a solar cell.

6. The device according to claim 1, wherein
the at least one semiconductor nanowire of a plurality of semiconductor nanowires further comprises:
a p-i-n diode wherein the predetermined portion of the at least one semiconductor nanowire is the intrinsic region of the p-i-n diode; and
a plurality of receptors receptive to a predetermined molecule disposed upon a predetermined portion of at least one of the p-doped and n-doped region of the p-i-n diode.

7. A device comprising:
a substrate having at least one semiconductor nanowire of a plurality of semiconductor nanowires formed thereupon, the at least one semiconductor nanowire comprising at least one first quantum dot disposed within a first quantum well within a predetermined portion of the at least one semiconductor nanowire and formed by a self-organization of the at least one semiconductor nanowire during its growth.

8. The device according to claim 7, wherein
a first predetermined portion of the plurality of semiconductor nanowires comprise a first semiconductor element and a second semiconductor element in a first predetermined ratio; and
a second predetermined portion of the plurality of semiconductor nanowires comprise the first semiconductor element and the second semiconductor element in a second predetermined ratio.

9. The device according to claim 7, wherein
the growth process for the at least one semiconductor nanowire of a plurality of semiconductor nanowires comprises:
providing a wurtzite semiconductor whose growth was initiated by providing nanoscale droplets of a first group IIIA element constituent of the wurtzite semiconductor on the surface of the substrate and absent both a foreign catalyst and other constituent elements of the wurtzite semiconductor.

10. The device according to claim 7, wherein
at least one semiconductor nanowire of a plurality of semiconductor nanowires further comprises at least one of a second quantum dot formed by self-organization within the first quantum dot, another quantum well spatially separated from the first quantum well, an electron barrier, a heterostructure, a p-doped semiconductor, an intrinsic semiconductor, a n-type semiconductor, and a graded semiconductor grading from a first composition to a second composition.

11. The device according to claim 7 further comprising;
at least one semiconductor nanostructure of a plurality of semiconductor nanostructures, each semiconductor nanostructure comprising at least one self-organized quantum dot formed within a quantum well and characterized in that each quantum dot comprises a group IIIA element at a composition higher than the predetermined concentration of the same group IIIA element within the respective quantum well.

12. The device according to claim 11, wherein
each semiconductor nanostructure of the plurality of semiconductor nanostructures is characterized by an optical characteristic that is at least one of the same as that of the first quantum dot and first quantum well combination and predetermined by a predetermined sequence of the optical characteristic of which the first quantum dot and first quantum well combination also have an optical characteristic forming part of the predetermined sequence of the optical characteristic.

13. The device according to claim 7, wherein
the at least one semiconductor nanowire of a plurality of semiconductor nanowires comprises at least one of a p-i-n diode, a light emitting diode, a laser structure, a superluminescent light emitting diode, a photodiode, and a solar cell.

14. The device according to claim 7, wherein,
the at least one semiconductor nanowire of a plurality of semiconductor nanowires further comprises:
a p-i-n diode wherein the predetermined portion of the at least one semiconductor nanowire is the intrinsic region of the p-i-n diode; and
a plurality of receptors receptive to a predetermined molecule disposed upon a predetermined portion of at least one of the p-doped and n-doped region of the p-i-n diode.

15. A device comprising:
a substrate having at least one semiconductor nanowire of a plurality of semiconductor nanowires formed thereupon, the at least one semiconductor nanowire comprising at least one first quantum dot disposed within a second quantum dot within a predetermined portion of the at least one semiconductor nanowire and formed by a self-organization of the at least one semiconductor nanowire during its growth,
wherein at least one semiconductor nanowire of a plurality of semiconductor nanowires further comprises at least one of a third quantum dot, a quantum well within which the second quantum dot is formed, a quantum well spatially separated from the second quantum dot, an electron barrier, a heterostructure, a p-doped semiconductor, an intrinsic semiconductor, a n-type semiconductor, and a graded semiconductor grading from a first composition to a second composition.

16. A device comprising:
a substrate having at least one semiconductor nanowire of a plurality of semiconductor nanowires formed thereupon, the at least one semiconductor nanowire comprising at least one first quantum dot disposed within a second quantum dot within a predetermined portion of the at least one semiconductor nanowire and formed by a self-organization of the at least one semiconductor nanowire during its growth,
wherein the at least one semiconductor nanowire of a plurality of semiconductor nanowires comprises at least one of a p-i-n diode, a light emitting diode, a laser structure, a superluminescent light emitting diode, a photodiode, and a solar cell.

17. A device comprising:
a substrate having at least one semiconductor nanowire of a plurality of semiconductor nanowires formed thereupon, the at least one semiconductor nanowire comprising at least one first quantum dot disposed within a second quantum dot within a predetermined portion of the at least one semiconductor nanowire and formed by a self-organization of the at least one semiconductor nanowire during its growth,
wherein the at least one semiconductor nanowire of a plurality of semiconductor nanowires further comprises:
a p-i-n diode wherein the predetermined portion of the at least one semiconductor nanowire is the intrinsic region of the p-i-n diode; and
a plurality of receptors receptive to a predetermined molecule disposed upon a predetermined portion of at least one of the p-doped and n-doped region of the p-i-n diode.

* * * * *